(12) United States Patent
Miida

(10) Patent No.: US 7,256,443 B2
(45) Date of Patent: Aug. 14, 2007

(54) SEMICONDUCTOR MEMORY AND METHOD OF MANUFACTURING THE SAME

(75) Inventor: Takashi Miida, Kanagawa (JP)

(73) Assignee: Innotech Corporation, Kanagawa (JP)

( * ) Notice: Subject to any disclaimer, the term of this patent is extended or adjusted under 35 U.S.C. 154(b) by 2 days.

(21) Appl. No.: 11/053,952

(22) Filed: Feb. 10, 2005

(65) Prior Publication Data

US 2005/0190605 A1 Sep. 1, 2005

(30) Foreign Application Priority Data

Feb. 13, 2004 (JP) .............................. 2004-037280
Oct. 28, 2004 (JP) .............................. 2004-314406

(51) Int. Cl.
*H01L 29/76* (2006.01)
(52) U.S. Cl. ...................... 257/314; 438/257; 257/315; 257/E21.179; 257/316; 257/E21.422; 257/E21.6
(58) Field of Classification Search ........ 257/314–317; 438/201, 211, 257, 593
See application file for complete search history.

(56) References Cited

U.S. PATENT DOCUMENTS

| | | | | |
|---|---|---|---|---|
| 5,483,487 A | * | 1/1996 | Sung-Mu | ............... 365/185.33 |
| 6,406,958 B2 | * | 6/2002 | Kato et al. | ................... 438/257 |
| 6,538,925 B2 | * | 3/2003 | Miida | ..................... 365/185.28 |
| 6,760,252 B2 | * | 7/2004 | Mikolajick | ............. 365/185.01 |
| 6,812,518 B2 | * | 11/2004 | Miida | ......................... 257/315 |
| 6,861,315 B1 | | 3/2005 | Chen et al. | |
| 2004/0169219 A1 | | 9/2004 | Miida et al. | |
| 2006/0108630 A1 | * | 5/2006 | Miida | ......................... 257/315 |

* cited by examiner

*Primary Examiner*—Quoc Hoang
(74) *Attorney, Agent, or Firm*—Birch, Stewart, Kolasch & Birch, LLP

(57) ABSTRACT

A semiconductor memory has plural cell transistors that are arranged in a matrix. The cell transistor comprises a silicon substrate, a control gate, a pair of electrically isolated floating gates. Plural projections are formed in the P type silicon substrate, and a pair of N type diffusion regions as the source and the drain is formed in both sides of the projection. The control gate faces the projection via a fourth insulation layer. The side surface of the floating gates faces the side surfaces of the projection via a first insulation layer, and faces the control gate via a third insulation layer. The floating gate faces the diffusion region via the first insulation layer.

20 Claims, 41 Drawing Sheets

SEMICONDUCTOR MEMORY AND METHOD OF MANUFACTURING THE SAME

BACKGROUND OF THE INVENTION

1. Field of the Invention

The present invention relates to a semiconductor memory having transistor cells each of which stores multiple bits, and a method of manufacturing such semiconductor memory.

2. Description of Background Art

Recently, nonvolatile semiconductor memories such as flash memories are widely applied to electronic appliances such as a mobile telephone. In order to promote size reduction and larger information capacity of the electronic appliances, it is required to miniaturize the semiconductor memory and increase the storage capacity of the semiconductor memory. Thus, there should preferably be implements the multiple-bit configuration of a cell transistor that allows two or more bits of information to be stored in a single cell transistor. The nonvolatile semiconductor memory described in US 2004/0169219 A1, filed by the assignee of the present application, has cell transistors each of which comprises a pair of floating gates that are electrically isolated and stores two bits (four values) of information.

FIG. 42 shows a cell transistor with a multiple-bit configuration taught in US 2004/0169219 A1. The cell transistor 100 comprises a control gate CG (Word Line), a pair of diffusion regions 101 that serves as the source region and the drain region, a projection 103 formed on a silicon substrate 102. When the control gate CG, the source and the drain regions are supplied with predetermined voltages, a channel is generated in the surfaces of the top and sides of the projection 103. In the operation to write information in the cell transistor 100, some electrons (charged particles) in the channel are supplied with enough energy to become hot electrons that can pass the pass the potential barrier in a first insulation layer 104 and flow into a drain side floating gate. In the operation to read the information from the cell transistor 100, the electric current flowing in the channel (drain current) is modulated in accordance with the amount of the electrons in the source side floating gate. In deleting the information in the cell transistor 100, there is no channel in the projection 103, so the electrons in the floating gates FG1, FG2 are discharged to the control gate CG through a second insulation layer 105 by FN (Fowler Nordheim) tunneling.

In manufacturing the cell transistor 100, the surface of the cell transistor 100 in the area on which the control gate CG is formed becomes flat. That is, the top surface of the second insulation layer 105 on the floating gates FG1, FG2, and a top surface of a third insulation layer 106 on the projection 103 become flat. In the third insulation layer 106 formed between the projection 103 and the control gate CG, a silicon oxide layer (SiO$_2$) 106a, a silicon nitride layer (Si$_3$N$_4$) 106b and the silicon oxide layer (SiO$_2$) 106c are layered in this order, so the third insulation layer 106 is relatively thick. When the third insulation layer 106 becomes thick, a large voltage needs to be applied to the control gate CG in order to control generation of the channel in the projection 103. Moreover, the following problems will occur as well.

The silicon nitride layer 106b serves as the mask in implanting impurity ions in the diffusion regions 101, and as the stopper in CMP (Chemical Mechanical Polishing) process to flatten the top surface of the region including surface oxides and the floating gates FG1, FG2. Since the silicon nitride layer 106b needs to be thick to work as the mask and the stopper, the silicon nitride layer 106b remains in the insulation layer 106 after the above processes. The dielectric constant of the silicon nitride layer 106b is much higher than that of the silicon oxide layers 106a, 106c, and the large area of the silicon nitride layer 106b faces the floating gates FG1, FG2 due to its large thickness. As a result, the silicon nitride layer 106b exists near the channel in the projection 103 via the silicon oxide layer 106a, and a part of the hot electrons enters the silicon nitride layer 106b and are captured (trapped) therein writing the information. Once the electrons are trapped, the electrons are localized in the silicon nitride layer 106b, so it is difficult to remove such electrons in the data erasing mode. Accordingly, by repeating to write and delete the information, a lot of electrons are trapped in the silicon nitride layer 106b, and thus the threshold voltage of the cell transistor 100 increases.

Even if the possibility to trap the electrons in the silicon nitride layer 106b is not considered, the silicon nitride layer 106b affects the operation of the cell transistor 100. As mentioned above, a large area of the silicon nitride layer 106b faces the floating gates FG1, FG2, and the silicon nitride layer 106b has high dielectric constant. Thus, the silicon nitride layer 106b is electrically affected by the potential of the floating gates FG1, FG2. That is, a fringe parasitic capacitance is generated between the floating gates FG1, FG2 and the channel in the projection 103 near the floating gates FG1, FG2. Because of such parasitic capacitance, the channel in the projection 103 is affected by the threshold voltage (Vt) modulation based on the potential of the floating gates FG1, FG2. Consequently, the parasitic capacitance causes to change the length of the channel in the projection 103 the generation of which should be controlled in accordance with the potential of the control gate CG to be supplied. Especially, in the event that the insulation layer 106 on the projection 103 is thick, the channel length in the projection 103 becomes largely affected. Moreover, the change in the channel length will affect the cell transistor 100 when the cell transistor becomes small, so it becomes a problem in reducing the size of the cell transistor 100.

The tops of the floating gates FG1, FG2 face the control gates CG in a large area. In order to discharge the electrons in the floating gates FG1, FG2 to the control gate CG effectively, the second insulation layer 105 needs to be thin. On the other hand, when the insulation layer 105 becomes thin, the coupling ratio of the floating gates FG1, FG2 (the value calculated by dividing the capacitance of the control gate CG by the capacitance of the substrate 102) increases, and the potential difference between the floating gates FG1, FG2 and the control gate CG becomes small. Thus, it is necessary to increase the voltage to be applied to the control gate CG in erasing the information. Moreover, a large coupling ratio reduces the modulation of the drain current (current window) in reading the information.

The cell transistor 100 is configured that the electrons in the floating gates FG1, FG2 is capable of being discharged through any position in the large area between the floating gates FG1, FG2 and the control gate CG. In other words, the cell transistor 100 is configured that the thickness of the second insulation layer 105 is uniform. In that case, the second insulation layer 105 is possible to contain defects, even if the second insulation layer 105 is formed by plasma oxidation (or plasma nitridation) with low possibility to generate defects. Since such defects in the second insulation layer 105 may increase the possibility to discharge the electrons, the property to accumulate electrons of the floating gates FG1, FG2 may decrease. In order to prevent this problem, it is preferable to reduce the area of the interface to discharge the electron from the floating gates FG1, FG2 to the control gate CG, and to discharge the electrons in such interface. In that case, the property or the floating gates FG1, FG2 to accumulate the electrons may be increased because of low possibility to contain defects in the second insulation layer 105.

Furthermore, the semiconductor memory has plural control gates CG (word line WL), arranged in a column direction, each of which extends in a row direction (see FIG. 1). Below the control gates CG, the projections 103 and the diffusion region (bit line BL) are alternately arranged in the row direction. In a word line formation area in which the control gate CG is formed, a pair of the floating gates FG1, FG2 is provided above the diffusion region 101 along the side of the projection 103. To manufacture such control gates CG and the floating gates FG1, FG2, a conductive material for the control gate and the floating gate needs to be electrically isolated in a separation region in the column direction. Thus, an optimum design for the separation region is required, and it is desirable to divide these conductive materials by the process to form the control gates CG and the floating gates in the column direction by self-alignment.

SUMMARY OF THE INVENTION

An object of the present invention is to provide a semiconductor memory that can solve the above problems.

Another object of the present invention is to provide a method to manufacture such semiconductor memory.

In order to achieve the above objects, the semiconductor memory according to the present invention has plural cell transistors formed on a one conductive type semiconductor substrate. The cell transistors are arranged in a column direction and a row direction perpendicular to the column direction to form a two-dimensional matrix. The cell transistor comprises a first projection formed in the semiconductor substrate, a pair of opposite conductive type regions as the source and the drain of the cell transistor, a control gate, and a pair of floating gates each of which is electrically isolated and has a side surface that faces the first projection and the control gate. The opposite conductive type regions are formed in both sides of the first projection in the semiconductor substrate.

A first insulation layer provided in the surfaces of the opposite conductive type regions and the side surfaces of the first projection, and the floating gate faces the opposite conductive type region via the first insulation layer. The control gate faces the floating gate via a second insulation layer provided on the floating gate. A third insulation layer is formed in the area in which the side surface of the floating gate is not covered with the first insulation layer, and the side surface of the control gate faces the control gate via the third insulation layer. Between the first projection and the control gate, a fourth insulation layer is provided. The first to fourth insulation layers may be integrated.

In a preferred embodiment, the control gate comprises a second projection that projects in the direction opposite to the first projection, and the first projection faces the second projection via the fourth insulation layer. The capacitance between the floating gate and the semiconductor substrate is preferably larger than the capacitance between the floating gate and the control gate.

The top surface of the floating gate faces the control gate via the second insulation layer, and the top surface of the floating gate is preferably flattened by CMP (Chemical Mechanical Polishing), so the floating gate has a substantially rectangular section in the row direction. The floating gate may not be flattened by the CMP process. In that case, the floating gate has a substantially fan-shaped section in the row direction.

In the semiconductor memory, two adjacent cell transistors in the row direction share the opposite conductive type region. In the column direction, the cell transistors share the pair of the opposite conductive type regions. The control gates of the cell transistors arranged in the column direction are electrically integrated with one another.

The first to fourth insulation layers can be formed of silicon oxide. The control gate and the floating gate may be formed of amorphous silicon or poly silicon.

The cell transistor may comprise a pair of conductive regions that are formed by injecting opposite type impurity ions in the semiconductor substrate. The cell transistor may comprise a one conductive type high impurity region formed between the pair of opposite conductive regions. The impurity density of the high impurity region is larger than that of the semiconductor substrate.

When the control gate and the pair of opposite conductive type regions are respectively supplied with voltages for data writing or data reading, a channel is generated in the side surfaces and the top surface of the projection. A part of charged particles to be flowed in the channel enter the floating gate of drain side when the control gate and the pair of opposite conductive type regions are respectively supplied with voltages for data writing. The current flowing in the channel is modulated in accordance with the amount of charged particles in the floating gate of source side when the control gate and the pair of opposite conductive type regions are respectively supplied with voltages for data reading. When the control gate and the pair of opposite conductive type regions are respectively supplied with voltages for data erasing, the charged particles in the floating gate are discharged to the control gate.

The semiconductor memory having plural cell transistors is formed by the following steps. In the semiconductor substrate, plural trenches are formed to have plural projections each of which has a pair of side surfaces. Opposite type impurity ions are implanted to the trenches to form opposite conductive type regions as the source and the drain in the semiconductor substrate. A first insulation layer is formed in the surface of the opposite conductive type region and the side surface of the projection. A first conductive material is deposited in both side surfaces and on the opposite conductive type region to form floating gates, each of which has a side surface that faces the projection via the first insulation layer. A second insulation layer is formed on the floating gate, and a third insulation layer is formed in the part of the side surface of the floating gate that is not covered with the first insulation layer. A second conductive material is deposited on the projection via a fourth insulation layer. The side surface of the floating gate faces the control gate via the third insulation layer. Then, the first conductive material and the second conductive material are divided in a separation region.

It is possible to carry out CMP process to flatten the top surface of the floating gate, so the floating gate has a substantially rectangular section.

The conductive materials may be divided by the following steps. The second conductive material in the separation region is removed by etching until the second insulation layer is exposed and the second conductive material above the projection is remained. Then, the first conductive material is exposed by etching the second insulation layer that covers the first conductive material are completely removed in the separation region by etching.

Alternatively, the conductive materials may be divided by the following steps. The second conductive material is completely removed in the separation region by etching. Then, a photo resist pattern is formed. The photo resist pattern covers the fourth insulation layer on the projection, and exposes the second insulation layer covering the first conductive material in the separation region. A part of the second insulation layer in the separation region is removed by etching via the photo resist pattern as a mask, and the photo resist pattern is removed. Then, the first conductive material in the separation region is completely removed by etching.

The semiconductor memory according to the present invention can decrease the coupling ratio of the floating gate to the semiconductor substrate and the control gate, while keeping a thin insulation layer between the control gate and the projection. Thus, it is possible to utilize the applied voltage to the control gate in operation of the semiconductor memory. That is, the gate voltage to be applied to the control gate can be decreased in erasing information from the cell transistor. Moreover, the control to on/off the channel can be realized with law gate voltage.

According to the present invention, the semiconductor memory does not have the nitride layer with large thickness in the insulation layer between the control gate and the top of the projection, so it is possible to eliminate the possibility to trap the hot electrons in the nitride layer during writing information in the cell transistor. Moreover, since the nitride layer is eliminated, the possibility to change the channel length due to the fringe capacitance between the floating gate and the top of the projection is also eliminated. Thus, the size reduction of the semiconductor memory can be realized.

According to the present invention, the electrons are discharged in a limited area from the floating gate to the control gate during the data erasing mode, so the possibility to have defects in such insulation layer of the limited area reduces. Thus, the property of the floating gate to accumulate the electrons can be increased.

In configuring the semiconductor memory as a matrix, the control gates and the floating gates can be most suitably separated. In addition, the control gate and the floating gates can be separated by self-alignment.

BRIEF DESCRIPTION OF THE DRAWINGS

The above objects and advantages of the present invention will become easily understood by one of ordinary skill in the art when the following detailed description would be read in connection with the accompanying drawings, in which.

PREFERRED EMBODIMENTS OF THE INVENTION

The embodiment of the present invention is described in detail hereinafter with reference to the accompanying drawings.

Figure 1:
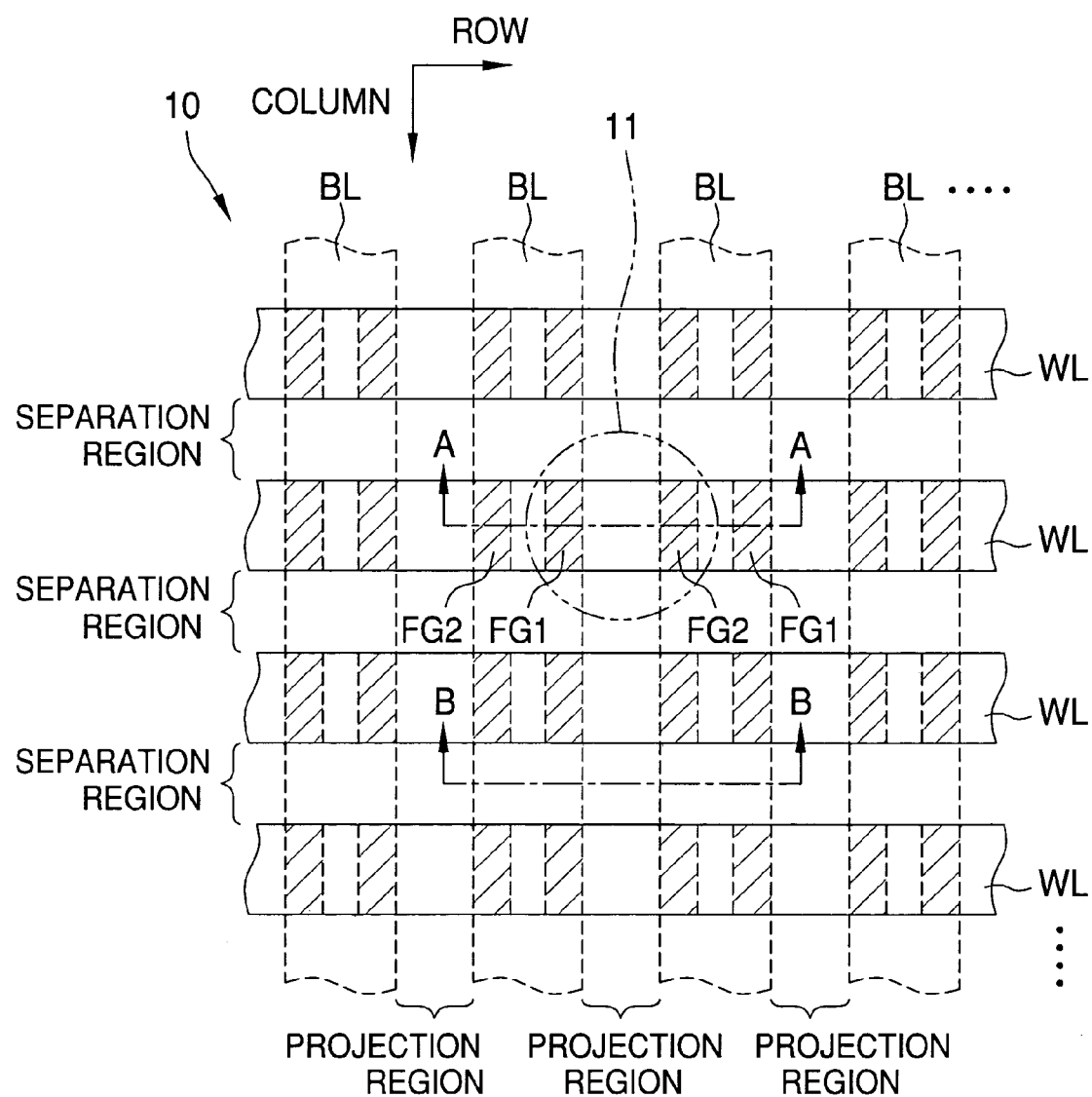
FIG. 1 is a top plan view showing the layout of a memory cell array embodying the present invention.

Referring to FIG. 1, a memory cell array 10 has a VGA (Virtual Ground Array) configuration in which plural bit lines (BL) and plural word lines (WL) are intersected. The bit line has a diffusion region that extends in a column direction. The word line is formed of conductive silicon that extends in a row direction. In the intersected area of the word line WL and the bit line BL, there are a pair of floating gates FG1 and FG2 that are electrically isolated from each other. The memory cell array 10 is in a form of a matrix having plural cell transistors 11. A single cell transistor 11 is depicted in a circled area of FIG. 1.

Figure 2:
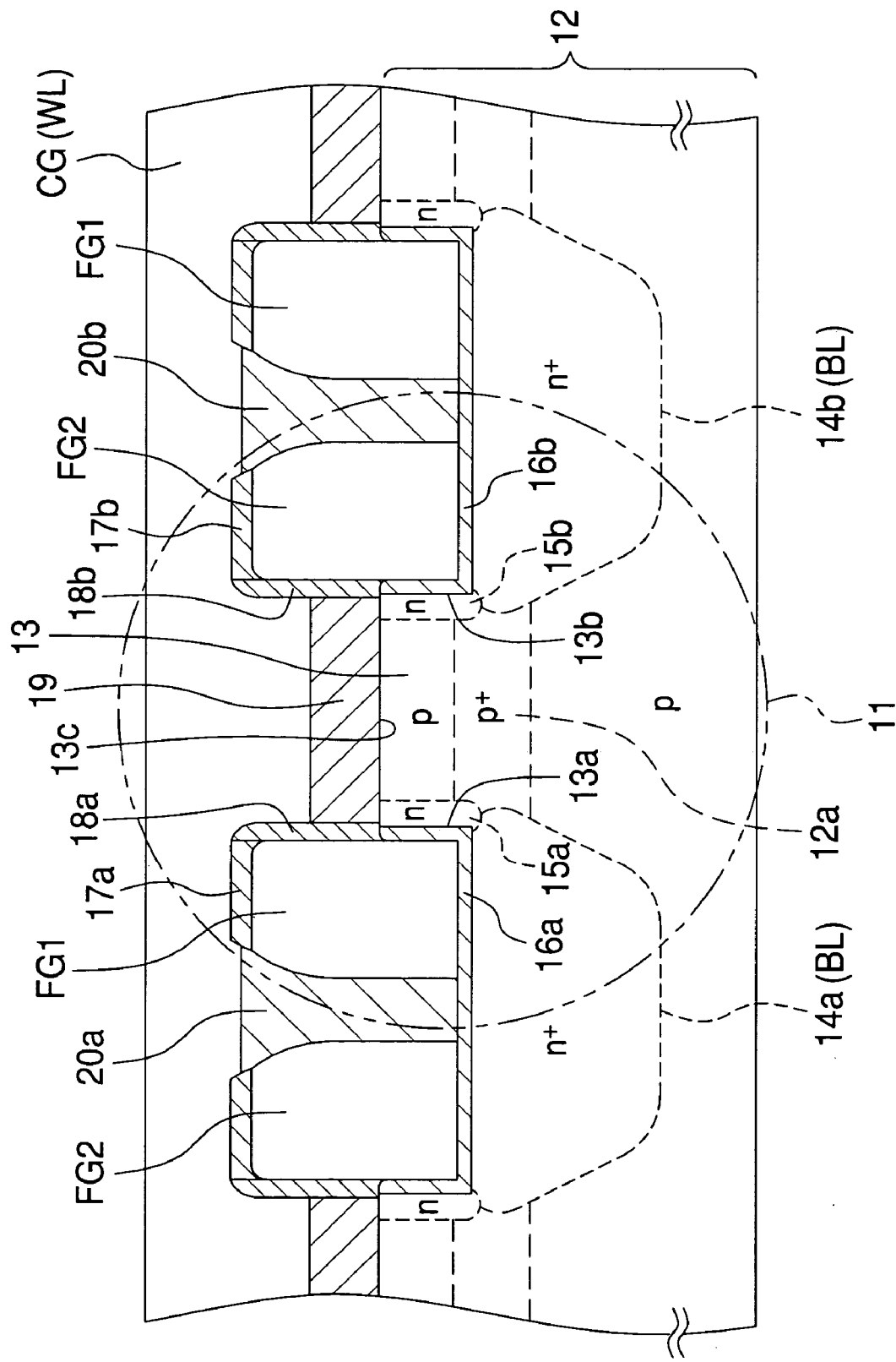
FIG. 2 is a cross section of a cell transistor taken on the line A-A of FIG. 1.

Between the adjacent bit lines BL, there is a projection 13 formed in a silicon substrate (semiconductor substrate) 12 (see FIG. 2). The projection 13 extends in the column direction, and a channel region is provided in the area in which the projection 13 intersects the word line WL. There are separation regions between the adjacent word lines WL. The separation region is formed by removal by etching the conductive silicon for the word lines WL and the conductive silicon for the floating gates FG1 and FG2. An oxide layer is formed over the memory cell array 10 such that the oxidized material is filled in the separation region to electrically separate the word lines WL, and floating gates FG1, FG2.

FIG. 2 shows a section of the cell transistor 11 taken on the line A-A of FIG. 1. The P type (one conductive type) silicon substrate 12 has plural projections 13 each of which extends in the column direction. The projection 13 has a pair of the side surfaces 13a and 13b facing to each other, and the top surface 13c. On the surface of the silicon substrate 12, a pair of N type (opposite conductive type) diffusion regions (opposite conductive areas) 14a, 14b extend in the column direction. The projection 13 is positioned between the diffusion regions 14a, 14b. The side surfaces 13a, 13b are in contact with N type regions 15a, 15b, respectively. Instead of the P type silicon substrate 12, it is possible to provide a P type well region formed in an N type silicon substrate.

A pair of first insulation layer 16a, 16b is formed in the surface of the diffusion regions 14a, 14b and the side surfaces 13a, 13b of the projection 13. The diffusion regions 14a, 14b and the side surfaces 13a, 13b are faced to a pair of floating gates FG1, FG2 via the first insulation layers 16a, 16b. The N type regions 15a, 15b are formed by injecting N type impurity ions of small density in the P type substrate, so it is possible that the regions 15a, 15b are intrinsic or low-density P type. Even in such cases, a part of a channel, which will be described later, is generated in the regions 15a, 15b.

The floating gates FG1, FG2 are formed from conductive silicon (amorphous silicon or poly silicon), so the floating gates FG1, FG2 are electrically conductive. The section of the floating gates FG1, FG2 taken on the row direction is substantially rectangular, and the flat bottom faces thereof are in contact with the diffusion regions 14a, 14b via the first insulation layers 16a, 16b. The flat top surfaces of the floating gates FG1, FG2, provided above the top surface 13c of the projection 13, are faced to the control gates CG via a second insulation layer 17.

One of the flat side surfaces of the floating gate FG1, FG2 faces the side surface 13a, 13b of the projection 13 via the first insulation layer 16a, 16b. The other side surface of the floating gate FG1, FG2 faces the side surface of the floating gates FG1, FG2 of adjacent cell transistors 11 via insulators 20a, 20b, respectively. Accordingly, the control gate CG has plural projections extending downward in FIG. 2, and the side surfaces of the projections face the floating gates FG1, FG2 via third insulation layers 18a, 18b. The top of the projection of the control gate CG faces the top surface 13c of the projection 13 via a fourth insulation layer 19.

The first insulation layers 16a, 16b, the second insulation layers 17a, 17b, the third insulation layers 18a, 18b, the fourth insulation layer 19 and the insulators 20a, 20b are connected to one another, and thus these insulated layers and insulators are integrated. Thereby, the floating gates FG1, FG2 are electrically isolated in the row direction. Moreover, as shown in FIG. 1, the separation region between the adjacent cell transistors 11 in the column direction is filled with an insulator. Accordingly, the floating gates FG1, FG2 are electrically isolated in row and column directions.

The first to fourth isolation layers are silicon oxide film formed from silicon oxide ($SiO_2$). The third insulation layers 18a, 18b are thinner than the second insulation layers 17a, 17b, so the large part of the electrons in the floating gates FG1, FG2 passes the third insulation layers 18a, 18b to the control gate CG in the operation to erase data from the cell transistor 11. In eliminating the electrons from the floating gates FG1, FG2 to the control gate CG, most of the electrons to be discharged pass the small area in third insulation layers 18a, 18b near the corner of the floating gate FG1, FG2 with high electric field. In this way, it is possible to decrease the possibility to have defects in such small area of the third insulation layers 18a, 18b, and thus the property of the floating gates FG1, FG2 to keep the electrons increases.

The fourth insulation layer 19 of the semiconductor memory according to the present invention does not contain a nitride layer that tends to have a large thickness. The nitride layer serves as a mask in the ion implantation process to implant impurity ions to the diffusion regions 14a, 14b, and as a stopper in a CMP (Chemical Mechanical Polishing) process that will be described later. The nitride layer tends to have relatively large thickness. According to the present invention, the thick nitride layer is removed so that the fourth insulation layer 19 contains only the oxide layer. Thus, the semiconductor memory according to the present invention has low fringe capacitance that generates a parasitic electric field between the floating gates FG1, FG2 and a channel in the projection 13. Therefore, the possibility to change the channel length in the projection 13 becomes small.

A coupling ratio CR indicates the rate of capacitance coupling of the electrically isolated floating gates FG1, FG2 to the control gate CG and the substrate 12 (diffusion regions 14a, 14b and the side surfaces 13a, 13b). The coupling ratio CR is obtained by the calculation $CR=C_{CF}/C_{SF}$, in which $C_{CF}$ is the capacitance between the floating gates FG1, FG2 and the control gate CG, and $C_{SF}$ is the capacitance between the floating gates FG1, FG2 and the substrate 12. The coupling ratio CR is 0.5 or less, and the cell transistor 11 exhibits excellent characteristics in the erasing and writing operation as the coupling ratio CR is smaller. Thus, the thicknesses of the first to fourth insulation layers are selected such that the coupling ratio CR becomes small.

The control gate CG is formed from a conductive silicon (amorphous silicon or poly silicon), and constitutes the word line WL of the memory cell array 10 of FIG. 1. The diffusion regions 14a, 14b constitute the bit lines BL of the memory cell array 10, and serve as a pair of the source and the drain of the MOS (Metal Oxide Semiconductor) type cell transistor 11. The source and the drain can be exchanged in accordance with the applied voltage to the diffusion regions 14a, 14b. Plural cell transistors 11 arranged in the column direction share the diffusion regions 14a, 14b. The control gates CG of the cell transistors 11 in the row direction are electrically connected to one another.

The N type regions 15a, 15b are formed in the side surfaces 13a, 13b of the projection 13. When a predetermined voltage is applied to the control gate CG, an inversion layer is formed in the vicinity of the top surface 13c to form a top channel. Side channels near the side surfaces of the projection 13 is generated in accordance with the source potential and the drain potential of the floating gates FG1, FG2, and the threshold voltage (Vt) that is set in accordance with the electrons in the floating gates FG1, FG2. The top channel and the side channels electrically connects the source and the drain (the diffusion regions 14a, 14b), so that a channel CH to pass the electrons (charged particles) is generated in the whole surface of the projection 13.

In a buried region of the silicon substrate 12 that connects the diffusion regions 14a, 14b as the source and the drain, there is a high impurity area 12a having high density of P type impurities. The high impurity area 12a serves as a punch through prevention area to prevent electrons from moving directly between the source and the drain without passing the channel CH.

Figure 3:
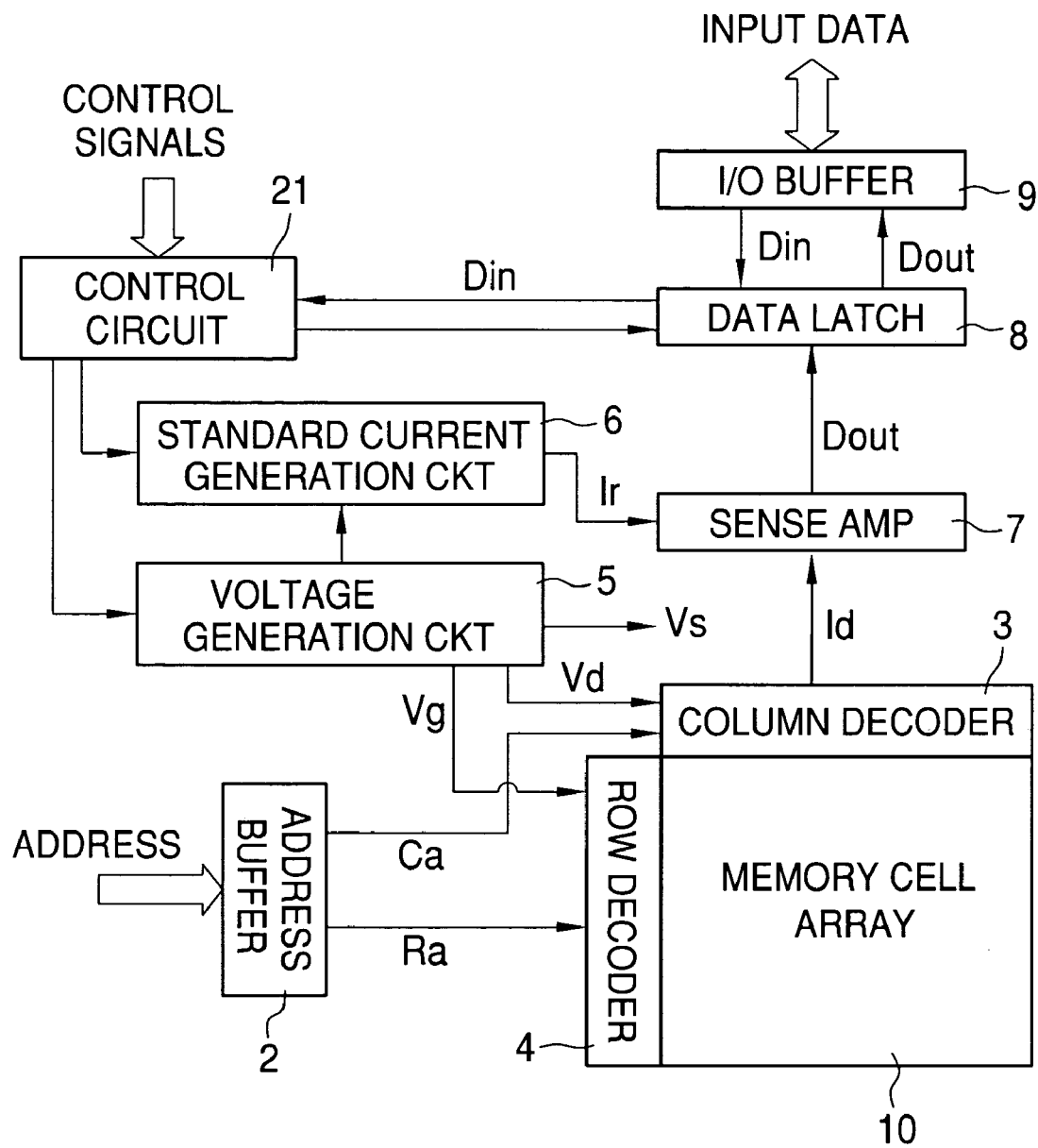
FIG. 3 is a block diagram of an electrical configuration of a semiconductor memory according to the present invention.

FIG. 3 shows the configuration of the semiconductor memory having the memory cell array 10 and circuits to drive the memory cell array 10. The semiconductor memory comprises an address buffer 2, a column decoder 3, a row decoder 4, a voltage generation circuit 5, a standard current generation circuit 6, a sense amplifier 7, a data latch 8, an I/O buffer 9 and a control circuit 21. The address buffer 2 amplifies address signals that are externally inputted to the semiconductor memory. The column decoder 3 decodes the column address signals Ca from the address buffer 2 to select the bit line BL. The row decoder 4 decodes the row address signals Ra from the address buffer 2 to select the word line WL. Thereby, it is possible to select the designated cell transistor 11 in the memory cell array 10 by the address signals.

The voltage generation circuit 5 generates voltage in the writing, reading and erasing operations, and applies the drain voltage Vd via the column decoder 3 to the designated bit line BL as the drain. The voltage generation circuit 5 applies the gate voltage Vg via the row decoder 4 to the designated word line WL. The voltage generation circuit 5 also supplies the substrate voltage Vs to the silicon substrate 12 (or the P type well region), and the voltage to the standard current generation circuit 6.

The sense amplifier 7 detects the readout current Id flowed from the bit line BL (drain) in the reading operation. The sense amplifier 7 detects the standard current Ir from the standard current generation circuit 6, and compares the readout current Id with the standard current Ir. Then, the sense amplifier 7 outputs data Dout ('0' or '1') as the result of comparison, and the output data Dout is sent to the data latch 8.

The data latch 8 stores the input data Dout, and outputs data Dout to an external circuit via the I/O buffer 9. In the writing operation, the I/O buffer 9 amplifies externally inputted data Din and sends it to the data latch 8 that sends the input data Din to the control circuit 21.

In response to control signals that are externally inputted, the control circuit 21 controls the operation of the surrounding circuit such as the voltage generation circuit 5, the standard current generation circuit 6 and the data latch 8, in the operation such as the reading and writing operations. Although not illustrated in the drawings, a voltage Vcc from a power source is supplied to each part of the surrounding circuit.

Figure 4A:
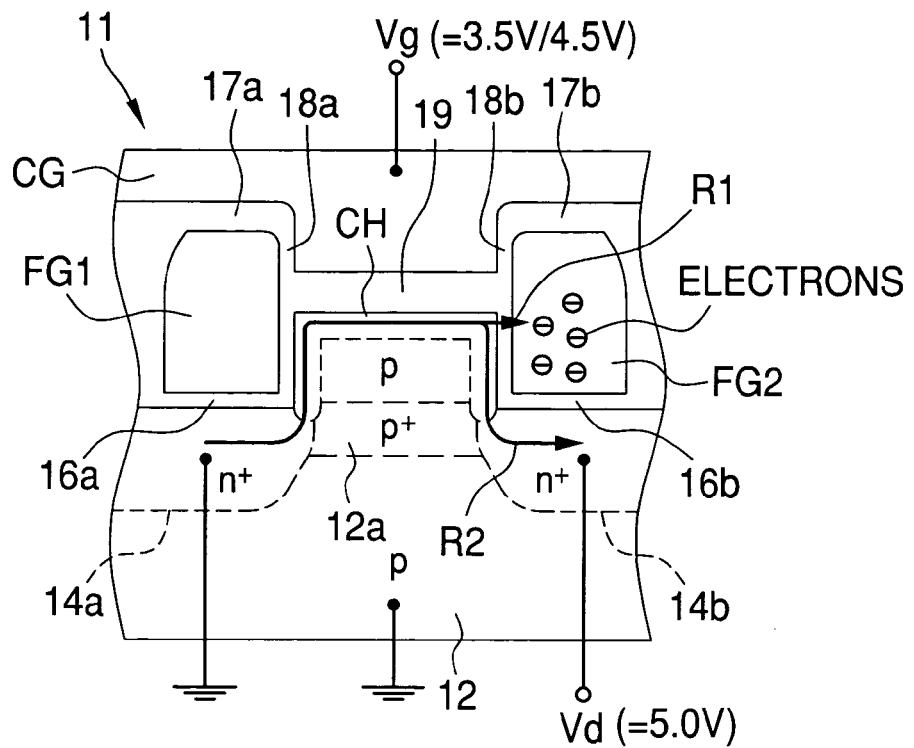
FIG. 4A is a section showing an operation to write information in the cell transistor.

In FIG. 4A, a section of the cell transistor 11 in the writing operation is depicted. In the writing operation, the electrons are stored in one of the floating gates FG1, FG2 that serves as the drain (drain side floating gate). For example, in storing the electrons in the floating gate FG2, the voltage generation circuit 5 supplies the drain voltage Vd of 5.0V to the diffusion region 14b via the column decoder 3. In addition, the other diffusion region 14a and the substrate 12 are earthed, and the voltage generation circuit 5 supplies the gate voltage Vg of 3.5V or 4.5V to the control gate CG via the row decoder 4. The level of the gate voltage Vg is determined in accordance with the state of the source side floating gate. When the source side floating gate is in a non-accumulated state '1' in which the electrons are not accumulated, the gate voltage Vg of 3.5V is selected. On the other hand, when the source side floating gate is in an accumulated state '0' in which the electrons are accumulated, the gate voltage Vg is 4.5V. It is to be noted that, in this example, the diffusion region 14a below the floating gate FG1 is the source, and the other diffusion region 14b below the floating gate FG2 is the drain.

These applied voltages in the writing operation (the gate voltage Vg and the drain voltage Vd) cause to generate an inversed layer near the top surface 13c of the projection 13, so the channel CH for the electron passage from the source to the drain is generated in the surface of the projection 13 including the side surfaces 13a, 13b. The electron passage from the source is divided into the passages R1, R2. In the passage R1, a part of the electrons are accelerated to have a large energy due to the potential between the source and the drain, and the electrons in the passage R1 become the hot electrons having large movement. The hot electrons go over the potential barrier of the first insulation layer 16b and enter the floating gate FG2. In the other passage R2, the electrons are scattered by the phonons and the impurities so that the electrons in the passage R2 lose the energy and cannot be the hot electrons. Thus, the electrons in the passage R2 flow into the drain. The electrons in the passage R1 enter the floating gate FG2 through the first insulation layer 16b. Since the side of the insulation layer 16b is substantially perpendicular to the direction of the passage R1, so the hot electrons can effectively enter the floating gate FG2. It is possible to set the diffusion region 14a as the drain and the other diffusion region 14b as the source. In that case, the electrons enter the floating gate FG1.

Figure 4B:
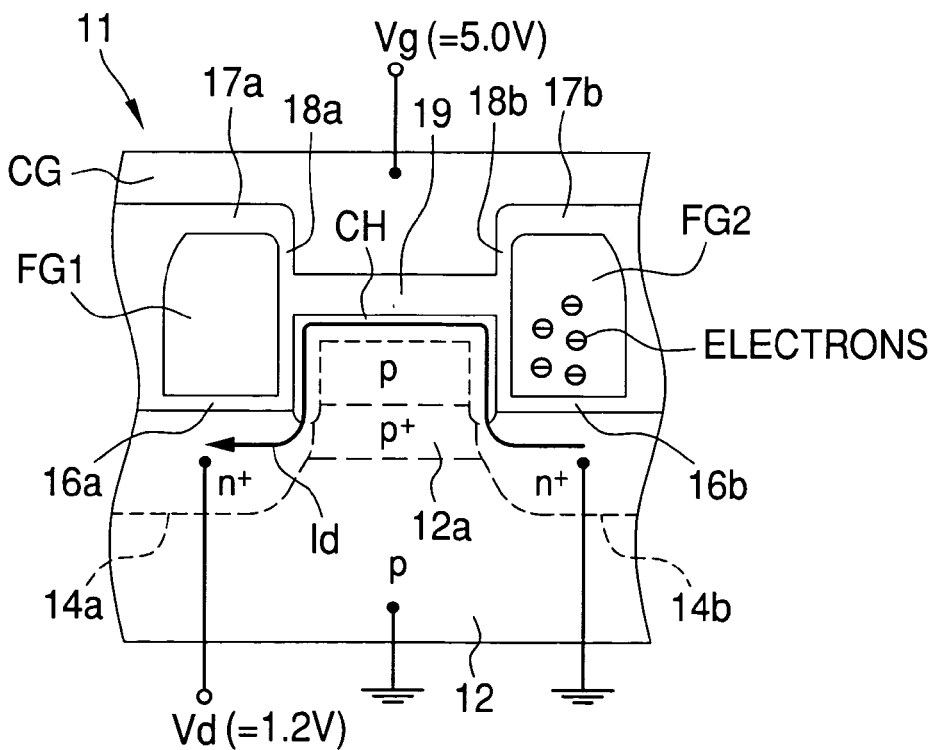
FIG. 4B is a section showing an operation to read out information from the cell transistor.

FIG. 4B show a section of the cell transistor 11 in the reading operation to read information in the cell transistor 11. In the reading operation, the semiconductor memory checks the state of the floating gates FG1, FG2 individually. For example, in detecting the state of the floating gate FG2 of the cell transistor 11 selected by the address signals Ca, Ra, the drain voltage Vd of 1.2V and the gate voltage Vg of 5.0V are respectively applied to the diffusion region 14a and the control gate CG. The other diffusion region 14b and the substrate 12 are earthed. In this example, the diffusion region 14a serves as the drain, and the diffusion region 14b serves as the source.

These applied voltages in the reading operation (the gate voltage Vg and the drain voltage Vd) cause to generate an inversed layer near the top surface 13c of the projection 13, so the channel CH for the electron passage from the source to the drain is generated in the surface of the projection 13 including the side surfaces 13a, 13b. The electrons flow from the source to the drain through the channel CH. The drain current (readout current) Id is modulated by the amount of the electrons in the source side floating gate FG2. The drain current Id is slightly affected by the amount of the electrons in the drain side floating gate FG1, and thus it is possible not to consider the effect of the drain side floating gate FG1 to the drain current Id. This is because the coupling capacitance of the floating gates FG1, FG2 and the source/drain is large (in other words, the coupling ratio is small). That is, the source side floating gate FG2 is connected to the source potential (earth level), so the drain current Id is strongly modulated by the amount of the electrons in the source side floating gate FG2. On the other hand, the potential of the drain side floating gate FG1 increases due to the drain voltage Vd, so the drain current Id is slightly affected by the amount of the electrons in the drain side floating gate FG1.

Accordingly, in the event that the electrons are accumulated in the source side floating gate FG2, the readout current Id is modulated by the electrons and becomes smaller than the standard current Ir generated in the standard current generation circuit 6 (Id<Ir). The sense amplifier 7 compares the readout current Id with the standard current Ir, and the output data Dout becomes '0'. On the other hand, when the electrons are not accumulated in the source side floating gate FG2, the readout current Id is larger than the standard current Ir (Id>Ir). In that case, the output data Dout becomes '1'. The diffusion region 14a may be set as the source and the other diffusion region 14b as the drain, and the electron state in the floating gate FG1 can be checked in the same manner.

Figure 5:
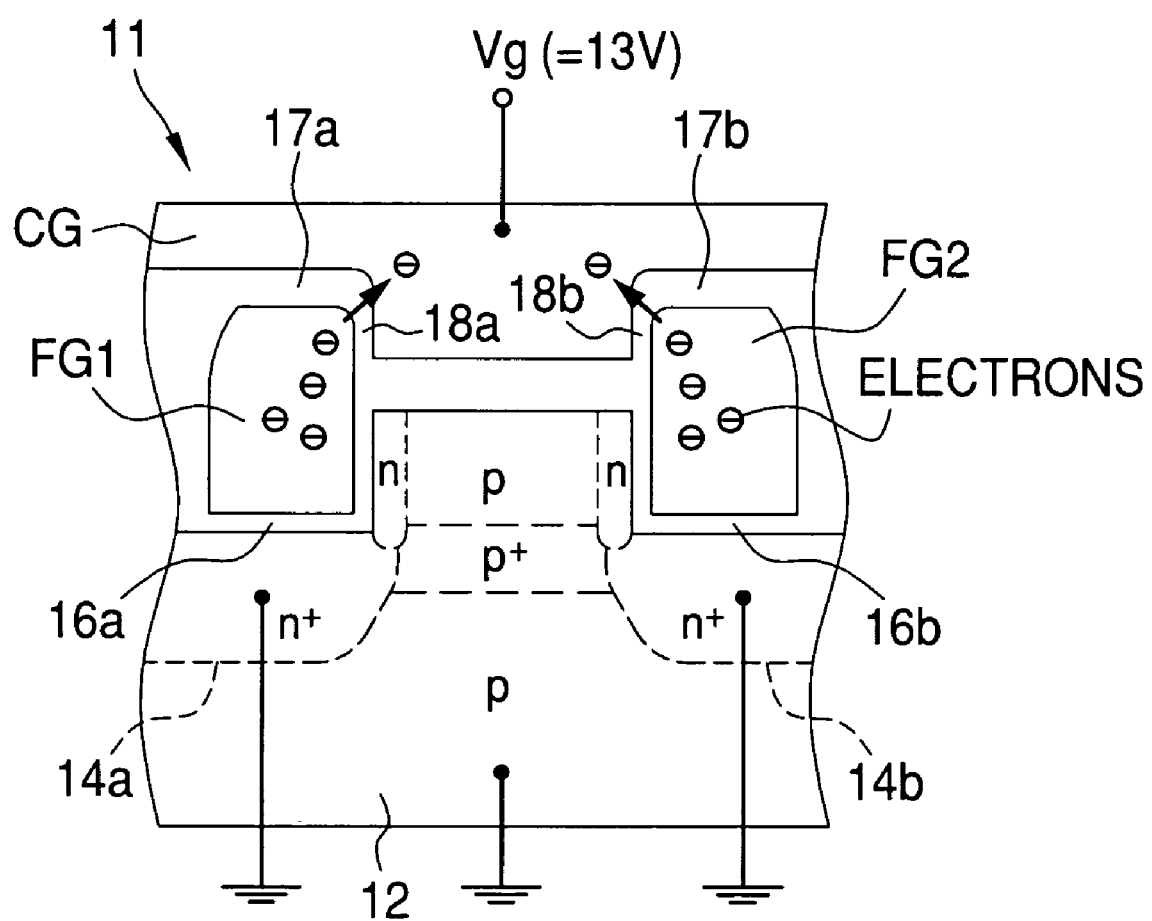
FIGS. 5 through 16B are sections demonstrating a series of processes to manufacture the cell transistor.

FIG. 5 shows a section of the cell transistor 11 in the erasing operation to erase information in the cell transistor 11. In the erasing operation, the electrons accumulated in both floating gates FG1, FG2 are simultaneously discharged to the control gate CG. The cell transistors 11 arranged in the row direction (for each word line WL) erase data at the same time. Initially, information (electrons) is stored in both floating gates FG1, FG2 for the purpose of facilitating the same electron states after erasing data. Then, all the bit lines BL (diffusion regions 14a, 14b) and the silicon substrate 12 are earthed. The voltage generation circuit 5 supplies the gate voltage Vg of 13V to the word line WL (control gate CG). The level of the gate voltage Vg may be relative to the potential of the silicon substrate 12 (or the P type well region). For example, the gate voltage Vg is 6.5V and the potential of the silicon substrate 12 is −6.5V. It is possible to apply the voltage of −6.5V to the silicon substrate 12 by setting the diffusion regions 14a, 14b as the floating state.

The voltage for erasing data (gate voltage Vg) generates high electric field in the second insulation layers 17a, 17b and the third insulation layers 18a, 18b that are positioned between the floating gates FG1, FG2 and the control gate CG. The thickness $d_3$ of the third insulation layers 18a, 18b is smaller than the thickness $d_2$ of the second insulation layers 17a, 17b ($d_2 > d_3$), so a higher electric field is generated in the third insulation layers 18a, 18b, compared with the second insulation layers 17a, 17b. For example, when the thickness $d_2$ is 22 nm and the thickness $d_3$ is 12 nm, the electric field in the second insulation layers 17a, 17b is about 4.6 MV/cm and the electric field in the third insulation layers 18a, 18b is about 8.5 MV/cm.

The third insulation layers 18a, 18b has the highest electric field in the part between the corners of the floating gates FG1, FG2 and the corners of the control gate CG. Due to such concentration in the electric field, most electrons in the floating gates FG1, FG2 passes the part of the third insulation layers 18a, 18b between the corners by FN tunneling, and enters the control gate CG. Since the electrons in the floating gates FG1, FG2 can be discharged through the small area in the third insulation layers 18a, 18b, it is possible to decrease the possibility to have defects in such small area. Thus, the floating gates FG1, FG2 can increase the property to keep the electrons. In the erasing operation, it is preferable to perform so-called over erasure to set the floating gate FG1, FG2 electrically positive (for example, to discharge about 500 electrons from neutral state).

In the way described above, the cell transistor 11 can store information of two bits (four values), that is, "(0, 0), (0, 1), (1, 0), (1, 1)".

Figure 6A:
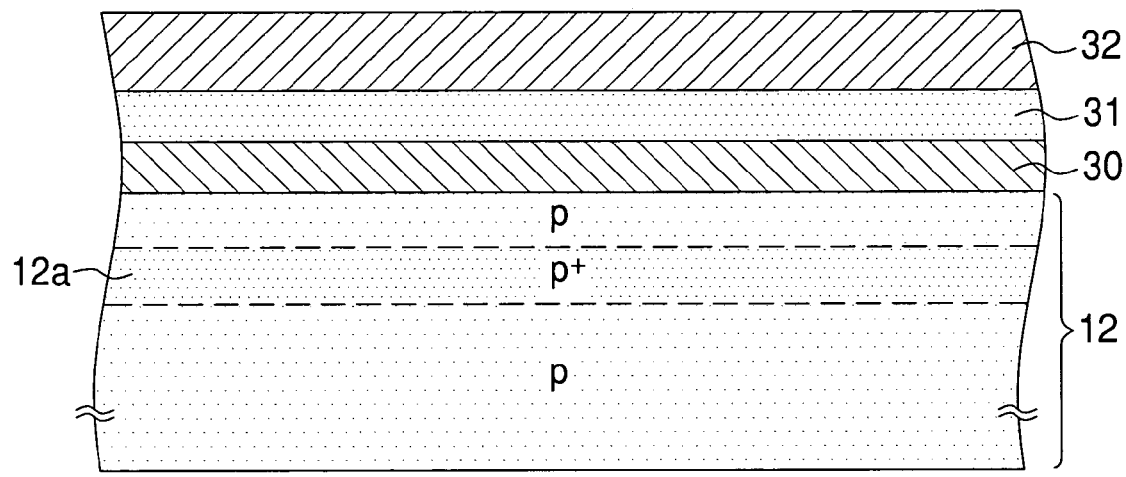

In FIGS. 6A through 16B, an example of the processes to manufacture the memory cell array 10 having the cell transistors 11 is illustrated. These drawings are sections of the formation area of the memory cell array 10 taken on the line in the row direction. In FIG. 6A, P type impurity ions (e.g. Boron B$^+$ ions) are uniformly implanted over the silicon substrate 12 to set the impurity density of about $1.0 \times 10^{16}$ cm$^{-3}$. Then, P type impurity ions are further implanted to form a P type impurity layer 12a having the impurity density of about $1.0 \times 10^{18}$ cm$^{-3}$ in the area of 30 to 50 nm from the surface of the silicon substrate 12. Then, a silicon oxide layer 30 having the thickness of about 20 to 30 nm is formed in the surface of the silicon substrate 12 by thermal oxidization. Moreover, a silicon nitride layer 31 with the thickness of about 20 nm and a silicon oxide layer 32 with the thickness of about 60 nm are layered on the silicon oxide layer 30 by chemical vapor deposition (CVD).

Figure 6B:
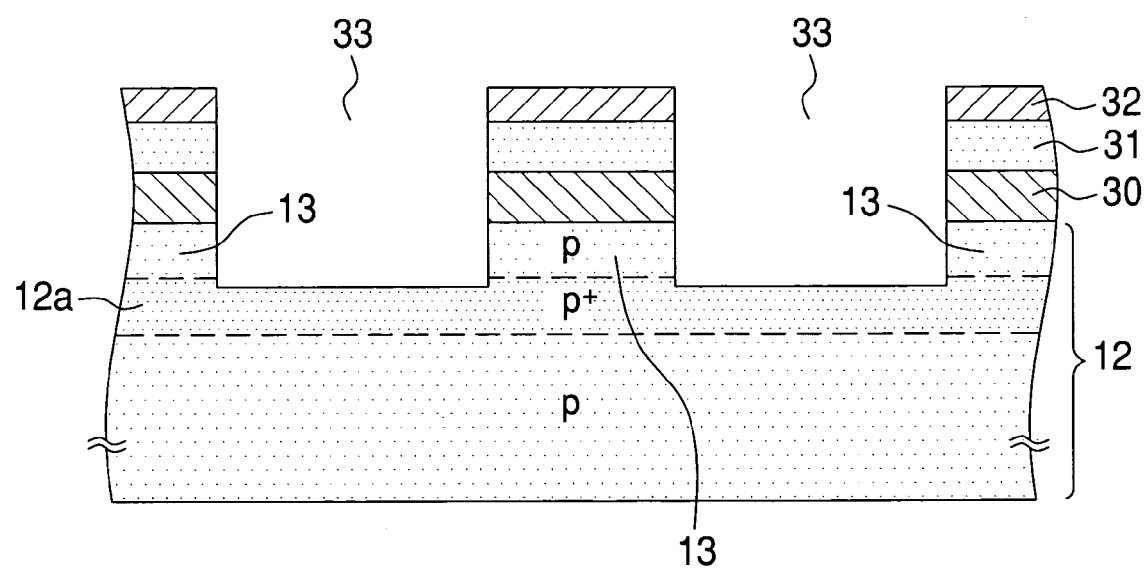

Although not illustrated, a photo resist is coated on the silicon oxide layer 32, and the photo resist on the silicon oxide layer 32 is subject to pattern exposure and development processes, so that stripe-shaped openings for the bit lines BL are formed on the silicon oxide layer 32. Then, the area of the oxide layer 32 that are not covered with the photo resist is removed by the etching process. After the photo resists are removed, the silicon nitride layer 31, the silicon oxide layer 30 and the silicon substrate 12 are successively subject to anisotropic etching process through the remaining oxide layer 32 as the hard mask. Thereby, as shown in FIG. 6B, plural trenches (grooves) 33 are formed, and as a result, the projection 13 is formed in the silicon substrate 12. The silicon oxide layer 32 as the hard mask becomes thin after the anisotropic etching process. The depth of the groove (the height of the projection 13) is about 40 nm, and the gap of the adjacent trenches 33 (the width of the projection 13) is about 90 nm. The width of the trench 33 is about 135 nm.

Figure 7A:
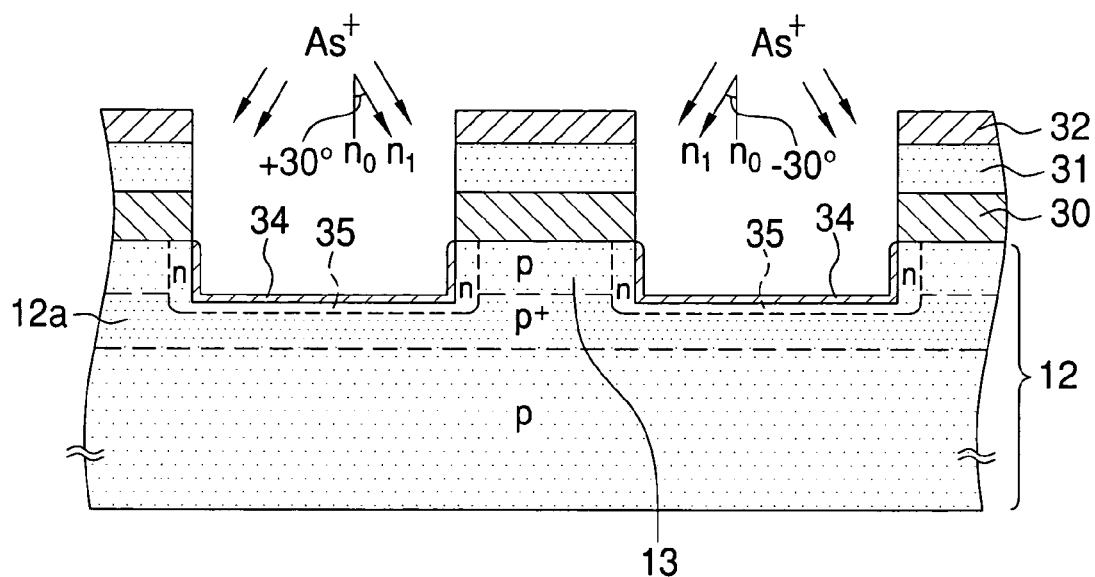
Figure 7B:
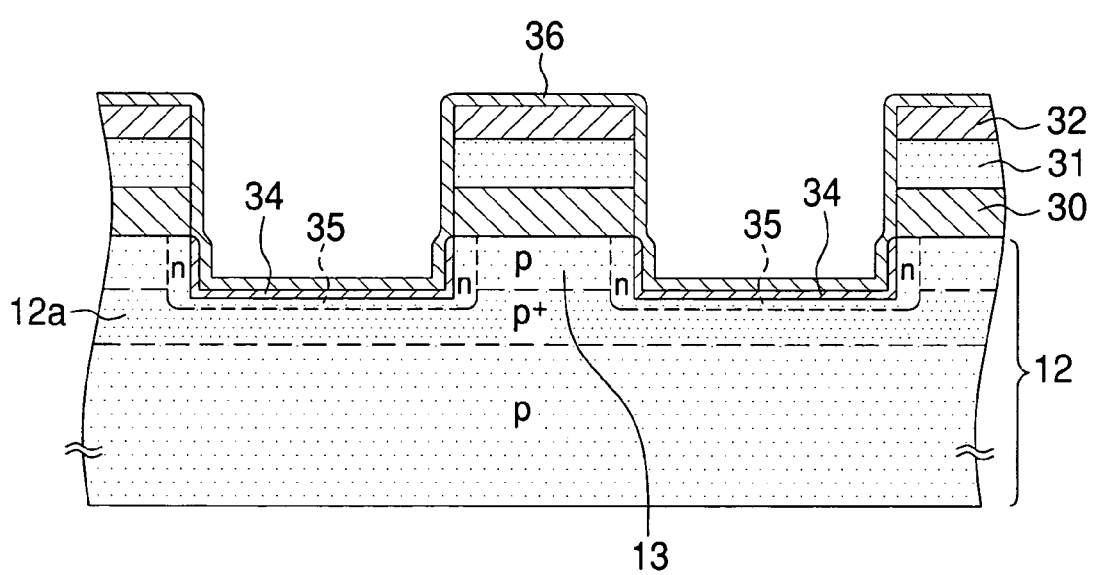

Referring to FIG. 7A, a silicon oxide layer 34 with the thickness of about 4 nm is formed in the exposed surface of the silicon substrate 12 by thermal oxidization. Then, N type impurity ions (e.g. As$^+$ ions) are obliquely implanted to form an N type region 35 having the impurity density of about $2.0 \times 10^{12}$ cm$^{-3}$ in the surface of the silicon substrate 12 (the sides of the projection 13 and the bottom surface of the trench 33. The ion implantation direction $n_1$ is inclined by about ±30° to the perpendicular line $n_0$ of the silicon substrate 12. As shown in FIG. 7B, a silicon oxide layer 36 with the thickness of about 6 nm is deposited on the whole exposed surface by the CVD process.

Figure 8A:
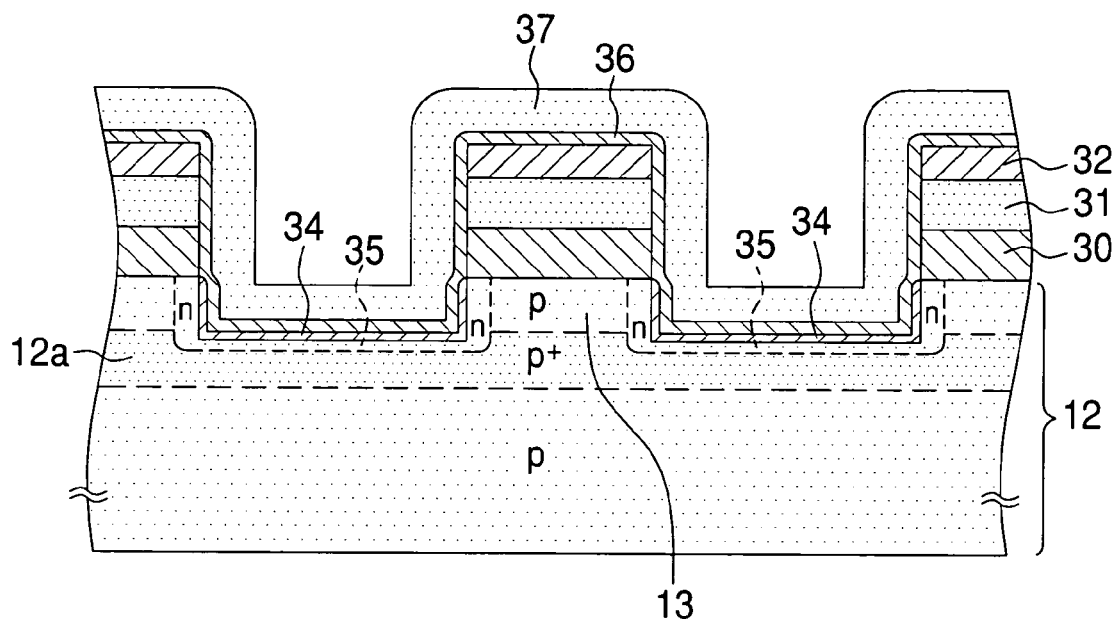
Figure 8B:
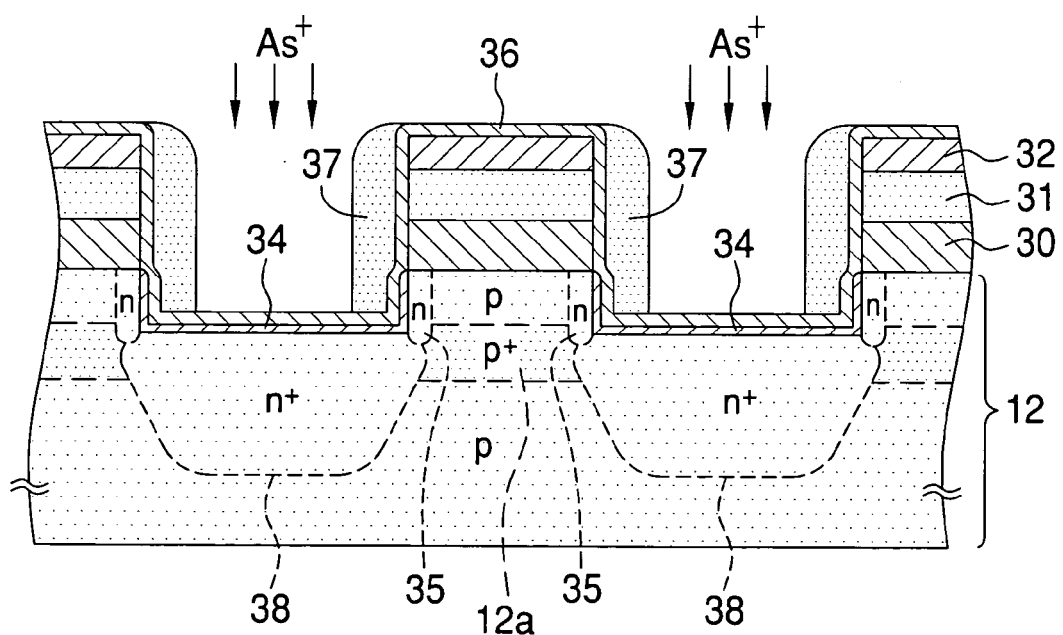

In FIG. 8A, the CVD process is performed to form a silicon nitride layer 37 with the thickness of about 30 nm on the silicon oxide layer 36. Then, as shown in FIG. 8B, side walls of the silicon nitride are formed by anisotropy etching of the silicon nitride layer 37 in the vertical direction perpendicular to the surface of the silicon substrate 12. The N type impurity ions (e.g. As$^+$ ions) are implanted in the silicon substrate 12 in the area facing the bottom face of the trench 33, so that N$^+$ type diffusion regions 38 with the impurity density of about $3.0 \times 10^{15}$ cm$^{-3}$ are formed in the silicon substrate 12.

Figure 9A:
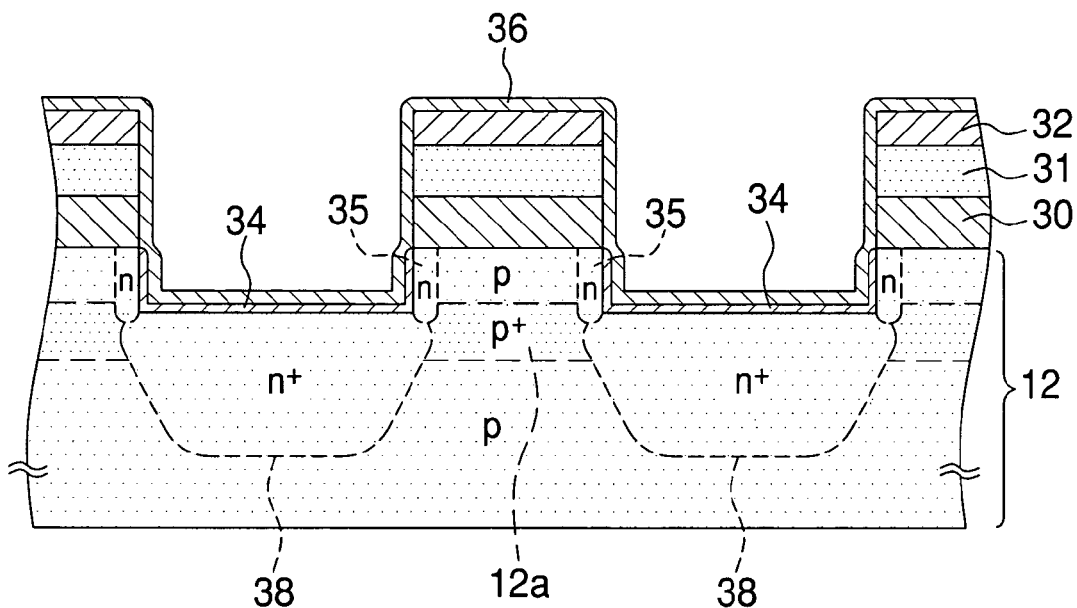
Figure 9B:
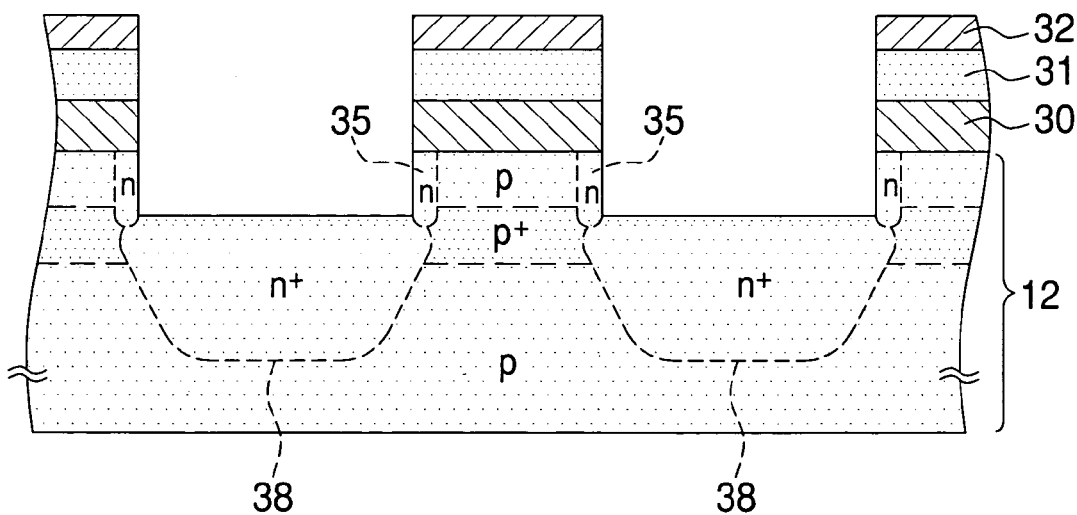

Thereafter, a thermal process called RTA (Rapid Thermal Anneal) is carried out at about 1000° C. for about 10 seconds to activate the impurities injected by the ion implantation. Referring to FIG. 9A, the silicon nitride layer 37 as the side walls are removed by etching process, and the thermal process is carried out at about 850° C. for about 60 seconds. Then, as shown in FIG. 9B, the silicon oxide layers 34, 36 are completely removed by the etching process.

Figure 10A:
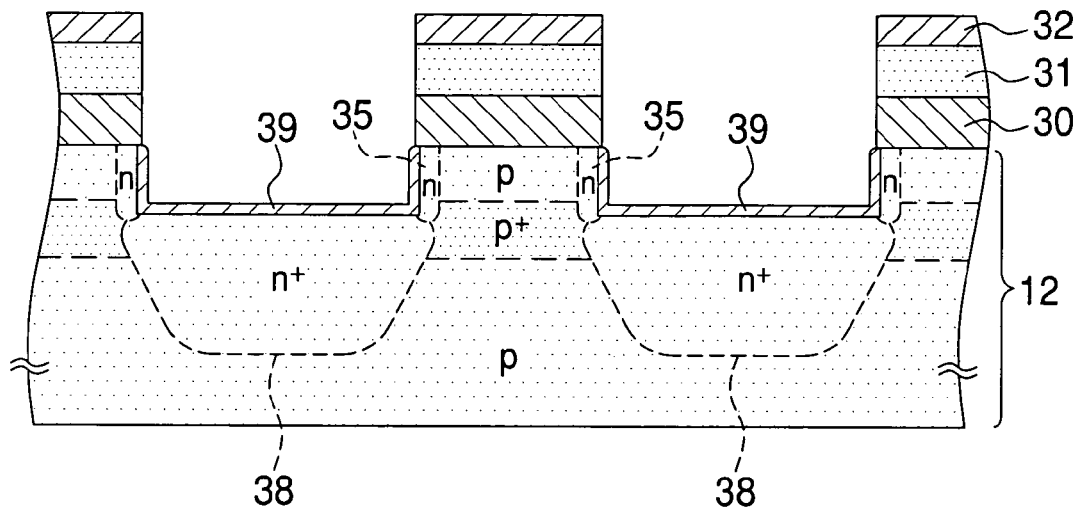
Figure 10B:
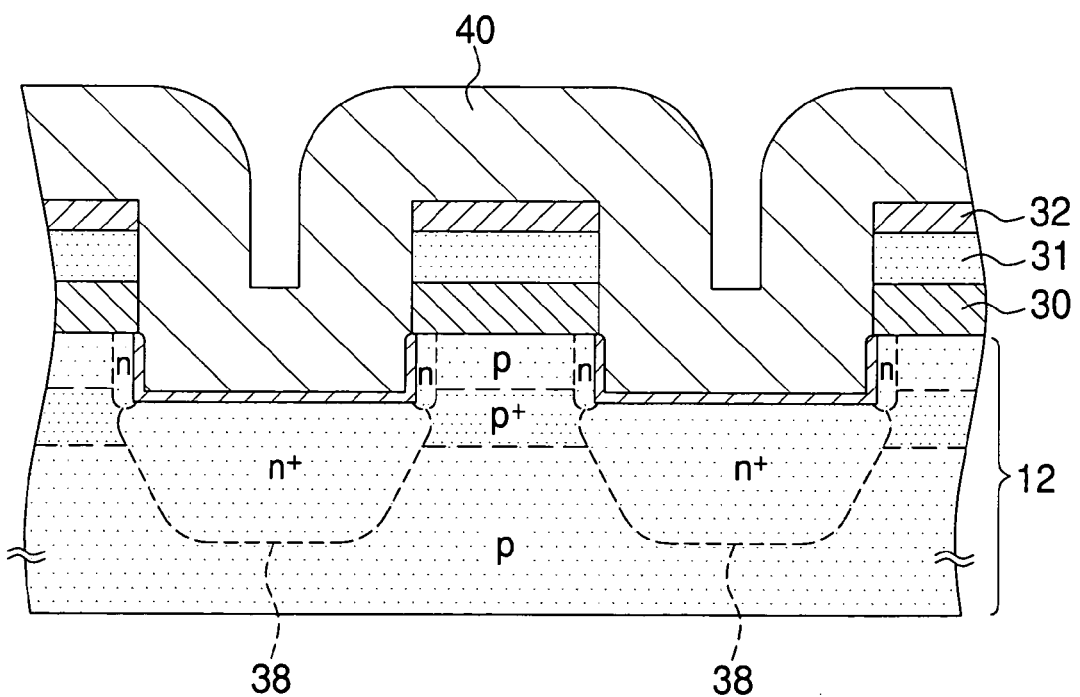

Referring to FIG. 10A, a uniform silicon oxide layer 39 having the thickness of about 8 nm is formed in the exposed surface of the silicon substrate 12 (surface of the diffusion region 38 and the side surfaces of the projection 13) by a plasma oxidization (to oxidize silicon by use of oxygen radicals (O*)). In the plasma oxidization process, the silicon oxide layer 39 is formed by eroding the silicon substrate 12 inward by about 3 nm, and by swelling outward by about 5 nm. Then, as shown in FIG. 10B, a conductive silicon (amorphous silicon or poly silicon) 40 for the floating gate is deposited on the whole surface by the CVD process. The thickness of the conductive silicon 40 is about 70 nm.

Figure 11A:
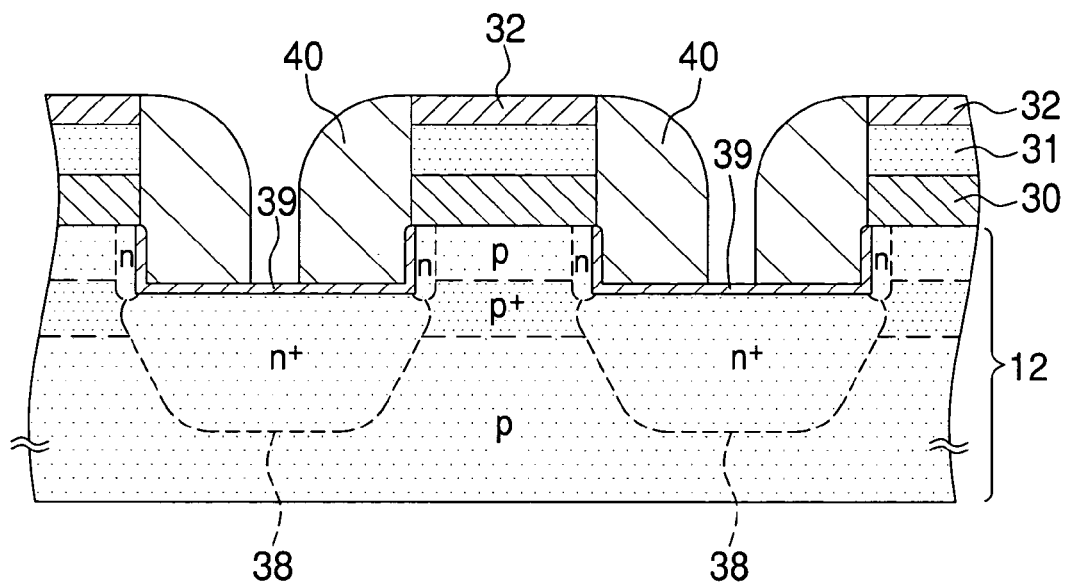
Figure 11B:
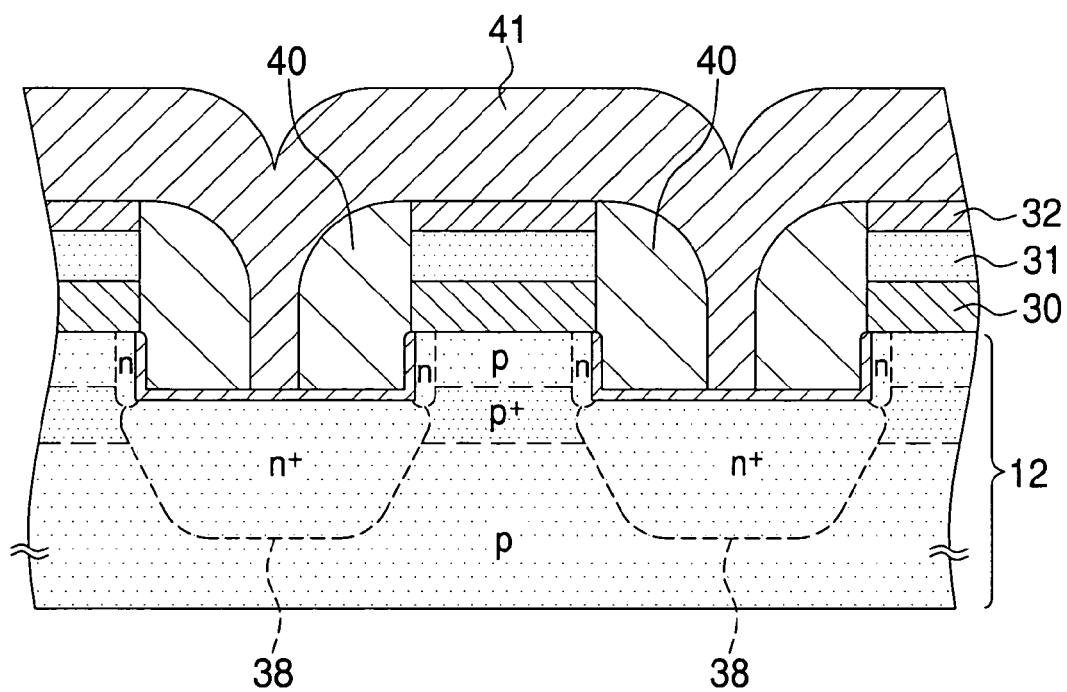

As shown in FIG. 11A, the conductive silicon 40 is subject to anisotropic etching process in the vertical direction, so that the silicon oxide layer 32 is exposed and the silicon oxide layer 39 in the bottom of the trench 33 is partially exposed. Thereby, the conductive silicon 40 is divided in the row direction. The divided conductive silicon 40 remains in both sides of the projection 13. Then, in FIG. 11B, a high density plasma (HDP) oxide layer 41 is formed over the surface by the CVD process. The thickness of the HDP oxide layer 41 is about 100 nm.

Figure 12A:
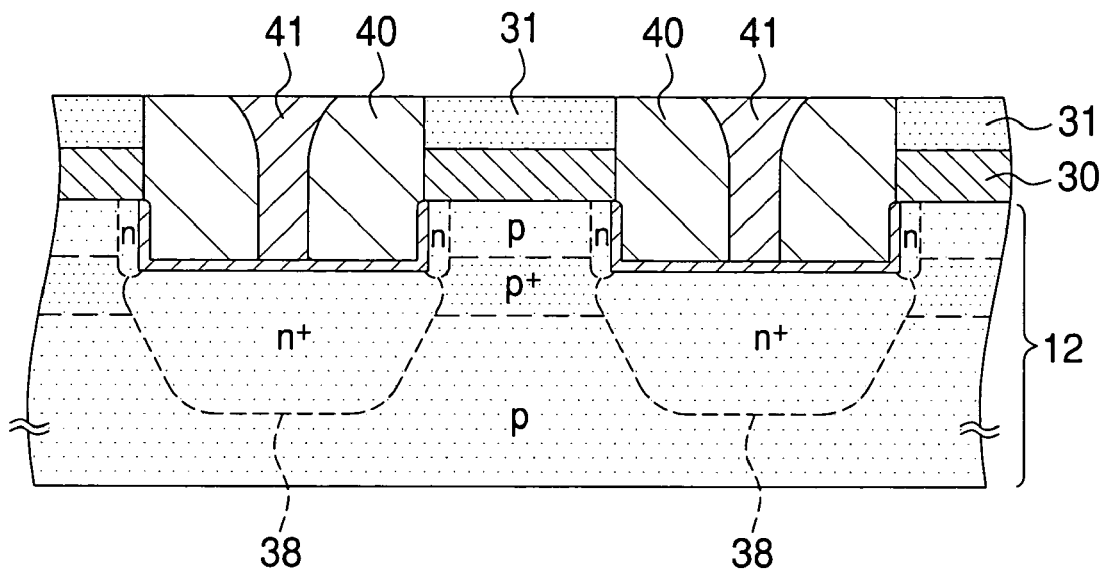

In FIG. 12A, the silicon substrate 12 is subject to CMP (Chemical Mechanical Polishing) process to flatten the surface of the HDP oxide layer 41 and the conductive silicon 40. This CMP process is carried out until the silicon oxide layer 32 is completely removed and the silicon nitride layer 31 is exposed. At that time, the top surface of the conductive silicon 40 becomes flat by the CMP process, so the conductive silicon 40 has the section of substantially rectangular shape in the row direction, as shown in FIG. 12A.

Figure 12B:
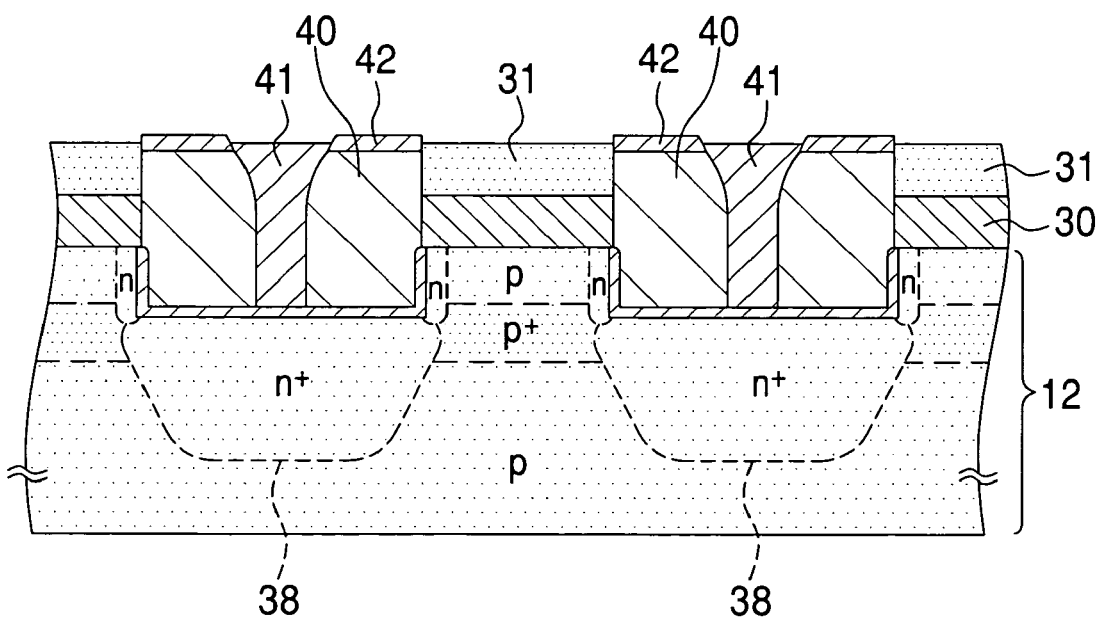

In FIG. 12B, the thermal oxidization process is carried out to form a silicon oxide layer 42 with the thickness of about 22 nm in the surface of the conductive silicon 40. In this thermal oxidization process, the silicon oxide layer 42 is formed by eroding the conductive silicon 40 inward and by swelling outward.

Figure 13A:
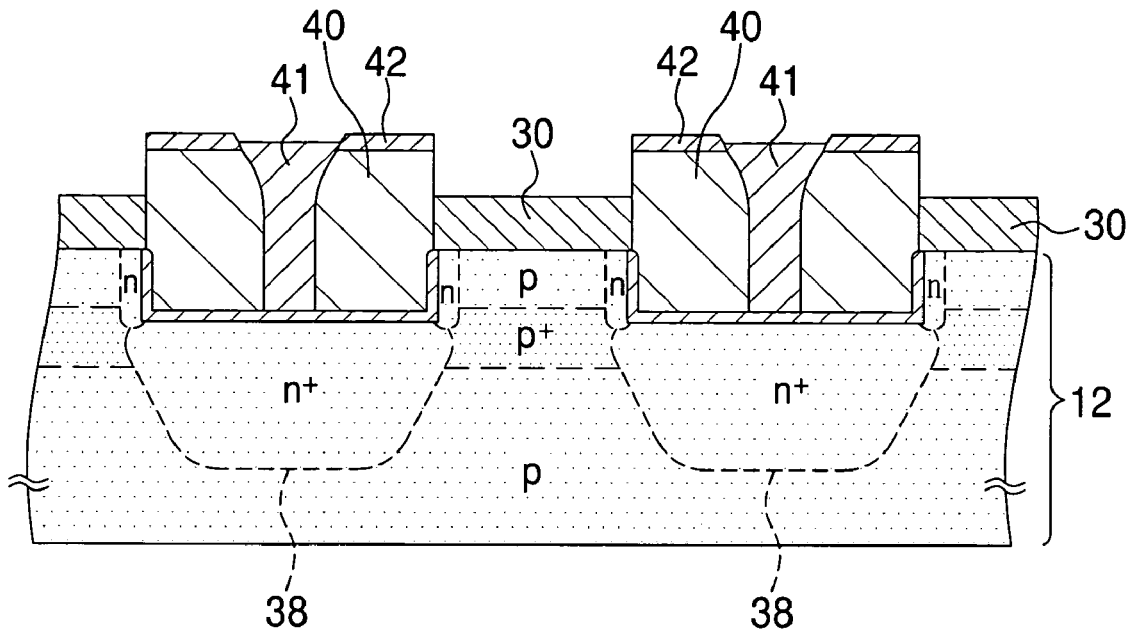

Referring to FIG. 13A, the silicon nitride layer 31 as the stopper in the CMP process is removed by the etching process so that the silicon oxide layer 30 and a part of the side of the conductive silicon 40 are exposed. The silicon nitride layer 31 is removed by wet etching process by use of a phosphoric solution. For example, the silicon nitride layer 31 is selectively removed with 85% $H_3PO_4$ at about 180° C. The silicon oxide layers 41, 42 and the conductive silicon 40 are hardly etched by the phosphoric solution.

Figure 13B:
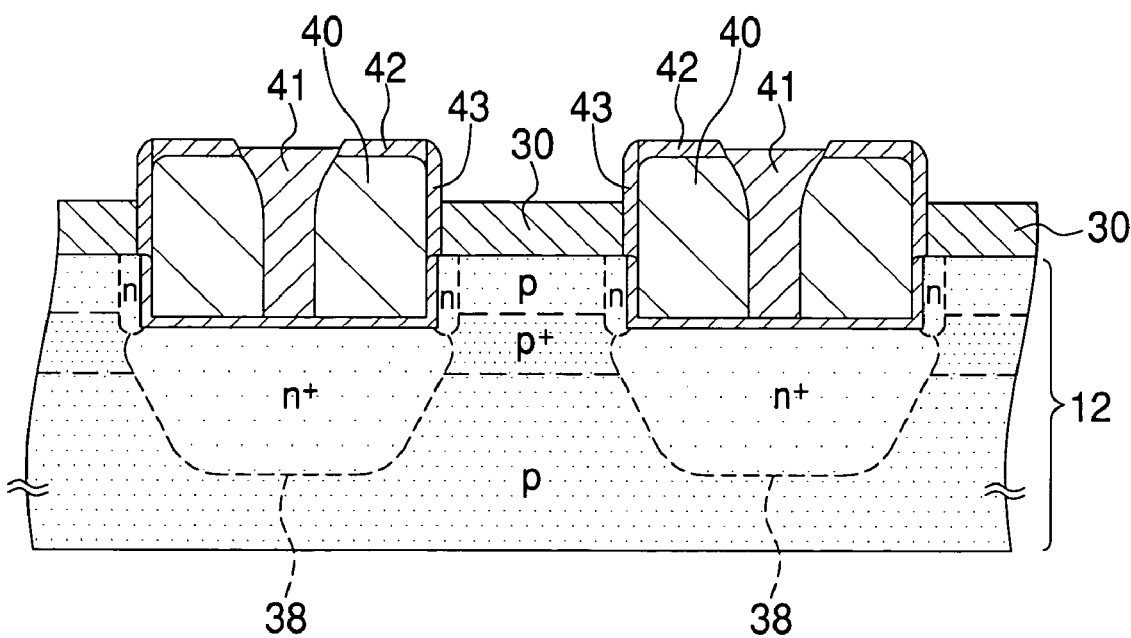

In FIG. 13B, the plasma oxidization (radical oxidization) process is performed to form a silicon oxide layer 43 in the exposed side surfaces of the conductive silicon 40. The thickness of the silicon oxide layer 43 is about 12 nm. The portion of the sides of the conductive silicon 40 covered with the silicon oxide layer 30 is also oxidized at the same time. Due to this plasma oxidization process, the corner of the conductive silicon 40 becomes slightly round. The plasma nitridation (radical nitridation) process may be carried out to get the surfaces of the oxide layers shallowly nitrified for the purpose of reducing current leakage.

Figure 14A:
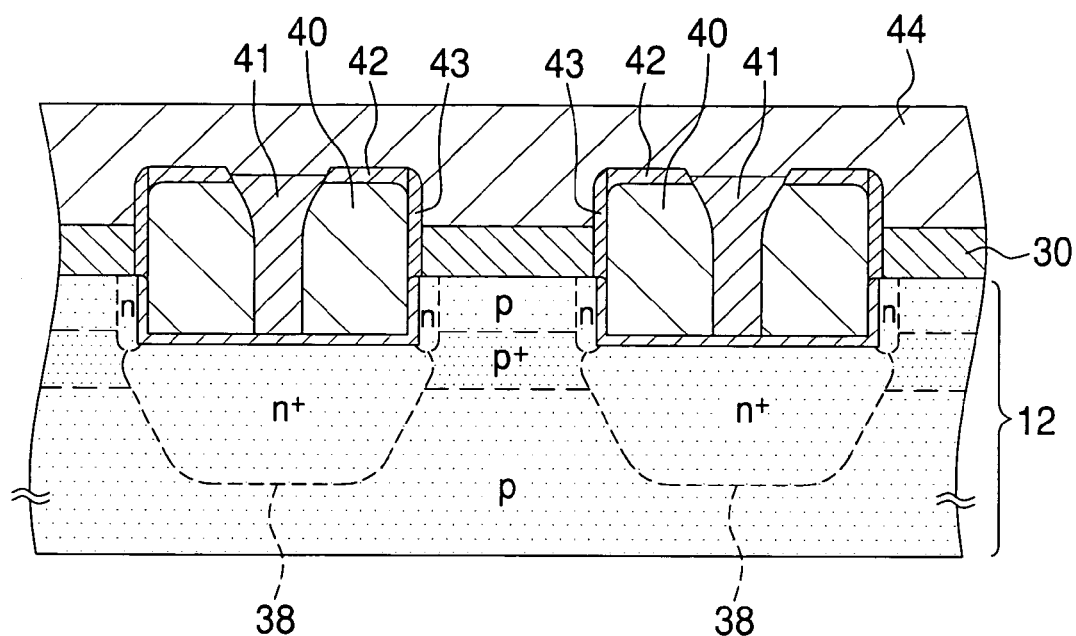
Figure 14B:
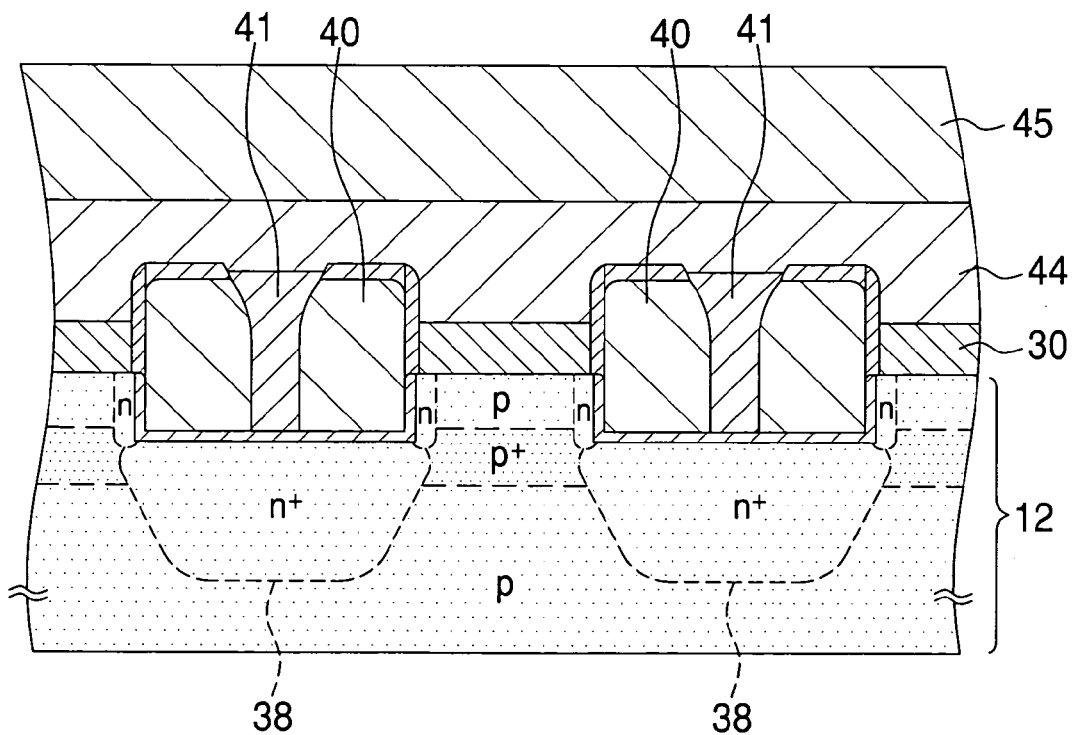

Referring to FIG. 14A, a conductive silicon 44 (amorphous silicon or poly silicon) 44 for control gate formation is formed over the whole surface by the CVD process. Then, the CMP process is carried out to flatten the surface of the layered conductive silicon 44. Next, as shown in FIG. 14B, a silicon oxide layer 45 is formed on the conductive silicon 44 by the CVD process. Instead of the silicon oxide layer 45, a silicon nitride layer may be formed. Thereafter, a photo resist is coated on the silicon oxide layer 45, and pattern exposure and development processes are carried out to form a stripe-shaped resist pattern having plural openings each of which corresponds to the separation region between the word lines WL (see FIG. 1).

Figure 15A:
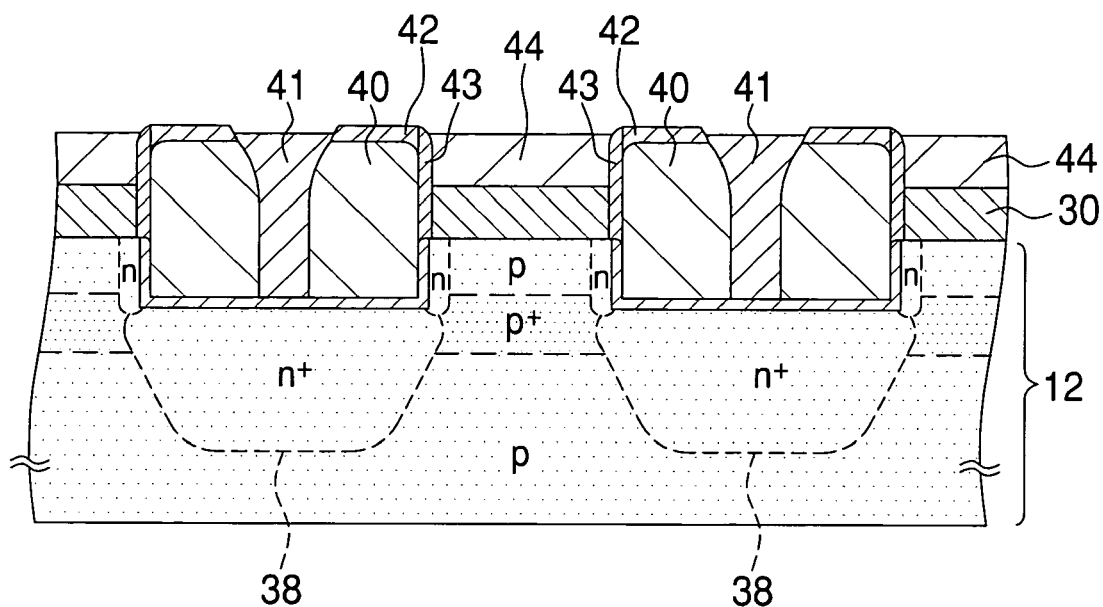

FIGS. 15A through 16B show the sections of the cell transistor 11 in manufacture taken on the line B-B. The layers in the word line formation area that exist behind these drawings are not illustrated. In FIG. 15A, after the portion of the oxide layer 45 that is not covered with the photo resist is removed by the etching process, the photo resist is completely removed. Then, the conductive silicon 44 in the separation region is removed by the anisotropic etching process via the silicon oxide layer in the word line formation area as the hard mask. The anisotropic etching process is carried out until the silicon oxide layers 41, 42 are exposed.

Figure 15B:
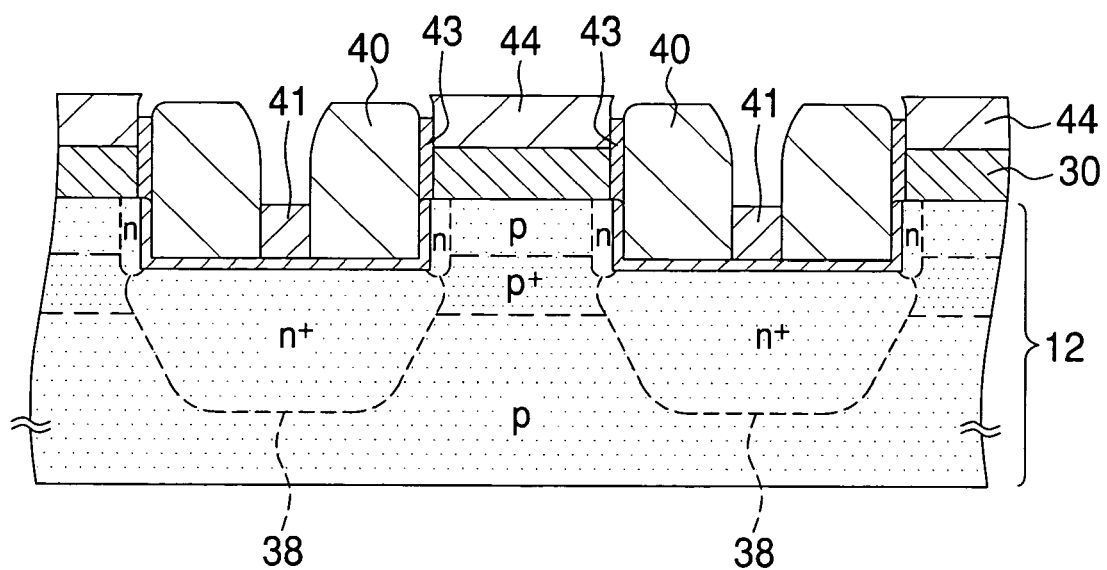

In FIG. 15B, the silicon oxide layer 45 remaining in the word line formation area is utilized as the hard mask during the etching process to the silicon oxide layers 41, 42 and 43 in the separation region, so that the top and a part of the side of the conductive silicon are exposed. This etching process is carried out for a predetermined period. Since the top surface of the projection 13 is covered with the conductive silicon 44, the silicon oxide layer 30 in the separation region and the word line formation area is not etched. In order to increase durability of the conductive silicon 44 as the etching mask, the conductive silicon 44 may be subject to plasma nitridation before the etching process.

Figure 16A:
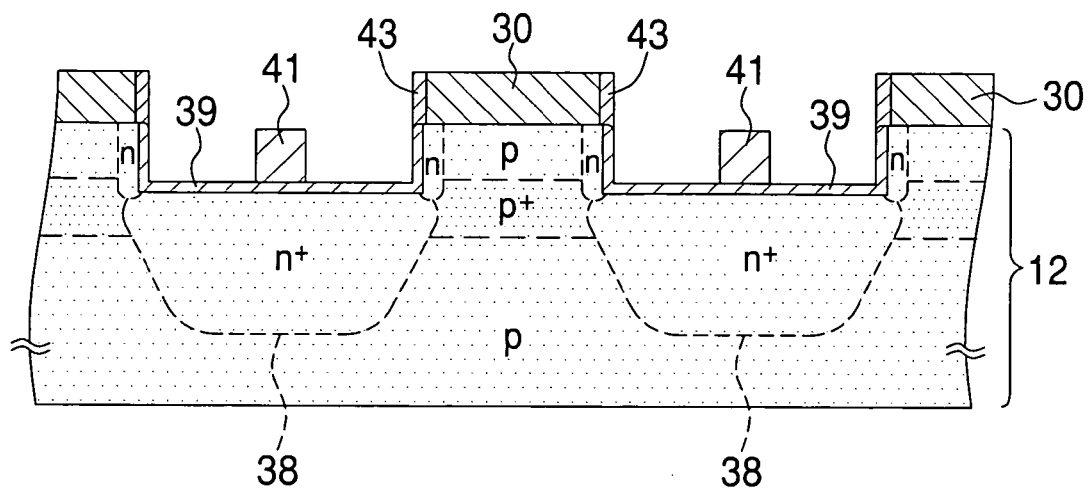

Referring to FIG. 16A, anisotropic etching is carried out to remove the conductive silicon 40 for floating gate formation and the conductive silicon 44 for control gate formation are completely removed from the separation region. The silicon oxide layer 45 in the word line formation region is used as the hard mask during this anisotropic etching process. At that time, the silicon oxide layers 41, 43 in the separation region is slightly etched. Thereafter, an insulation layer is formed on the whole surface of the semiconductor memory so as to fill the separation region with an insulator (e.g. silicon oxide). Thereby, the memory cell array 10 is manufactured.

The conductive silicon 40, 44 is separated by the separation region in the column direction. The conductive silicon 40 constitutes the floating gates FG1, FG2. The conductive silicon 44 constitutes the word line WL (control gate CG).

Figure 16B:
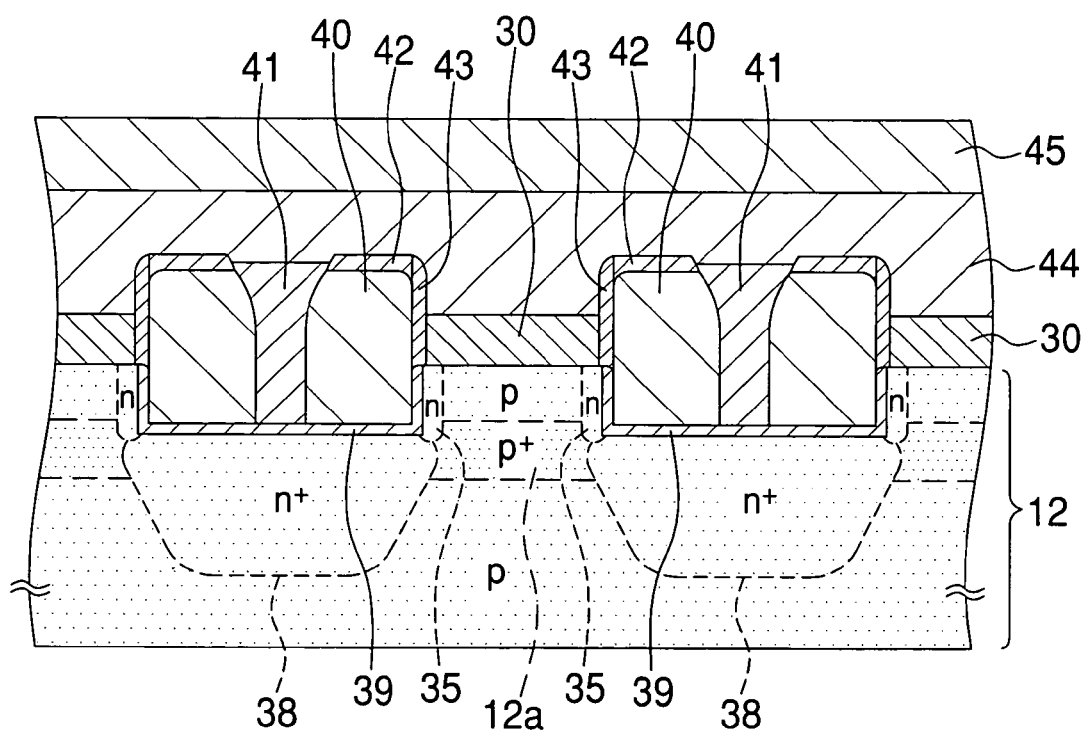

FIG. 16B shows the section of the manufactured memory cell array 10 taken on the line A-A of FIG. 1. The silicon oxide layer 39 corresponds to the first insulation layers 16a, 16b, the silicon oxide layer 42 corresponds to the second insulation layers 17a, 17b. The silicon oxide layer 43 corresponds to the third insulation layers 18a, 18b, the silicon oxide layer 30 corresponds to the fourth insulation layer 19, and the silicon oxide layer 41 corresponds to the insulators 20a, 20b. The diffusion region 38 and the N type region 35 correspond to the diffusion regions 14a, 14b and the N type regions 15a, 15b, respectively.

Although the word lines are separated (in other words, the word lines and the floating gates are formed) by the processes shown in FIGS. 15A through 16A, the word lines can be separated by the processes shown in FIGS. 17A through 19, which will be described below.

Figure 17A:
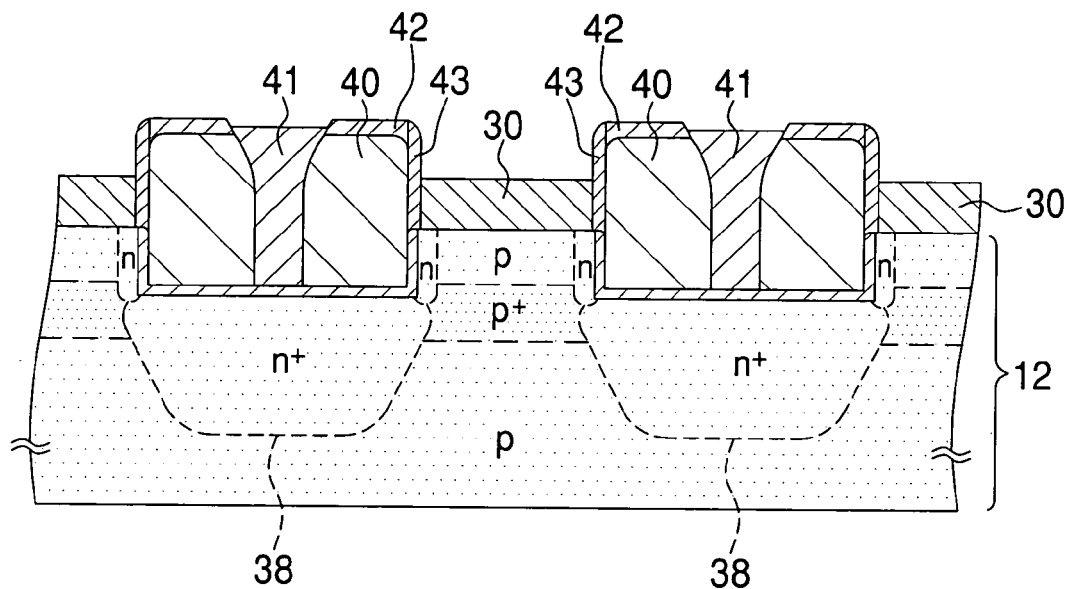
FIG. 17A through FIG. 19 are sections demonstrating an alternative of a word line separation process.

After the processes in FIGS. 6A through 14B are completed, the silicon oxide layer 45 exposed through the opening in the photo resist pattern (in the separation region) is removed by etching, as shown in FIG. 17A. Then, the photo resist is completely removed. With the silicon oxide layer 45 remained in the word line formation region as the hard mask, the anisotropic etching process is carried out to remove the control gate conductive silicon 44 in the separation region. Thereby, the silicon oxide layer 30 on the projection 13 is exposed, and the conductive silicon 44 is divided in the column direction to form the word lines WL (control gates CG).

Figure 17B:
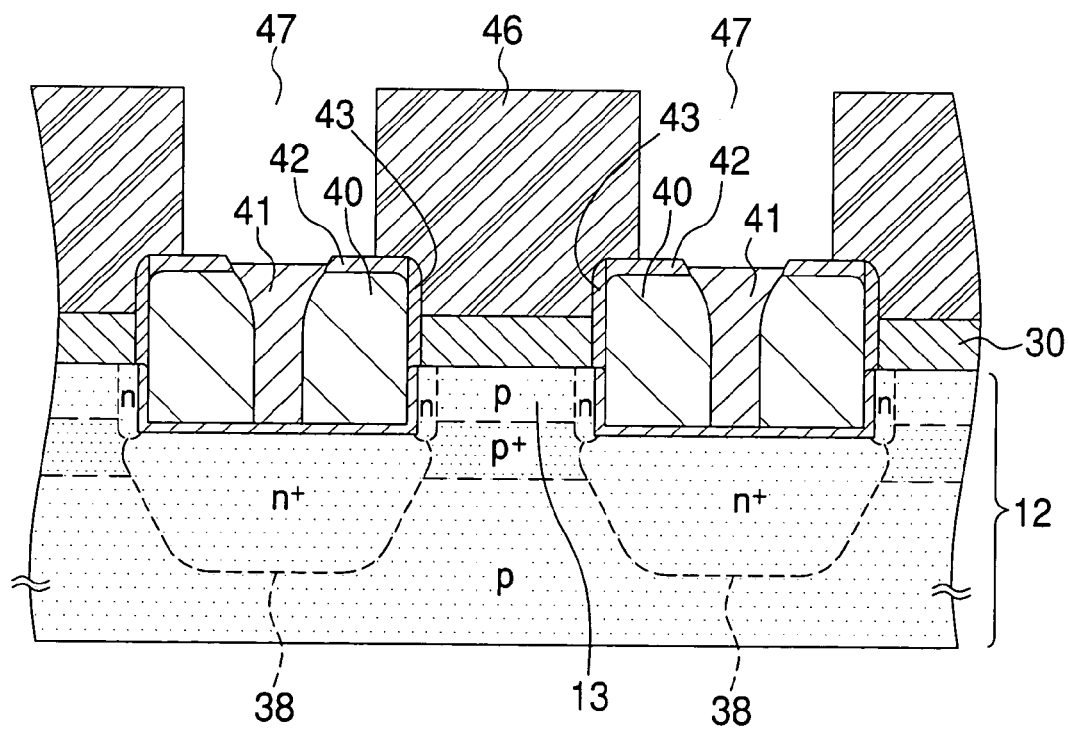
Figure 20:
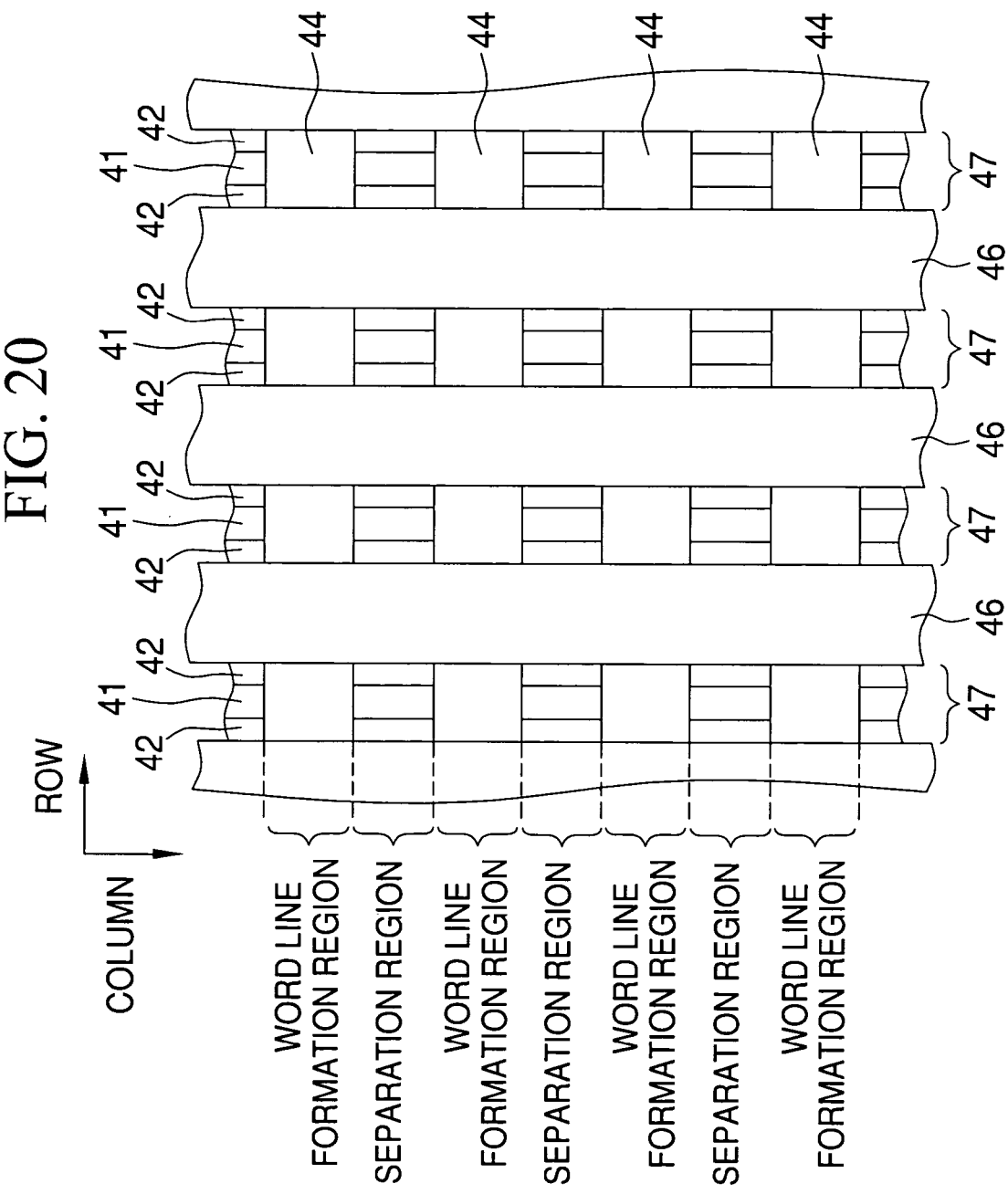
FIG. 20 is a top plan view showing a photo resist pattern formed in the word line separation process.

In FIG. 17B, a photo resist is coated on the whole surface, and a photo resist pattern 46 having stripe-shaped openings 47 in the column direction (see FIG. 20) is formed by the pattern exposure and the development processes. Note that FIG. 20 is the top plan view of the cell transistors 10 of FIG. 17B. In the separation region, the photo resist pattern 46 covers the silicon oxide layer 30 on the projection 13, the silicon oxide layer 43 covering the side of the floating gate conductive silicon 40, and a part of the silicon oxide layer 42 on the conductive silicon 40. In the word line formation region, the resist pattern 46 is a stripe pattern extending in the column direction, and covers the silicon oxide layer 45 as the hard mask on the control gate conductive silicon 44. The silicon oxide layer 41 and a part of the silicon oxide layer 42 on the conductive silicon 40 are exposed through the openings 47. In the word line formation region, the silicon oxide layer 45 as the hard mask is exposed through the opening 47.

Figure 18A:
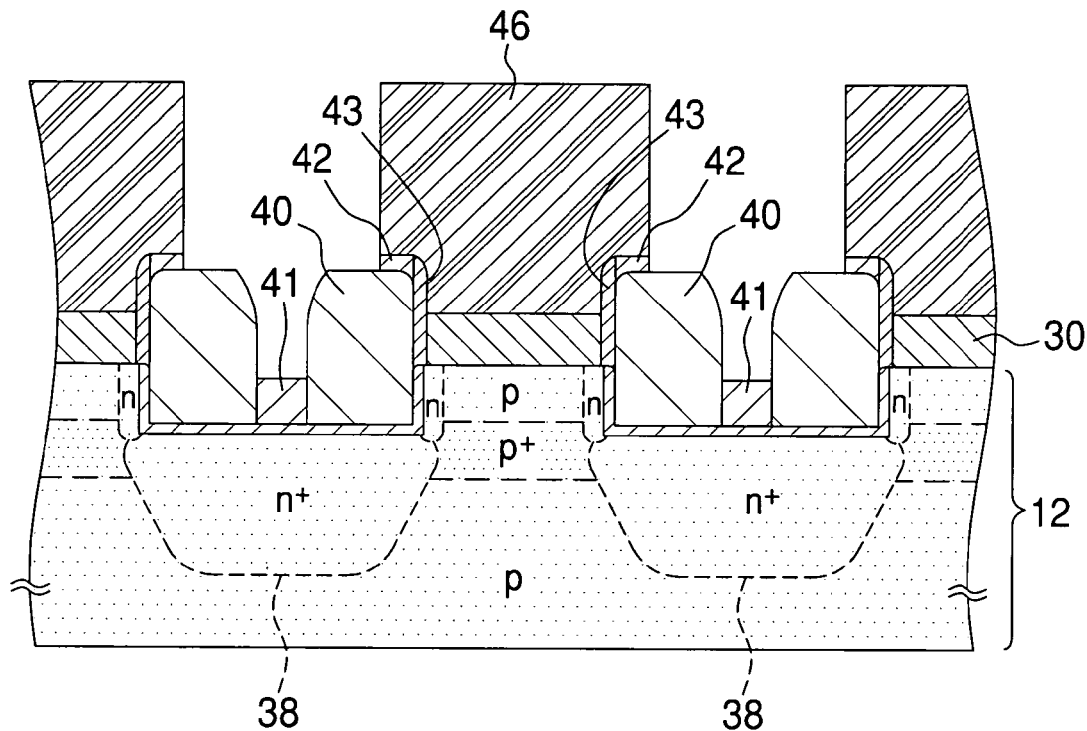
Figure 18B:
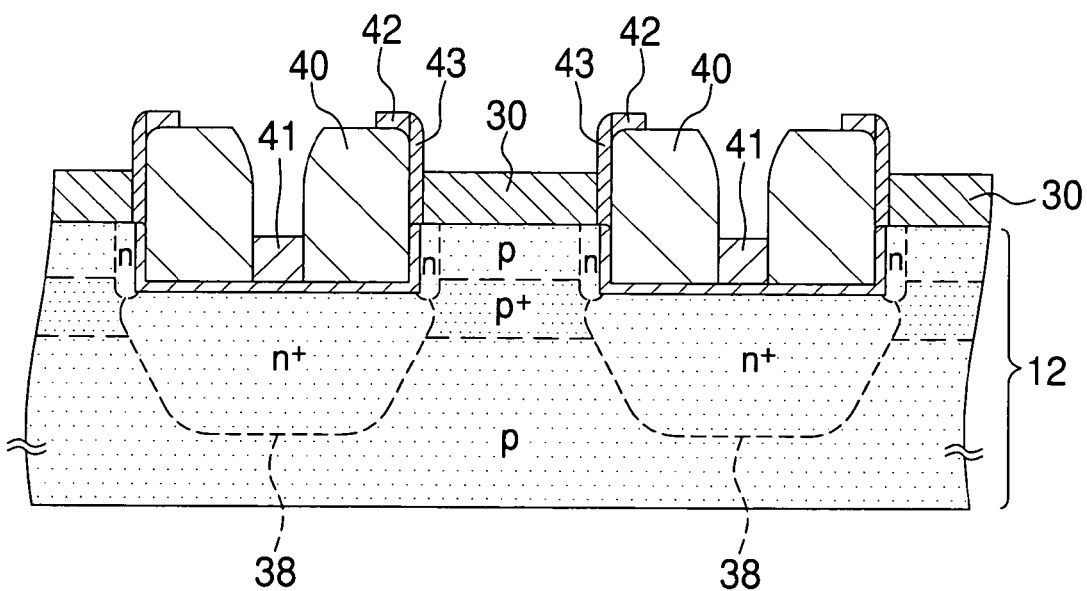

In FIG. 18A, the silicon oxide layers 41, 42 are subject to the anisotropic etching via the photo resist pattern 46, so the top and a part of the side of the floating gate conductive silicon 40 are exposed in the separation region. This anisotropic etching is carried out for a predetermined period. In the word line formation region, the silicon oxide layers 41, 42 corresponding to the opening 47 are covered with the control gate conductive silicon 44 and the silicon oxide layer 45 as the hard mask, so only the silicon oxide layer 45 is partially etched and the silicon oxide layers 41, 42 are not etched. Then, as shown in FIG. 18B, the photo resist pattern 46 is completely removed.

Figure 19:
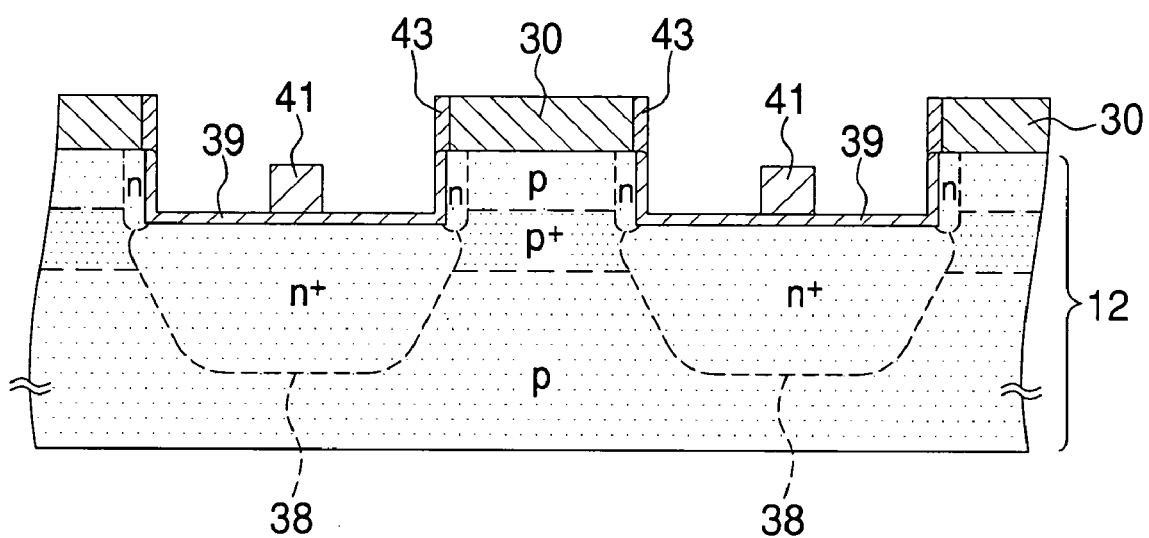

In FIG. 19, the floating gate conductive silicon 40 in the separation region is completely removed by etching process via the silicon oxide layer 45 in the word line formation region. In this etching process, the silicon oxide layers 41, 42 and 43 in the separation region are slightly etched. Thereafter, the whole surface of the semiconductor memory is covered with an insulator (e.g. silicon oxide) such that the insulator is filled in the separation region, so the memory cell array 10 is manufactured. The section of the word line formation region after manufacture is the same as FIG. 16B.

When the word lines are separated by the steps of FIGS. 17A through 19, the silicon oxide layers 30, 43 in the separation region are not etched at the same time since the area above the projection 13 is covered with the photo resist. Moreover, the silicon oxide layers 30, 43 in the word line formation region are not etched. Furthermore, the silicon oxide layer 39 that covers the side of the projection 13 in the word line formation region is not etched, either.

Through the processes of FIGS. 15A to 16A, or the processes of FIGS. 17A to 19, the silicon oxide layers 41, 42 in the separation region and the floating gate conductive silicon 40 can be etched by use of the silicon oxide layer 45 as the hard mask to divide the control gate conductive silicon 44 in the column direction. Therefore, the silicon oxide layers 41, 42 and the floating gate conductive silicon 40 can be formed by self-alignment in the column direction.

Figure 21:
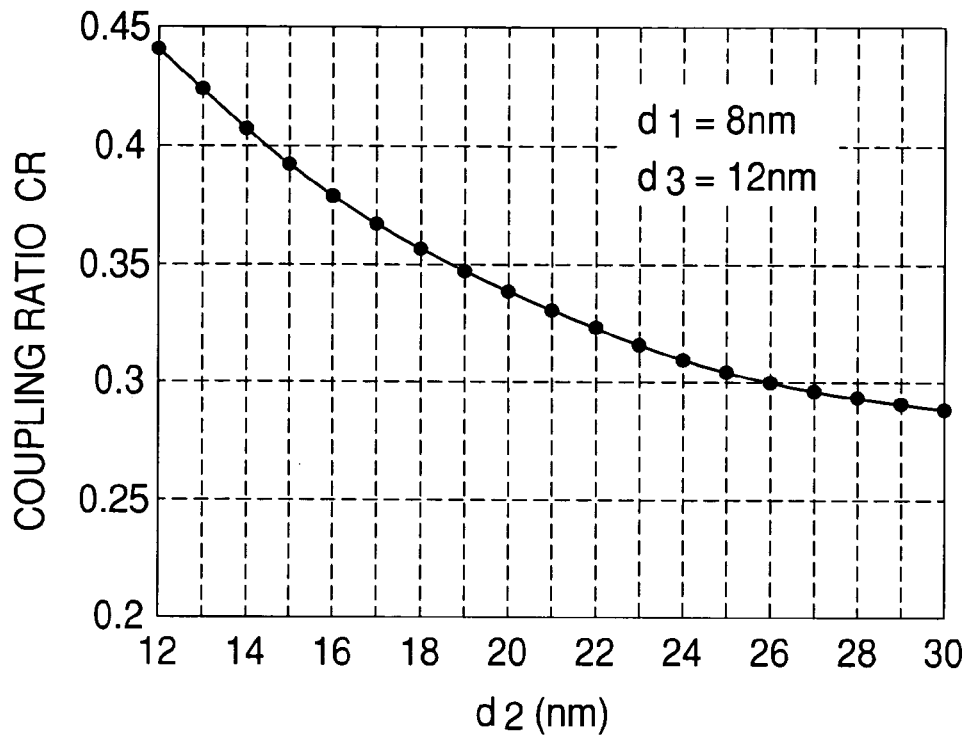
FIG. 21 is a graph showing an example of a coupling ratio in relation to a thickness $d_2$.

In the above described manufacture processes, the thickness $d_1$, $d_2$, $d_3$ and $d_4$ of the first to fourth insulation layers can be adjusted accordingly. The graph in FIG. 21 shows the simulated coupling ratio CR in relation to the thickness $d_2$ under the condition that the thickness $d_1$, and $d_3$ are 8 nm and 12 nm, respectively. As the thickness $d_2$ increases, the coupling ratio CR decreases because of decrease in the capacitance $C_{CF}$ between the floating gates FG1, FG2 and the control gate CG. A small coupling ratio CR can be achieved while keeping the small thickness of the third insulation layer to pass the electrons in the erasing operation, and thus it is possible to keep a low gate voltage Vg in the erasing operation. Moreover, the floating gates FG1, FG2 are strongly coupled to the source region and the drain region as the coupling ratio CR is small, so the data write speed in the writing operation becomes faster. Furthermore, the current window becomes large in the reading operation as the coupling ratio CR is small, so the data readout speed in the reading operation becomes faster as well.

The gate voltage Vg needed to control the channel formation can be changed by adjusting the thickness $d_4$ of the fourth insulation layer 19. When the thickness $d_4$ is small, it is possible to on/off the channel with low gate voltage Vg.

Figure 22:
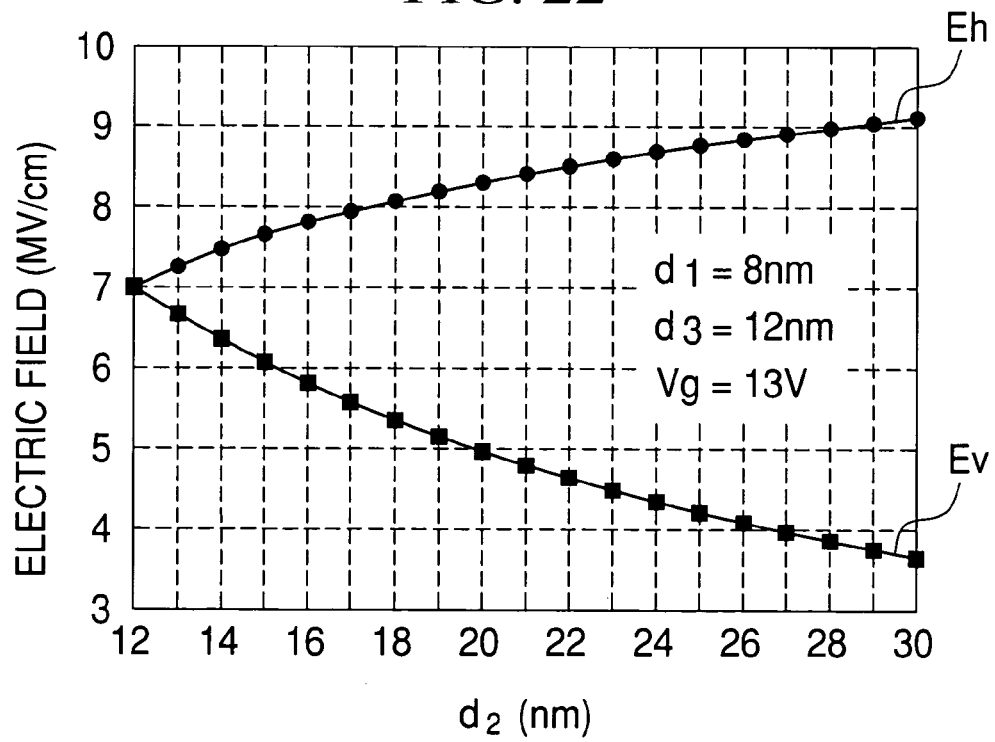
FIG. 22 is a graph showing an example of an electric field in relation to the thickness $d_2$ in an operation to erase information in the cell transistor.

The graph in FIG. 22 shows the simulated electric fields Ec, Eh in relation to the thickness $d_2$ under the condition that the thickness $d_1$ is 8 nm, the thickness $d_3$ is 12 nm, and the gate voltage Vg is 13V. The electric field Ev in FIG. 22 indicates the electric field in the second insulation layers 17a, 17b, and the electric field Eh indicates the electric field in the third insulation layers 18a, 18b. As the thickness $d_2$ increases, the electric field Eh increases while the electric field Ev decreases. Accordingly, as the thickness $d_2$ increases, the electrons to be discharged from the floating gates FG1, FG2 to the control gate CG in the erasing operation are more likely to pass the third insulation layer 18a, 18b.

Figure 23:
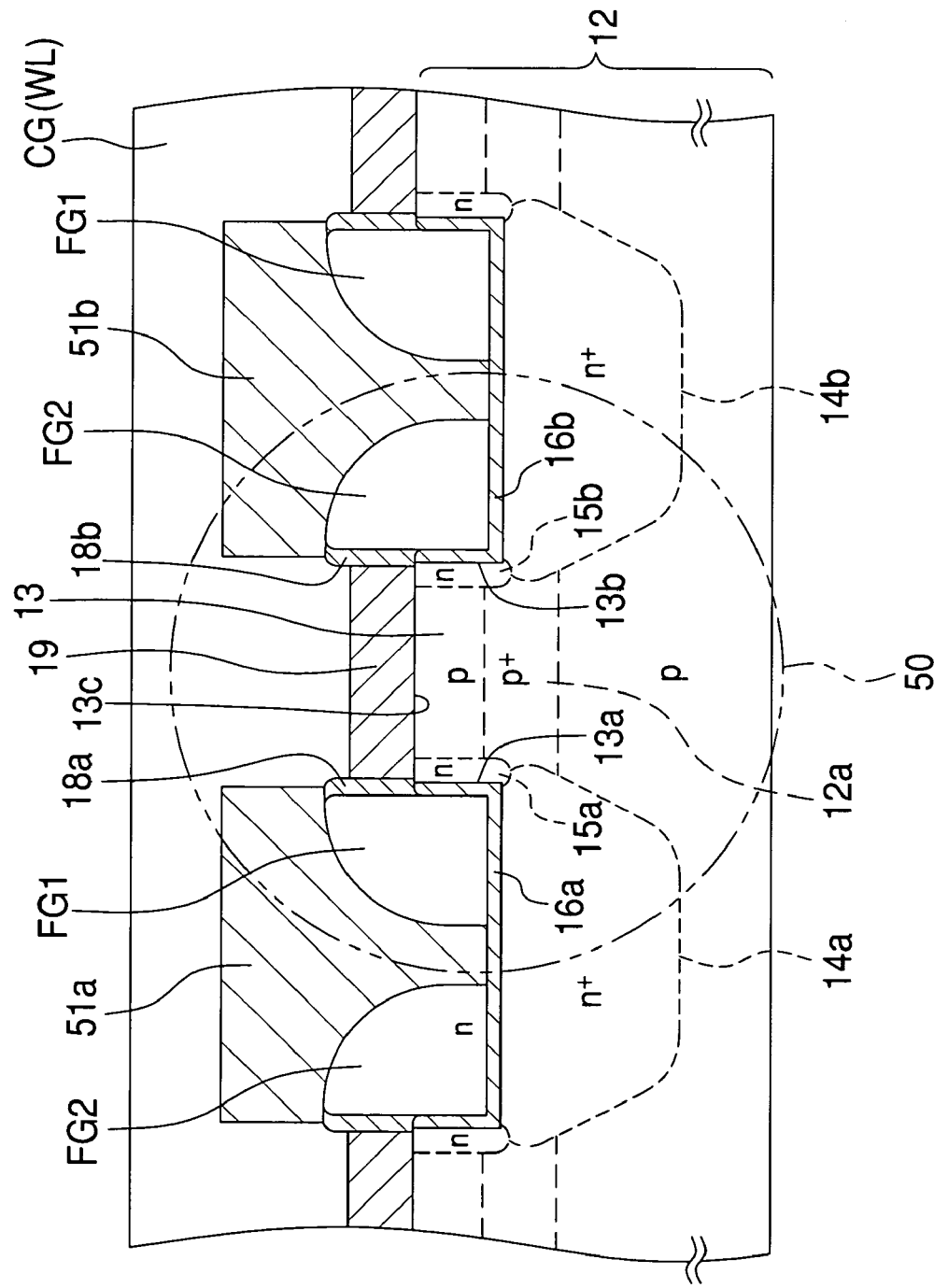
FIG. 23 is a cross section showing alternative embodiment of the cell transistor.

FIG. 23 shows the alternative embodiment of the cell transistor. The cell transistor 50 in this alternative embodiment has the same configuration as the cell transistor 11 according to the first embodiment (see FIG. 2), except the shape of the floating gates FG1, FG2 and the structure of the insulation layers to cover the floating gates FG1, FG2. Thus, in this alternative embodiment, the same reference numerals are affixed to the same structural parts as those in the cell transistor 11 for the purpose of omitting the description.

The floating gates FG1, FG2 of the cell transistor 50 in FIG. 23 have substantially fan-shaped section in the row direction, and the top of the floating gates FG1, FG2 are not flat. The flat bottom surfaces of the floating gates FG1, FG2 are faced to the diffusion region 14a, 14b via the first insulation layers 16a, 16b. The flat side surfaces of the floating gates FG1, FG2 face the side surfaces 13a, 13b of the projection 13 via the first insulation layers 16a, 16b, and face the control gate CG via the third insulation layers 18a, 18b.

The curved floating gates FG1, FG2 face the floating gates FG1, FG2 of adjacent cell transistors 50 via the insulators 51a, 51b. Between the top of the floating gates FG1, FG2 and the control gate CG, there are insulators 51a, 51b. The gap between the floating gates FG1, FG2 and the control gate CG is much larger than the thickness of the third insulation layer 18a, 18b. In the cell transistor 50, the height of the projection (trench) below the control gate CG is larger than that of the cell transistor 11 of FIG. 2.

The writing, reading and erasing operations of the cell transistor 50 are the same as those of the cell transistor 11 according to the first embodiment (see FIGS. 4A, 4B and 5). In the erasing operation of the cell transistor 50, most electrons in the floating gates FG1, FG2 are discharged to the control gate CG through the third insulation layers 18a, 18b having smaller thickness. Especially, the electrons are mainly discharged through the area between the corners of the floating gates FG1, FG2 and the corner of the control gate CG, in which the electric field is concentrated.

In the cell transistor 50, the capacitance $C_{CF}$ is much smaller than the capacitance $C_{SF}$, so the coupling ratio CR of the cell transistor 50 is smaller than that of the cell transistor 11 of FIG. 2. Therefore, the cell transistor 50 exhibits better properties of data writing, reading and erasing, compared with the cell transistor 11 of FIG. 2.

Figure 24A:
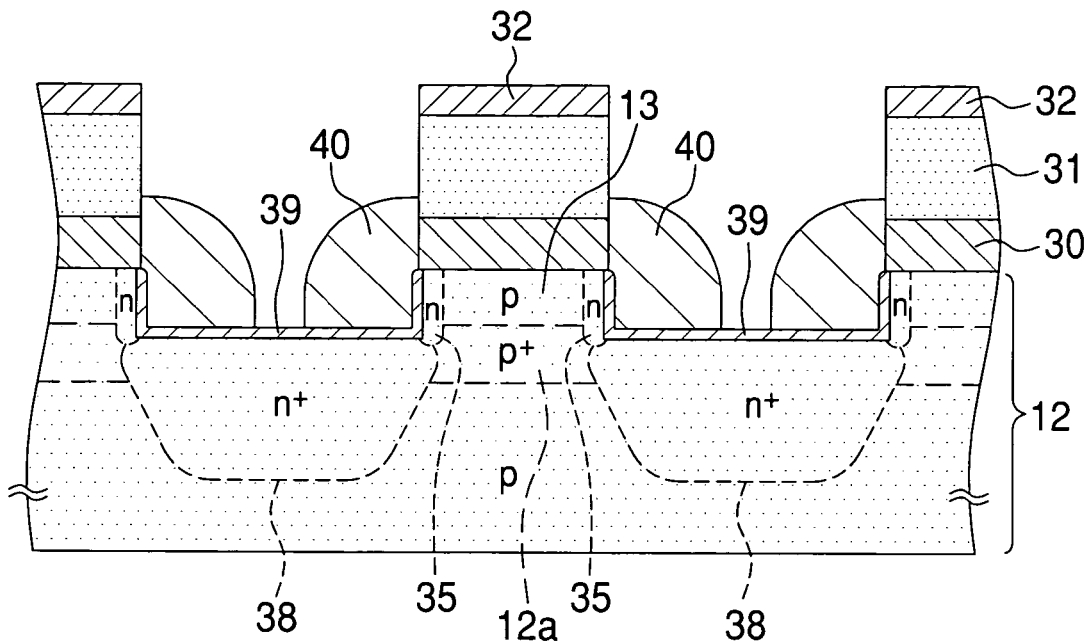
FIGS. 24A to 29 are sections demonstrating a series of steps to manufacture the cell transistor of FIG. 23.

Referring to FIGS. 24A through 29, the series of processes to manufacture the memory cell array 10 having the cell transistors 50 of FIG. 23 is described. FIGS. 24A through 29 are sections of the cell formation region of the memory cell array taken on a line in the row direction. The processes to obtain the structure shown in FIG. 24A are the same as the processes shown in FIGS. 6A through 10B.

In FIG. 24A, the same structural parts as those in the previous embodiment has the same reference numerals. The processes to manufacture such structural parts are the same as those in the previous embodiment, so the detailed explanation of the process is omitted. It is to be noted that the silicon nitride layer 31 of the cell transistor 50 is thicker than that of the cell transistor 11 of FIG. 2, and the thickness thereof is about 40 nm. In addition, the etched depth of the floating gate conductive silicon 40 by anisotropic etching process is larger than that of the cell transistor 11 according to the first embodiment. In other words, the upper end of the conductive silicon 40 is lower than the top of the silicon nitride layer 31 and higher than the bottom surface of the silicon nitride layer 31.

Figure 24B:
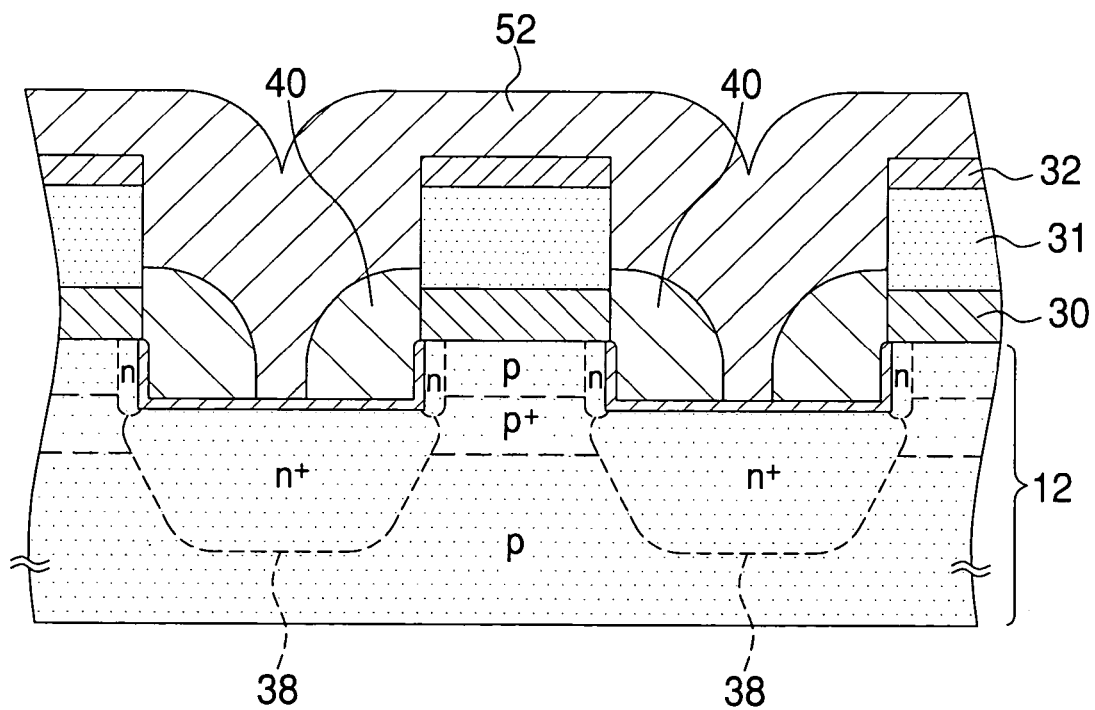

Referring to FIG. 24B, a high density plasma (HDP) oxide layer 52 with the thickness of about 100 nm is formed over the whole surface by the CVD process. Then, in FIG. 25A, the whole surface having the HDP oxide layer 52 is subject to CMP process to flatten its surface. This CMP process is carried out until the silicon oxide layer 32 is completely removed and the silicon nitride layer 31 is exposed. The conductive silicon 40 is not polished.

Figure 25A:
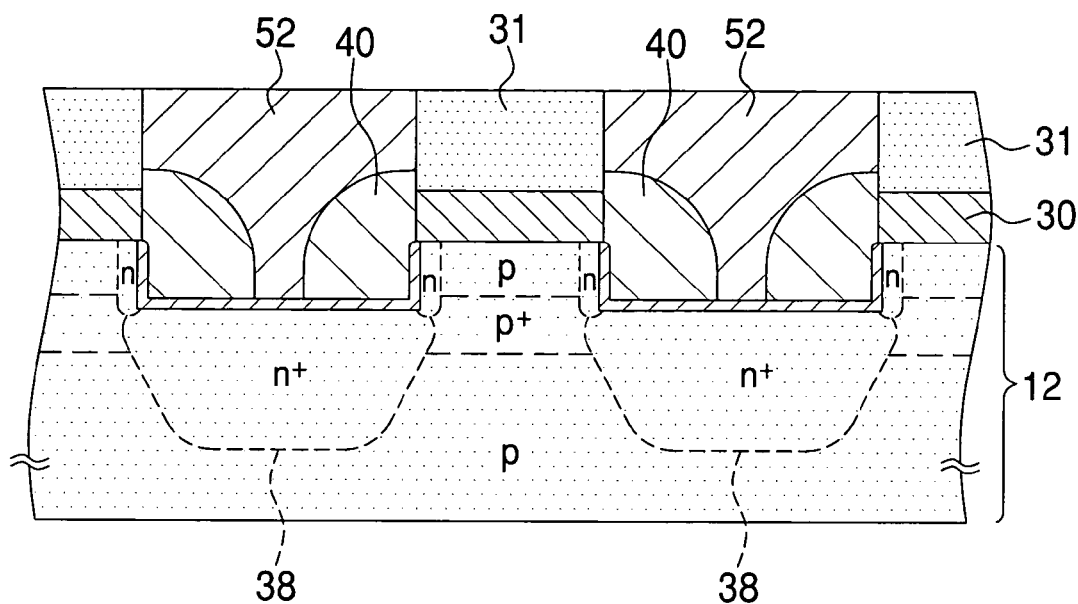
Figure 25B:
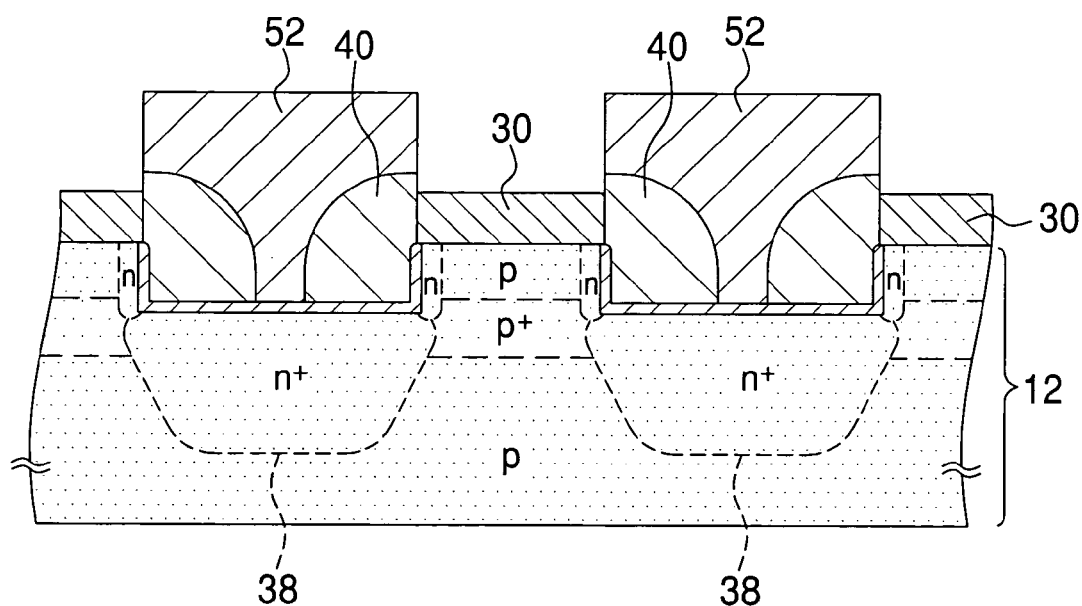

As shown in FIG. 25B, the silicon nitride layer 31 used as the stopper in the CMP process is removed by the wet etching with a phosphoric solution, so the top surface of the silicon oxide layer 30 and a part of the side surfaces of the conductive silicon 40 are exposed. As the phosphoric solution, 85% $H_3PO_4$ at 180° C. is used for selective etching of the silicon nitride layer 31. In the wet etching process, the silicon oxide layer 52 and the conductive silicon 40 are hardly etched.

Figure 26A:
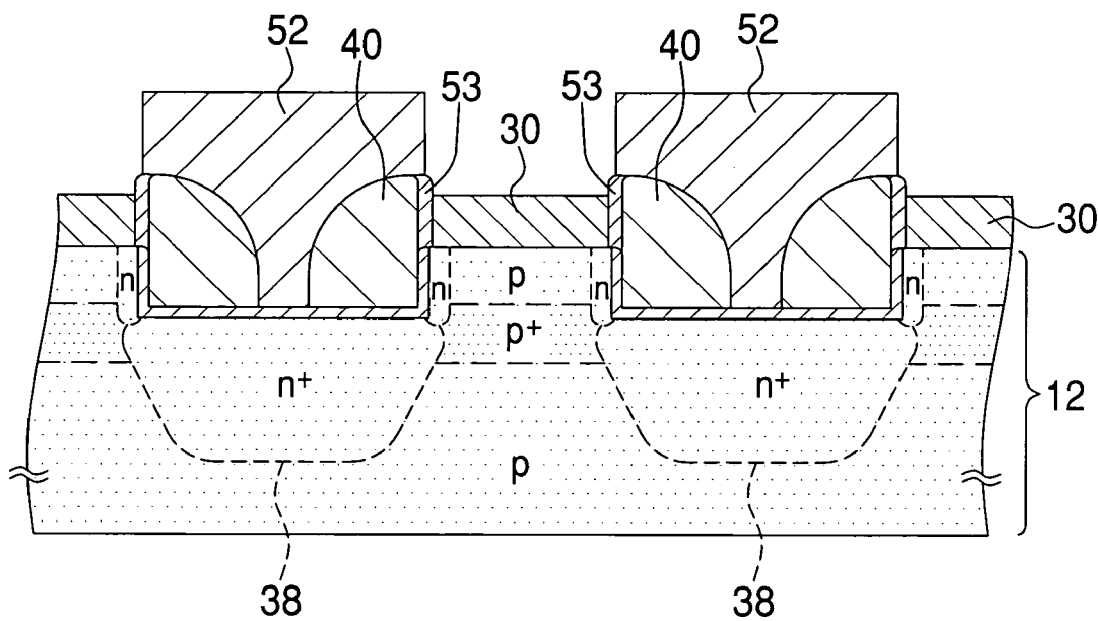
Figure 26B:
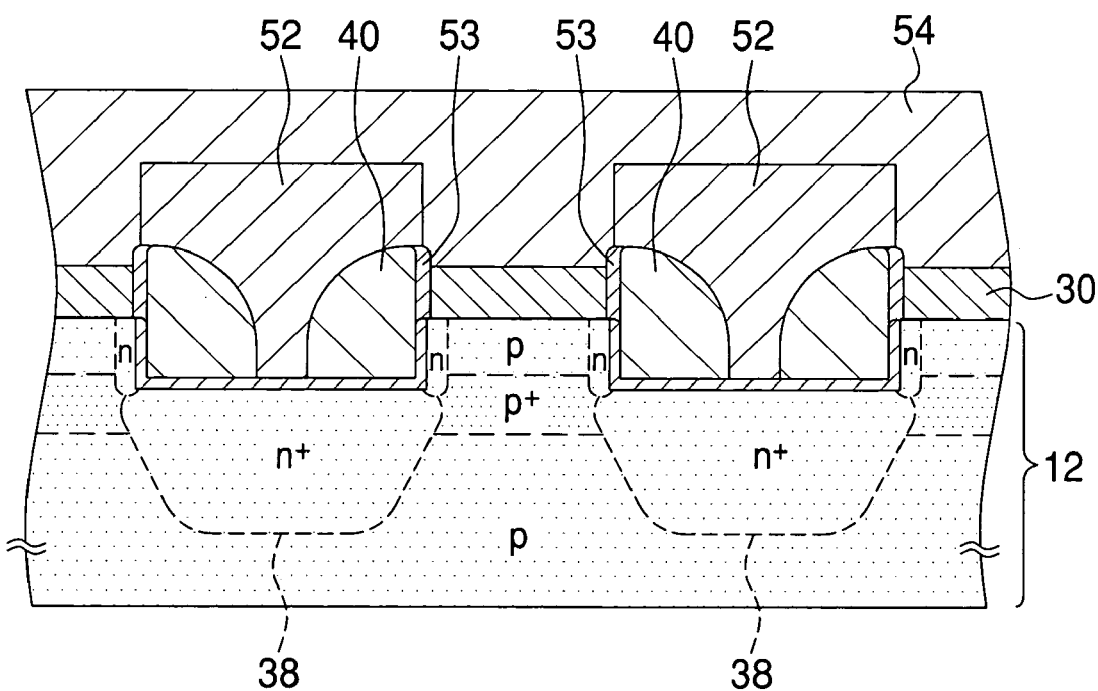

In FIG. 26A, the plasma oxidization (radical oxidization) process is carried out to form a silicon oxide layer 53 in the exposed side surface of the conductive silicon 40. The thickness of the silicon oxide layer 53 is about 12 nm. By the plasma oxidization process, the side of the conductive silicon 40 covered with the silicon oxide layer 30 is also oxidized, so the side surfaces of the conductive silicon 40 becomes substantially flat. Because of plasma oxidization, the upper end of the side surface of the conductive silicon 40 becomes round. It is possible to carry out plasma nitridation (radical nitridation) process to shallowly nitrify the surface of the oxide layers for the purpose of decreasing current leakage. Thereafter, as shown in FIG. 26B, the CVD process is carried out to layer the control gate conductive silicon (amorphous silicon or poly silicon) 54 on the whole surface, and then the top of the control gate conductive silicon 54 is flattened by the CMP process.

Figure 27A:
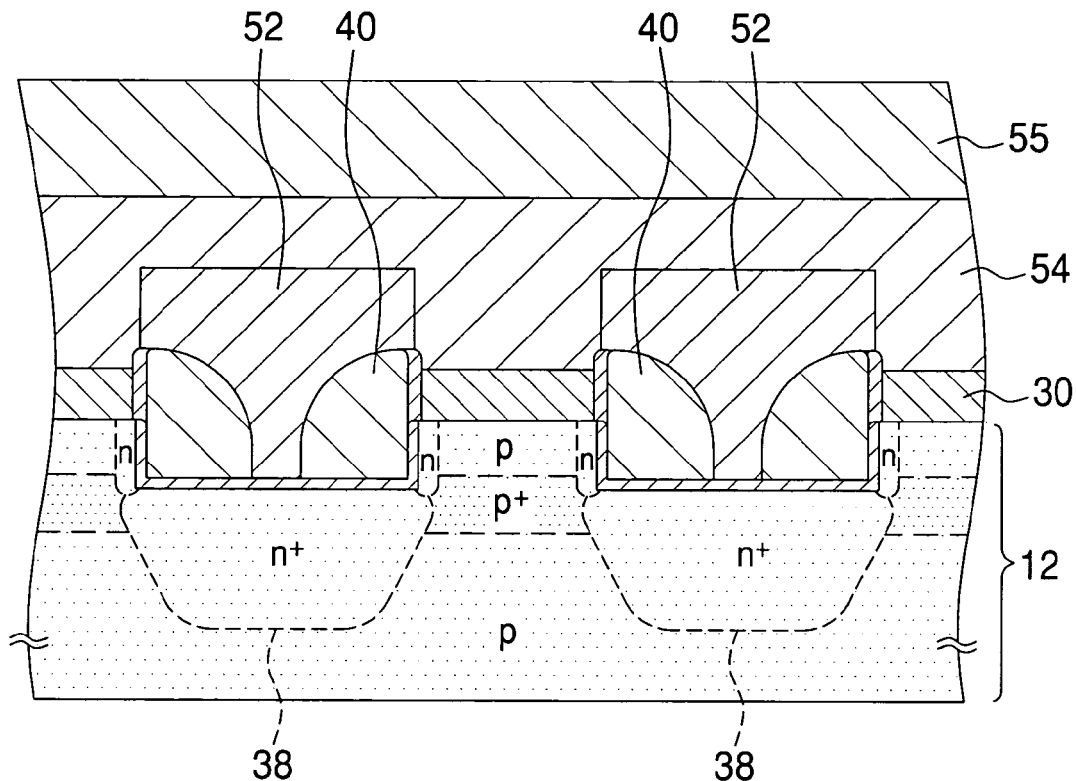

In FIG. 27A, the CVD process is carried out to form a silicon oxide layer 55 on the conductive silicon 54. A silicon nitride layer may be formed instead of the silicon oxide layer 55. Although not illustrated in the drawing, a photo resist is coated on the silicon oxide layer 55, and the pattern exposure and the development are carried out to form stripe-shaped openings in the photo resist. The openings correspond to the separation region between the word lines WL (see FIG. 1).

Figure 27B:
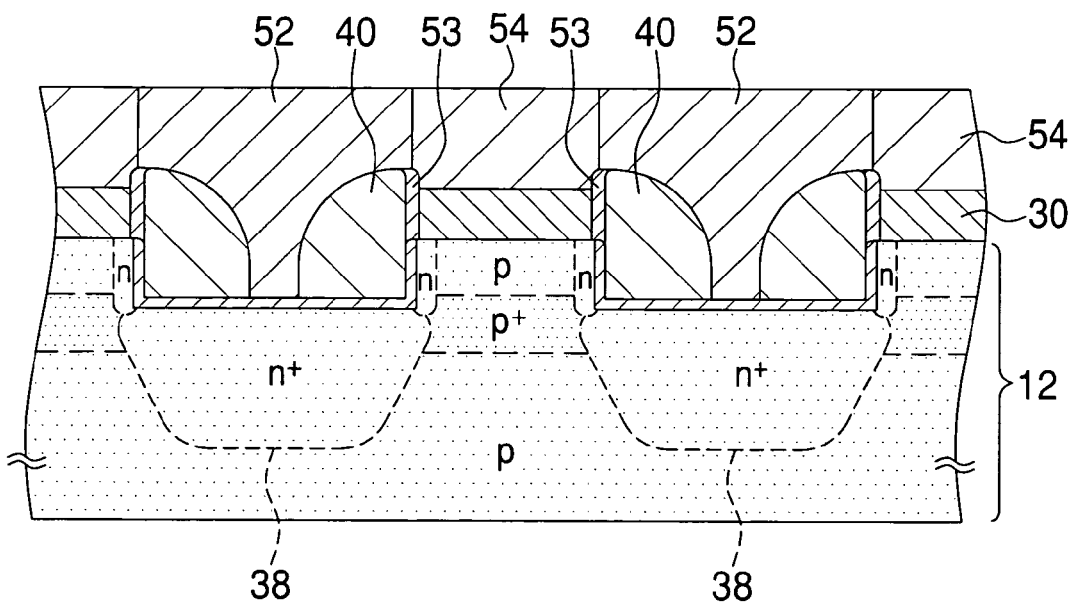

In FIGS. 27B through 28B, a section taken on the line B-B of FIG. 1 (section of the separation region) is illustrated, and the layered materials in the word line formation region behind the separation region is not illustrated in the drawings. Referring to FIG. 27B, the silicon oxide layer 55 in the separation region (exposed through the openings) is removed by the etching process, and the photo resist is completely removed. Then, the conductive silicon 54 in the separation region is subject to anisotropic etching process via the silicon oxide layer 55 in the word line formation region as the hard mask. This anisotropic etching process stops at the time when the silicon oxide layer 52 is exposed.

Figure 28A:
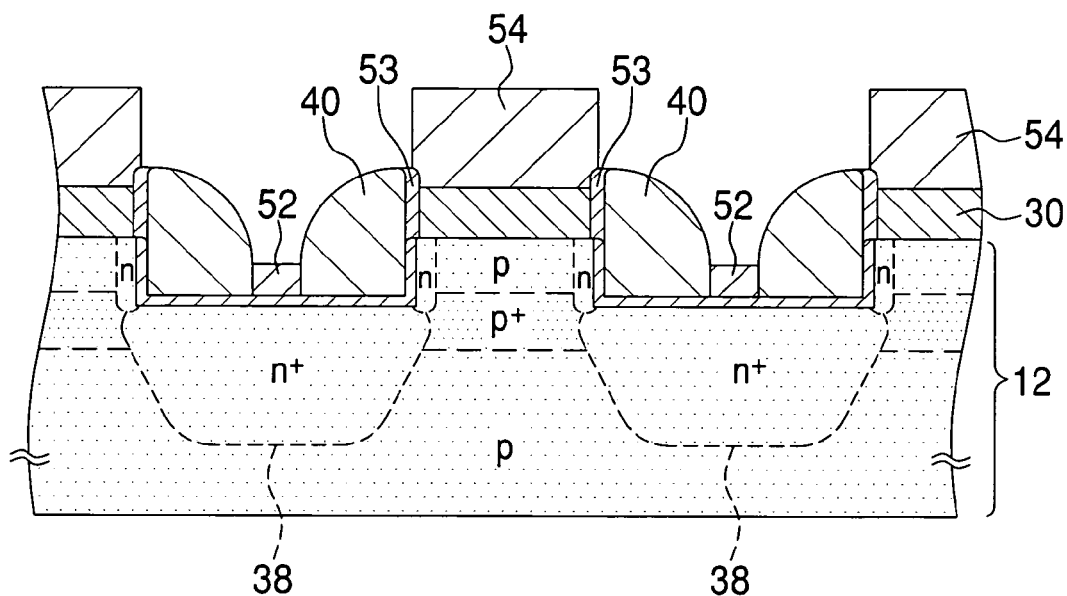

In FIG. 28A, the silicon oxide layer 52 in the separation region is subject to the etching process via the silicon oxide layer 55 in the word line formation region as the hard mask, so the curved surface of the conductive silicon 40 is partially exposed. This etching process to the silicon oxide layer 52 is carried out for a predetermined period. The area of the projection 13 is covered with the control gate conductive silicon 54, so the silicon oxide layers 30 in the separation region and the word line formation region are not etched. For the purpose of increasing the durability of the conductive silicon 54 as the hard mask, the conductive silicon 54 may be subject to plasma nitridation process prior to this etching process.

Figure 28B:
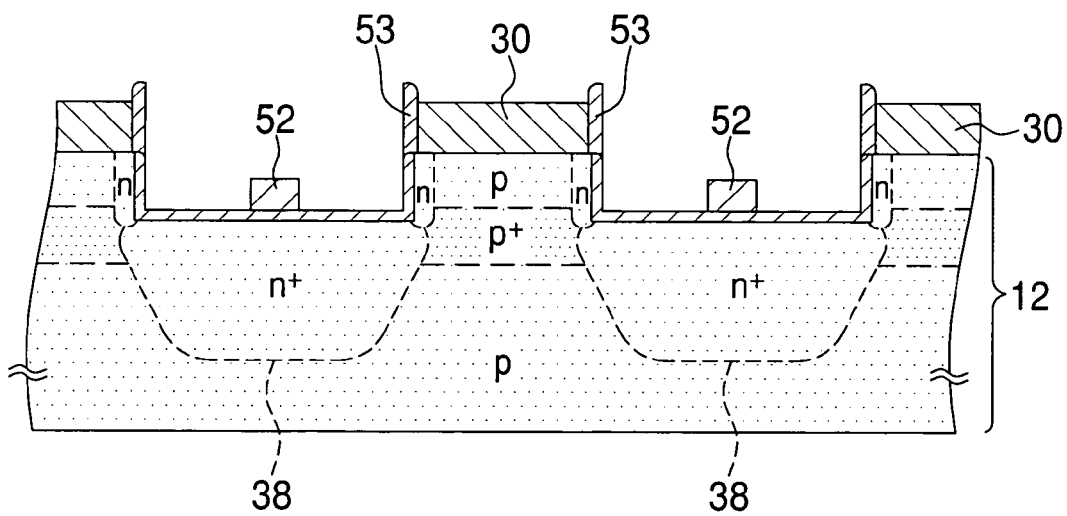

In FIG. 28B, the floating gate conductive silicon 40 and the control gate conductive silicon 54 in the separation region are completely removed by the anisotropic etching process via the silicon oxide layer in the word line formation region as the hard mask. Then, the whole surface of the semiconductor memory is covered with an insulator (e.g. silicon oxide) such that the insulator is filled in the separation region, so the memory cell array 10 having the cell transistors 50 is manufactured.

The conductive silicon 40, 54 is divided in the column direction by the separation region. The conductive silicon 40 after division serves as the floating gates FG1, FG2, and the conductive silicon 54 serves as the word lines WL (control gates CG).

Figure 29:
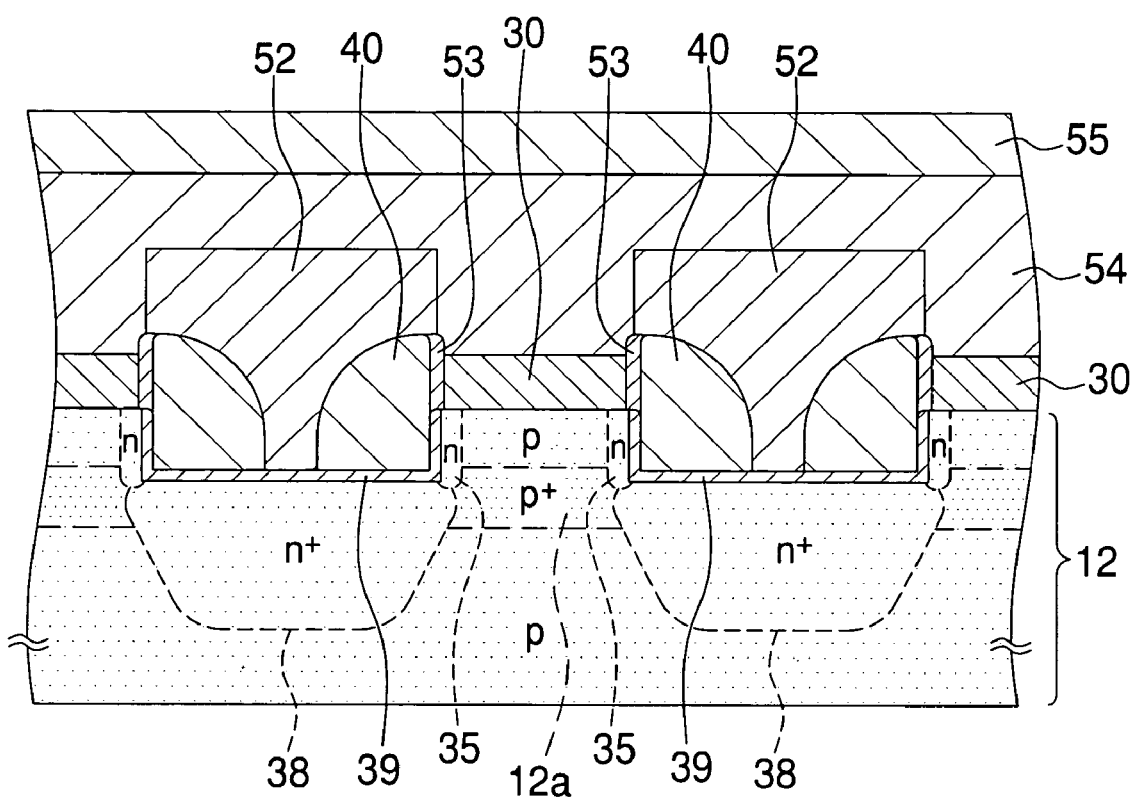

FIG. 29 shows the section of the manufactured memory cell array 10 taken on the line A-A in FIG. 1. The silicon oxide layer 39 corresponds to the first insulation layers 16a, 16b in FIG. 2. The silicon oxide layer 53 corresponds to the third insulation layers 18a, 18b, and the silicon oxide layer 30 corresponds to the fourth insulation layer 19 in FIG. 2. The silicon insulation layer 52 corresponds to the insulators 51a, 51b. The diffusion region 38 corresponds to the diffusion regions 14a, 14b, and the N type region 35 corresponds to the n-type region 15a, 15b in FIG. 2.

In the above described manufacture processes, the word lines are divided (the word line and the floating gates are formed) in the processes shown in FIGS. 27B to 28B. Instead, the word lines can be divided by the processes shown in FIGS. 30A through 32.

Figure 30A:
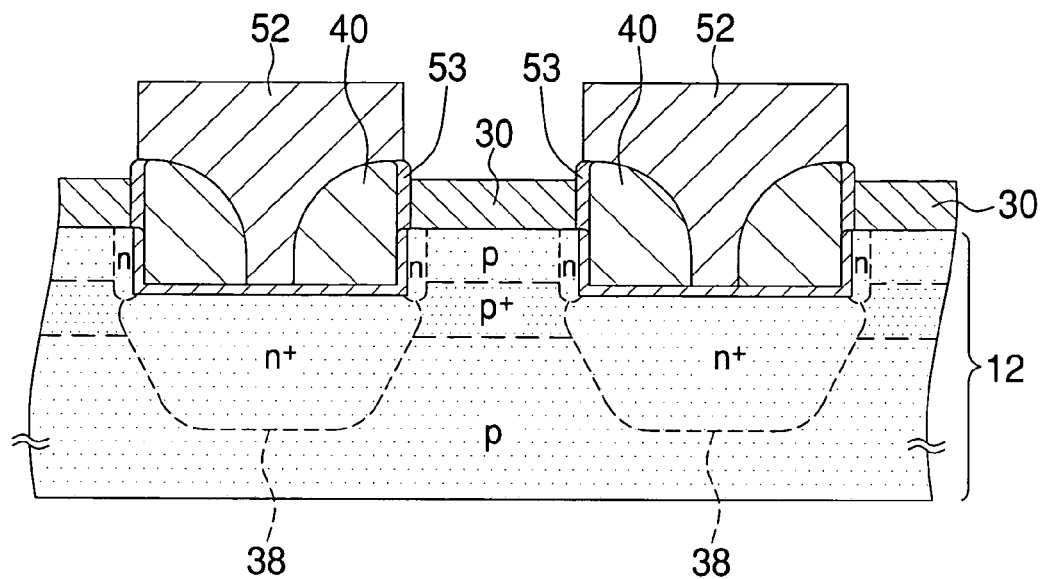
FIG. 30A through FIG. 32 are sections demonstrating an alternative of a word line separation step.

After the structure of FIG. 27A is formed, the silicon oxide layer 55 exposed through the openings (separation regions) formed by the resist pattern is removed by the etching process, as shown in FIG. 30A. Then, the photo resist is completely removed, and the control gate conductive silicon 54 in the separation region is completely removed by the anisotropic etching process via the silicon oxide layer 45 as the hard mask in the word line formation region. Thereby, the silicon oxide layer 30 on the projection 13 is exposed. The conductive silicon 54 is divided in the column direction, and the divided conductive silicon 54 constitutes the word lines WL (control gates CG).

Figure 30B:
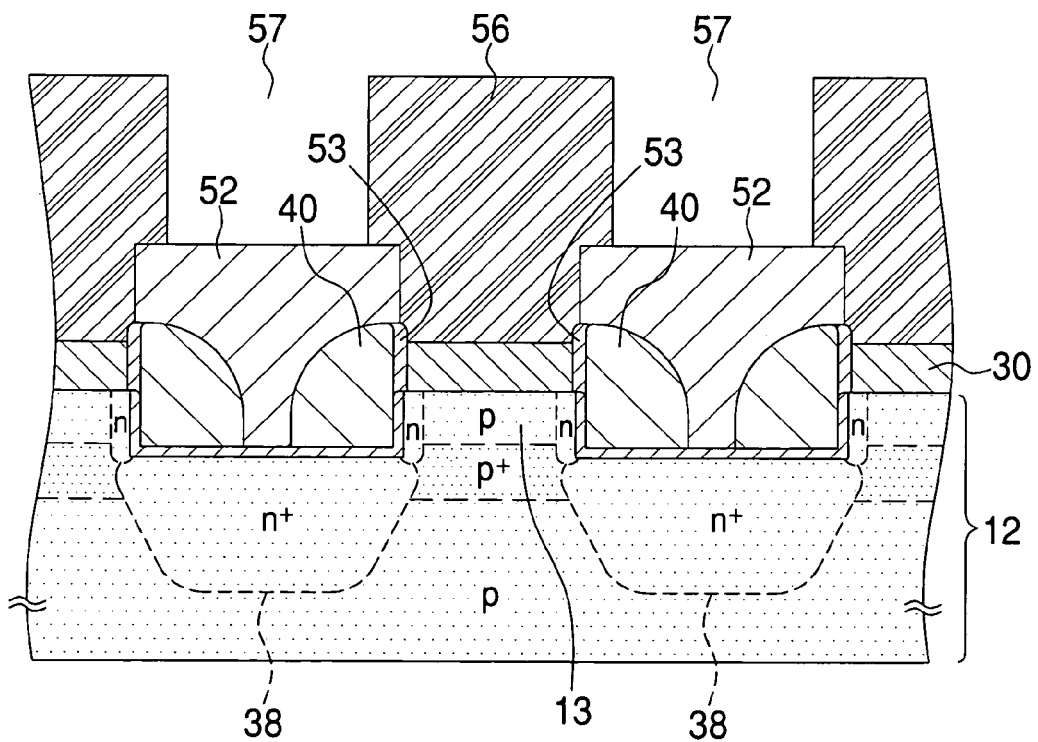

In FIG. 30B, a photo resist is coated on the whole surface, and the pattern exposure and the development processes are carried out to form a photo resist pattern 56 having stripe-shaped openings 57, similar to the openings 47 in FIG. 17B, along the column direction. In the separation region, the photo resist pattern 56 covers the silicon oxide layer 30 on the projection 13, the silicon oxide layer 53 on the side of the floating gate conductive silicon 40, and a part of the silicon oxide layer 52 on the top of the floating gate conductive silicon 40. In the word line formation region, the stripes in the photo resist pattern 56 extend in the column direction such that the photo resist pattern 56 covers the silicon oxide layer 55 as the hard mask that are formed on the control gate conductive silicon 54. In the separation region, the silicon oxide layer 52 on the top of the floating gate conductive silicon 40 is partially exposed through the openings 57. In the word line formation region, the silicon oxide layer 55 as the hard mask is exposed through the openings 57.

Figure 31A:
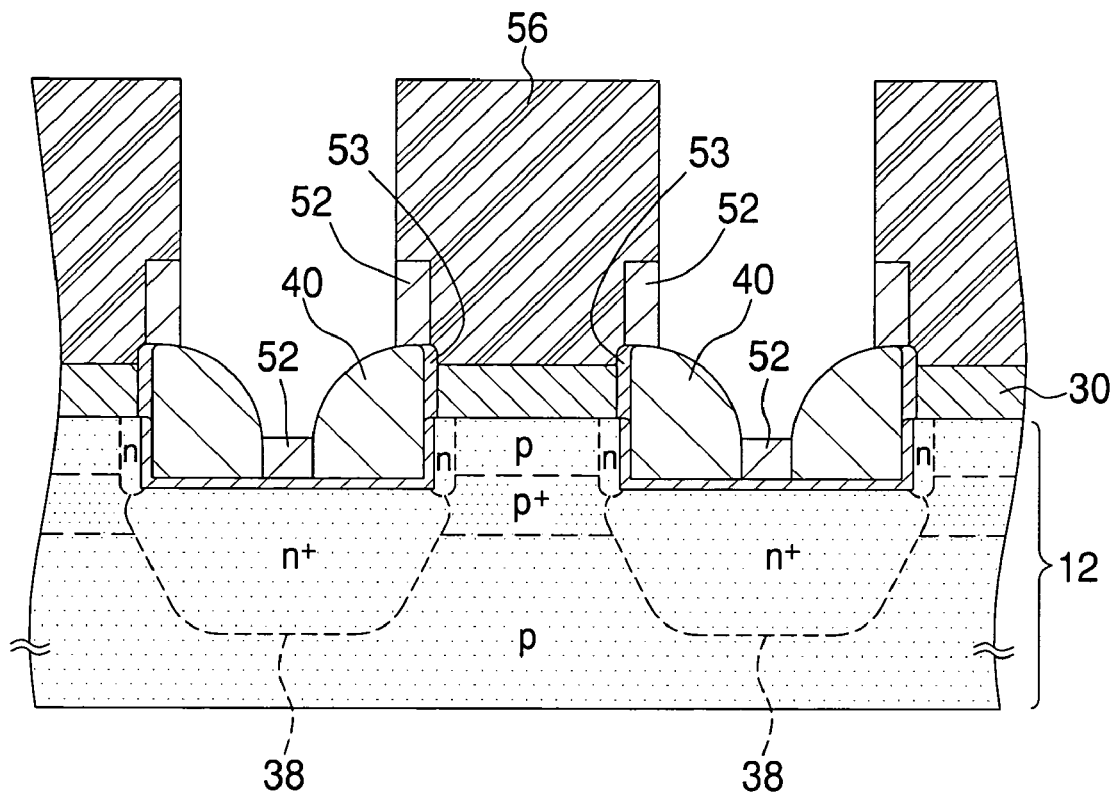
Figure 31B:
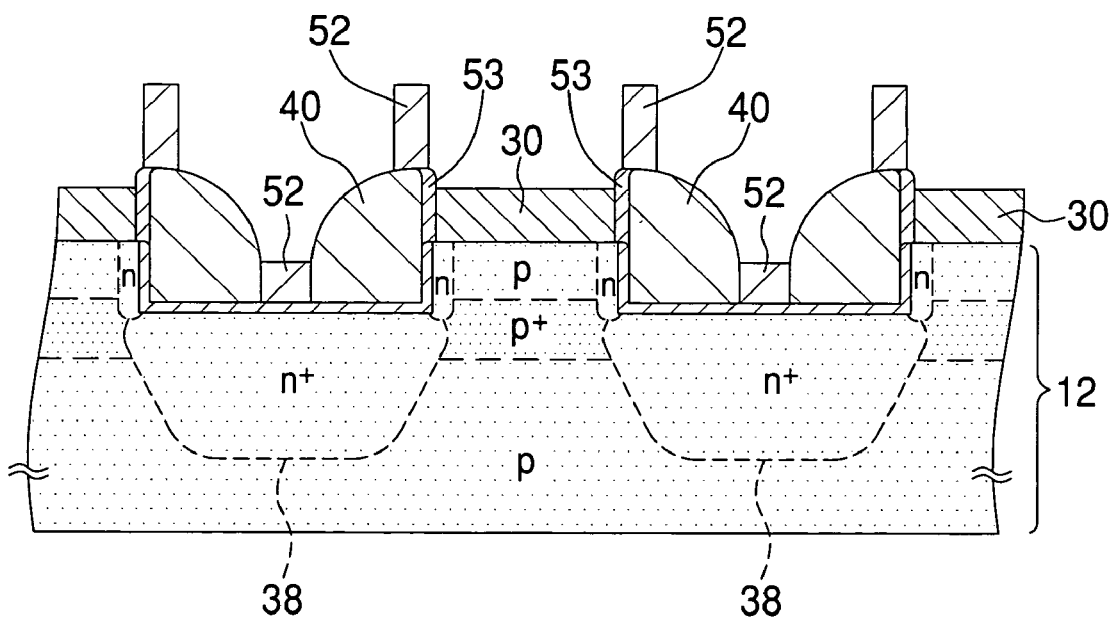

Referring to FIG. 31A, the anisotropic etching process is carried out to the silicon oxide layer 52 via the photo resist pattern 56 as the mask, so the floating gate conductive silicon 40 is partially exposed in the separation region. This anisotropic etching process is carried out for a predetermined time. In the word line formation region, the silicon oxide layer 52 is covered with the control gate conductive silicon 54 and the silicon oxide layer 55 as the hard mask, the silicon oxide layer 55 is partially etched in this anisotropic etching process. Thus, the silicon oxide layer 52 in the word line formation region is hardly etched. Then, the photo resist pattern 56 is completely removed, as shown in FIG. 31B.

Figure 32:
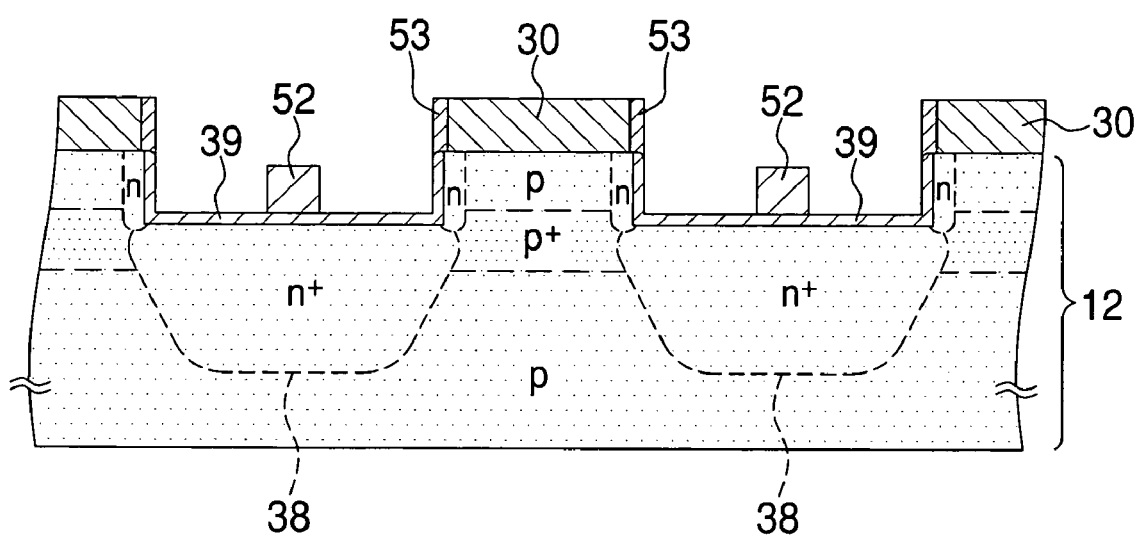

In FIG. 32, the floating gate conductive silicon 40 in the separation region is completely removed by the etching process via the silicon oxide layer 55 as the hard mask in the word line formation region. At that time, the silicon oxide layer 52 in the separation region is slightly etched. Then, the whole surface of the semiconductor memory is covered with an insulator (e.g. silicon oxide) such that the insulator is filled in the separation region, so the memory cell array 10 having the cell transistors 50 is manufactured. The section of the word line formation region is the same as that shown in FIG. 29.

When the word lines are divided by the processes of FIGS. 30A through 32, the silicon oxide layers 30, 53 in the separation region and the word line formation region are not etched in the etching process to the silicon oxide layer, because the upper area of the projection 13 is covered with the photo resist 56. In addition, the silicon oxide layer 39 to cover the side surface of the projection 13 in the word line formation region is not etched.

In the processes of FIGS. 27B through 28B or the processes of FIGS. 30A through 32, the silicon oxide layer 52 and the floating gate conductive silicon 40 in the separation region are etched by use of the silicon oxide layer 55 as the hard mask in dividing the control gate conductive silicon 54 in the column direction. Thus, it is possible to form the silicon oxide layer 52 and the floating gate conductive silicon 40 by self-alignment.

Figure 33:
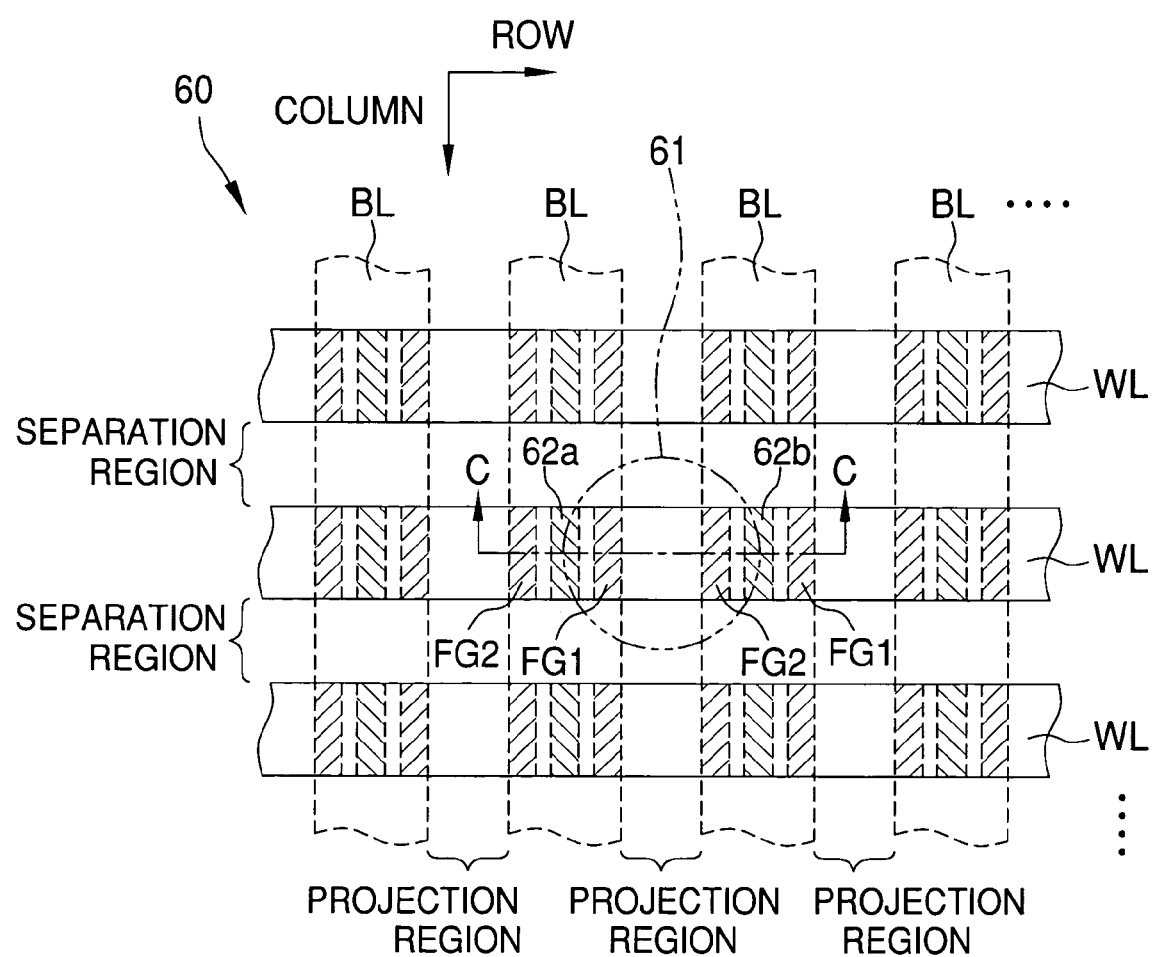
FIG. 33 is a plan view showing another alternative embodiment of the memory cell array.

FIG. 33 shows a memory cell array 60 according to another alternative embodiment. The memory cell array 60 in FIG. 33 has the VGA configuration in which plural bit lines (BL) and plural word lines (WL) are intersected, as described in the memory cell array 10 of FIG. 1. The bit line has a diffusion region that extends in a column direction. The word line has conductive silicon that extends in a row direction. The floating gates FG1, FG2 are provided in the intersected area of the word line WL and the bit line BL.

The memory cell array 60 is in the form of two-dimensional matrix having plural cell transistors 61. A single cell transistor 61 is illustrated in the circled area of FIG. 33. There are conductors between the floating gates FG1, FG2 of the cell transistor 61 and the floating gates FG1, FG2 of adjacent cell transistor 61 in the row direction.

Figure 34:
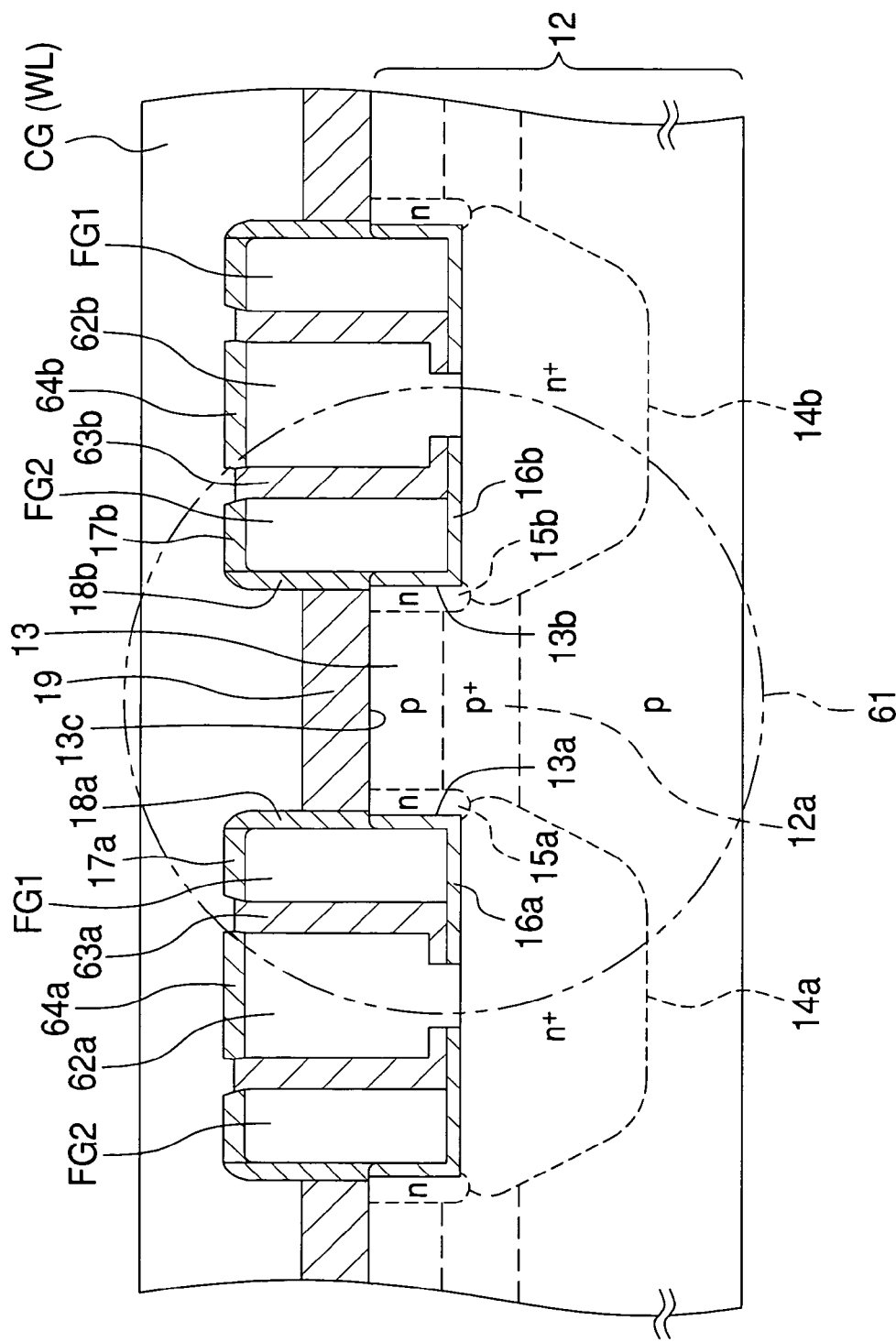
FIG. 34 is a cross section of a cell transistor taken on the line C-C of FIG. 33.

FIG. 34 is the section of the cell transistor 61 taken on the line C-C. Thus, in the following embodiment, the same reference numerals are affixed to the same structural parts as those in the cell transistor 11 for the purpose of omitting the description.

The conductors 62*a*, 62*b* of the cell transistor 61 are formed of conductive silicon (amorphous silicon or poly silicon), and are electrically connected to the diffusion regions 14*a*, 14*b* that serve as the source and the drain. The potential of the conductors 62*a*, 62*b* is the same as that of the diffusion regions 14*a*, 14*b*. There are fifth insulation layers 63*a*, 63*b* between the side of the conductors 62*a*, 62*b* and the floating gates FG1, FG2, respectively. Between the tops of the conductors 62*a*, 62*b* and the control gate CG, sixth insulation layers 64*a*, 64*b* are provided.

The writing, reading and erasing operations of the cell transistor 60 are the same as those of the cell transistor 11 according to the previous embodiment (see FIGS. 4A, 4B and 5).

In the cell transistor 60, the floating gates FG1, FG2 are capacitively coupled to the source and the drain (diffusion regions 14*a*, 14*b*) via the first insulation layers 16*a*, 16*b* and the fifth insulation layers 63*a*, 63*b*. The capacitance between the floating gates FG1, FG2 and the source and the drain is much larger than the capacitance between the floating gates FG1, FG2 and the control gate CG, so the coupling ratio CR of the cell transistor 60 is much smaller than that of the cell transistor 11 of FIG. 2. Therefore, the cell transistor 60 exhibits better properties of data writing, reading and erasing, compared with the cell transistor 11 of FIG. 2.

The electrons accumulated in the floating gates FG1, FG2 of adjacent cell transistors 61 generates electric field, but the conductors 62*a*, 62*b* can shield the floating gates FG1, FG2 from such electric field of adjacent cell transistors 61. Thus, it is possible to prevent so-called crosstalk caused by such electric field.

Figure 35A:
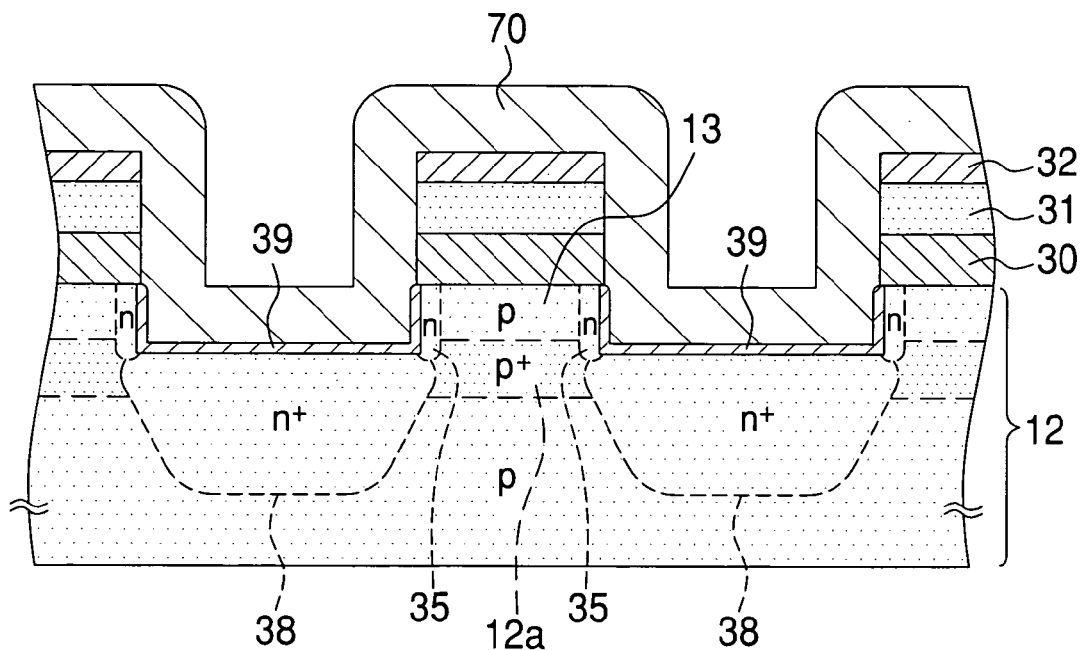
FIGS. 35A to 40B are sections demonstrating a series of processes to manufacture the cell transistor of FIG. 34.
Figure 35B:
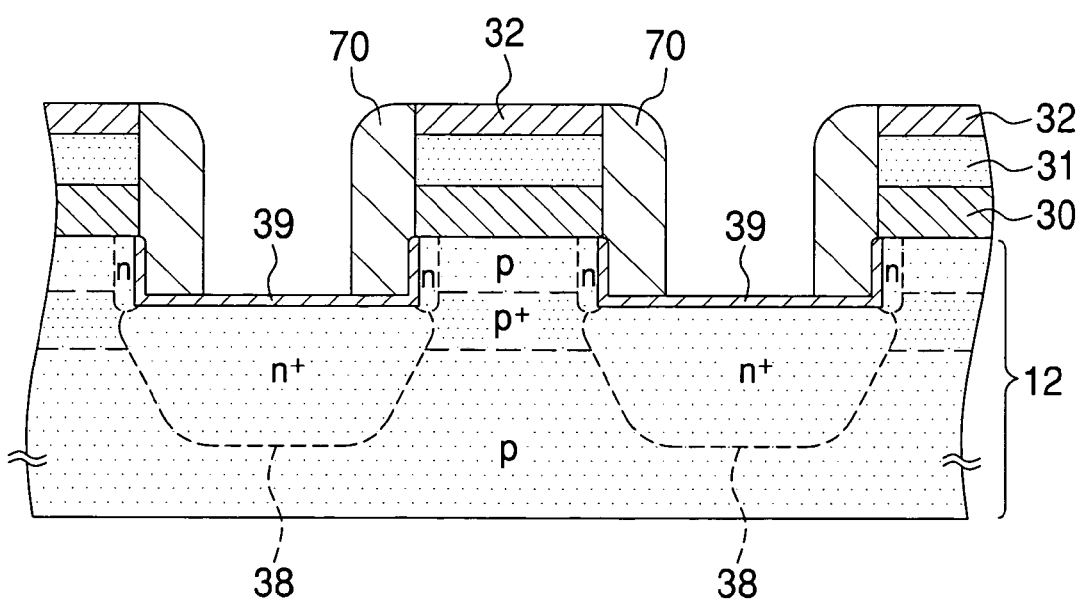

Referring to FIGS. 35A through 40B, the series of processes to manufacture the memory cell array 60 having the cell transistors 61 is described. FIGS. 35A through 40B are sections of the cell formation region of the memory cell array 60 taken on a line in the row direction. The processes to obtain the structure shown in FIG. 35A are the same as the processes of FIGS. 6A through 10A.

After the process shown in FIG. 10A, a floating gate conductive silicon (amorphous silicon or poly silicon) 70 is layered on the whole surface, as shown in FIG. 35A. The thickness of the conductive silicon 70 is about 25 nm. Then, in FIG. 35B, the conductive silicon 70 is subject to the anisotropic etching in the vertical direction to expose the silicon oxide layer 32 and a part of the silicon oxide layer 39 in the trench area. Thereby, the conductive silicon 70 are divided in the row direction, and remained in both sides of the projection 13.

Figure 36A:
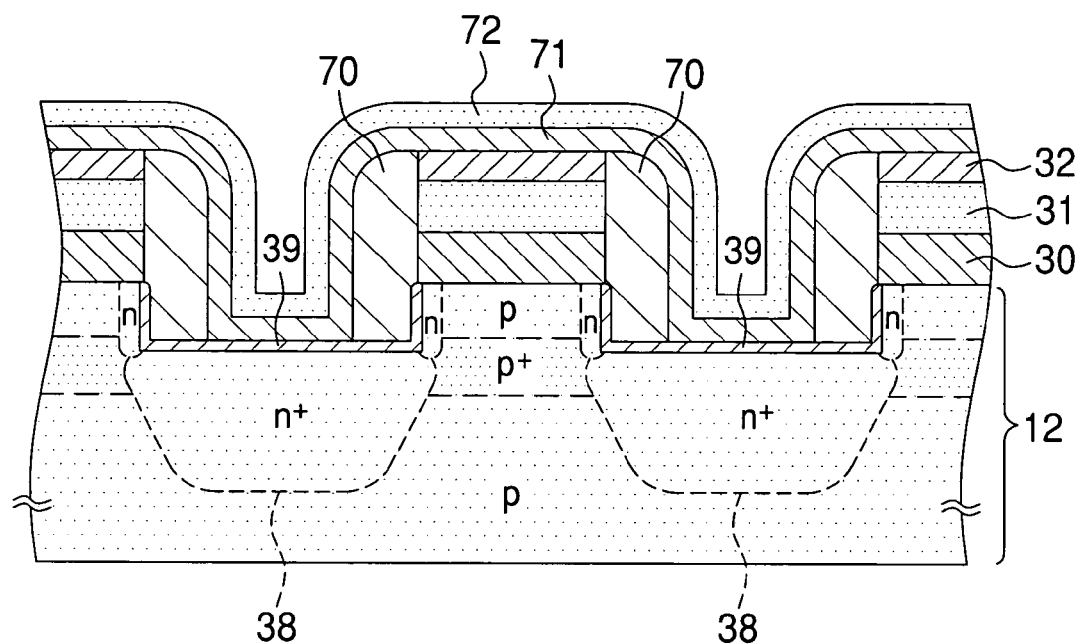

In FIG. 36A, an ONO layer 71 with the thickness of about 16 nm is layered on the whole surface. The ONO layer 71 comprises a silicon oxide layer, a silicon nitride layer and a silicon oxide layer. A silicon nitride layer 72 with the thickness of about 20 nm is formed on the ONO layer 71. A silicon oxide layer may be formed instead of the ONO layer 71.

Figure 36B:
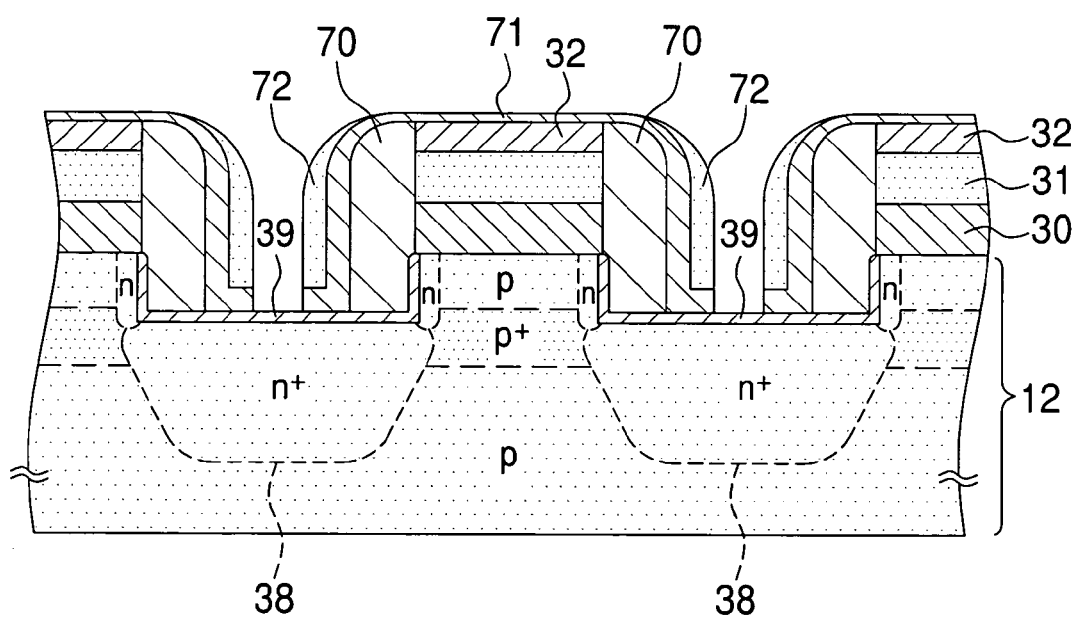

Referring to FIG. 36B, the anisotropic etching in the vertical direction is carried out to remove a part of the silicon nitride layer 72 and the ONO layer 71 in the trench region, so the silicon oxide layer 39 is partially exposed. At that time, it is possible that the silicon oxide layers 32, 39 are partially etched, but etching these layers 32, 39 does not cause any problem, which will be described later.

Figure 37A:
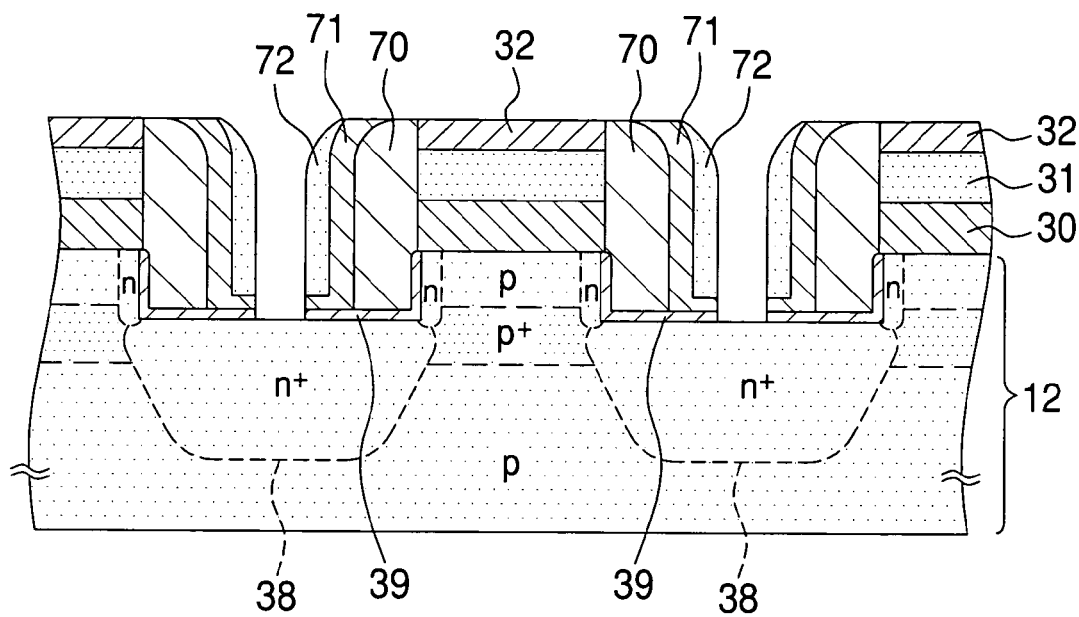
Figure 37B:
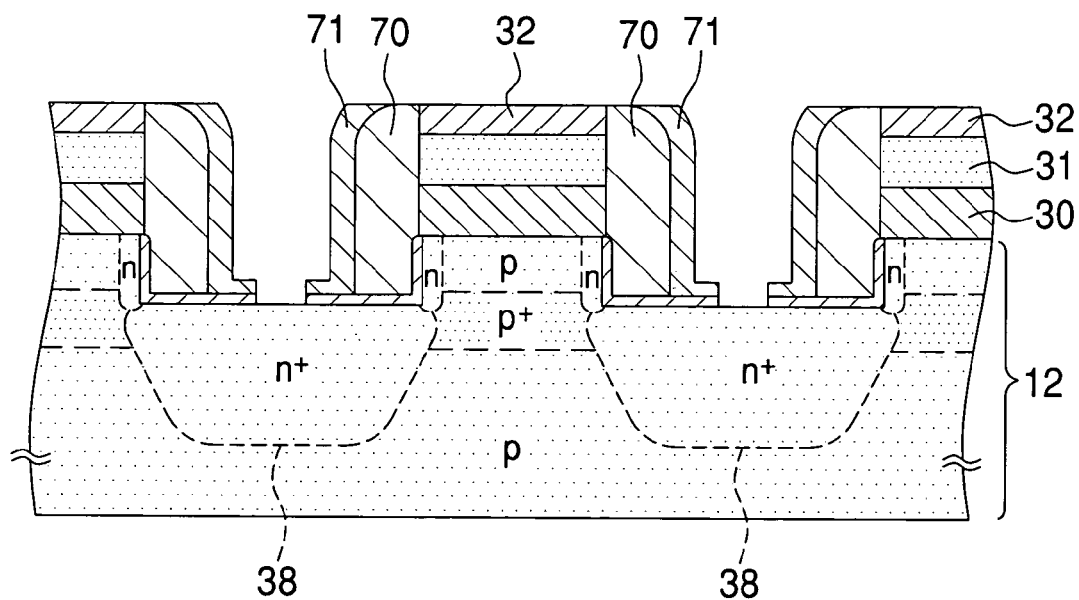

In FIG. 37A, the silicon oxide layer 39 exposed in the trench region is removed by the etching process via the remaining silicon nitride layer 72 as the etching mask, so the diffusion region 38 is partially exposed. Then, as shown in FIG. 37B, the silicon nitride layer 72 is completely removed by the wet etching process. The silicon nitride layer 72 is selectively etched by use of the phosphoric solution that is explained in the previous embodiment.

Figure 38A:
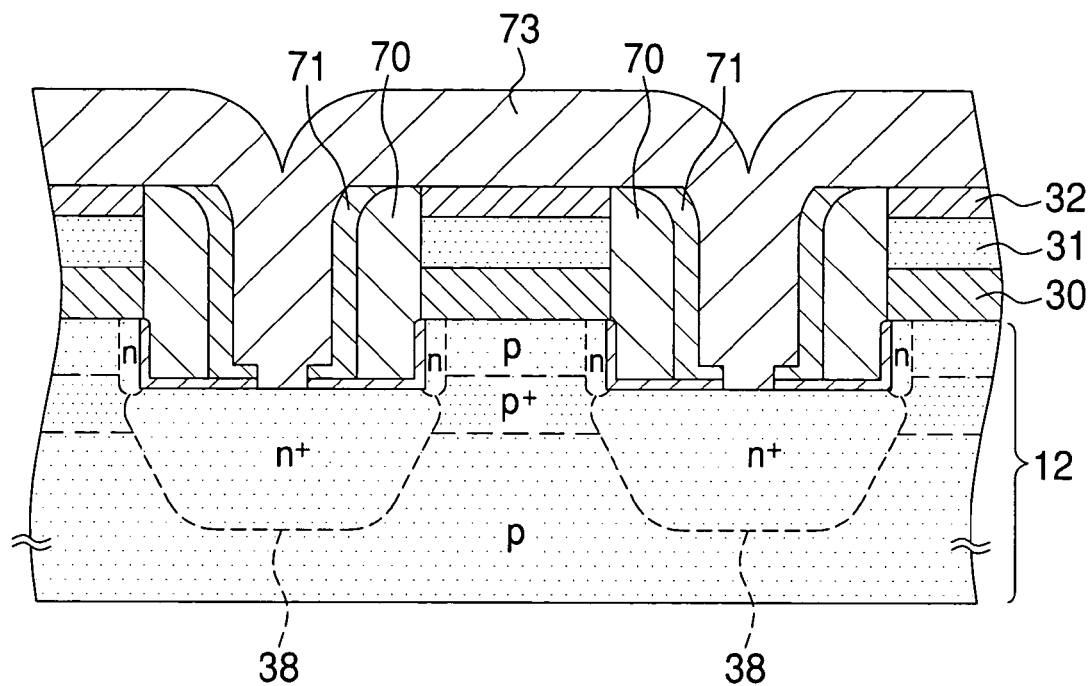

In FIG. 38A, a control gate conductive silicon (amorphous silicon or poly silicon) 73 is formed on the whole surface by CVD process such that the trench region is filled with the conductive silicon 73. It is possible that the conductive silicon 73 is electrically connected to the conductive silicon 70 in the area where the ONO layer 71 is removed, but the conductive silicon 73 in this region is removed by the CMP process that will be explained.

Figure 38B:
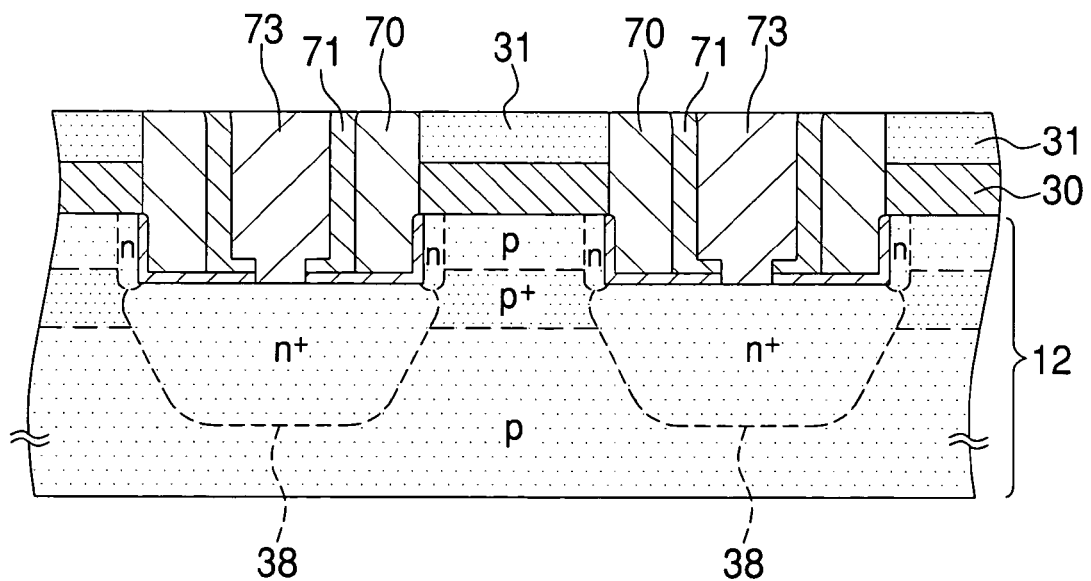

Referring to FIG. 38B, the whole surface having the conductive silicon 73 is flattened by the CMP process. This CMP process is carried out until the silicon oxide layer 32 is completely removed and the silicon nitride layer 31 is exposed. At that time, the conductive silicon 73 remaining in the trench region is electrically connected to the diffusion region 38, and faces the conductive silicon 70 via the ONO layer 71. The upper part of the conductive silicon 70 is etched so that the conductive silicon 70 has a substantially rectangular section in the row direction.

Figure 39A:
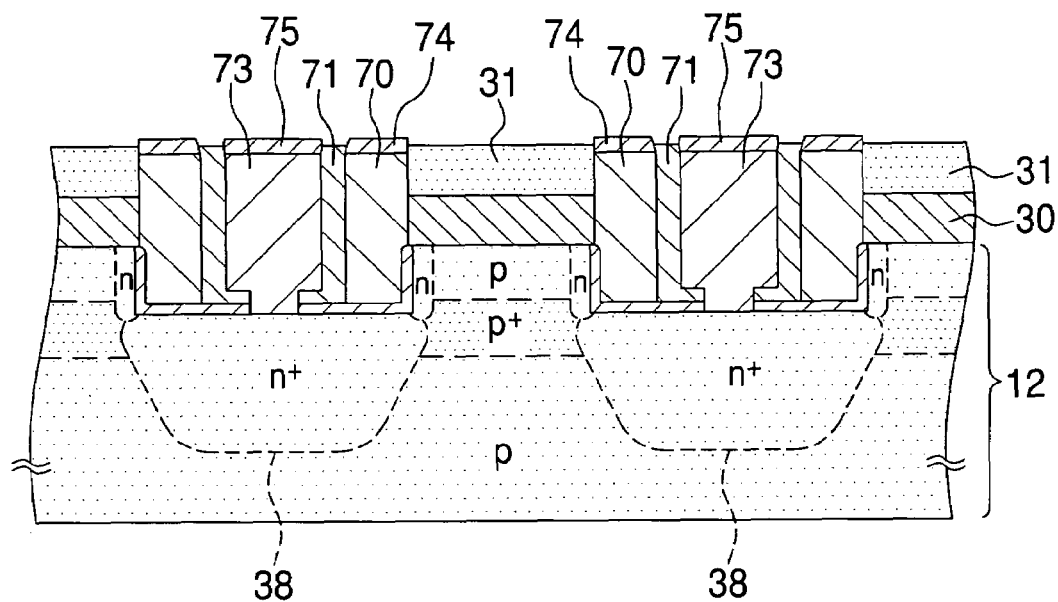
Figure 39B:
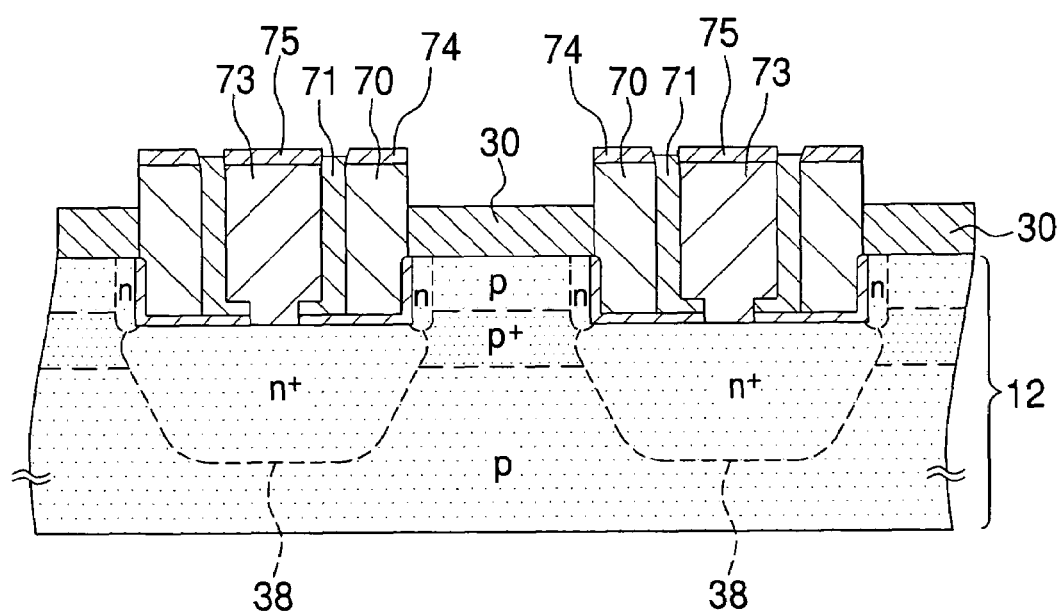

In FIG. 39A, the thermal oxidization process is carried out to form silicon oxide layers 74, 75 in the top of the conductive silicon 70, 73, respectively. The thickness of the silicon oxide layers 74, 75 is about 22 nm. Then, as shown in FIG. 39B, the silicon nitride layer 31 as the stopper in the CMP process is removed by the wet etching process, so the silicon oxide layer 30 and a part of the side of the conductive silicon 70 are exposed. By the wet etching process using the above described phosphoric solution, the silicon nitride layer 31 is selectively etched.

Figure 40A:
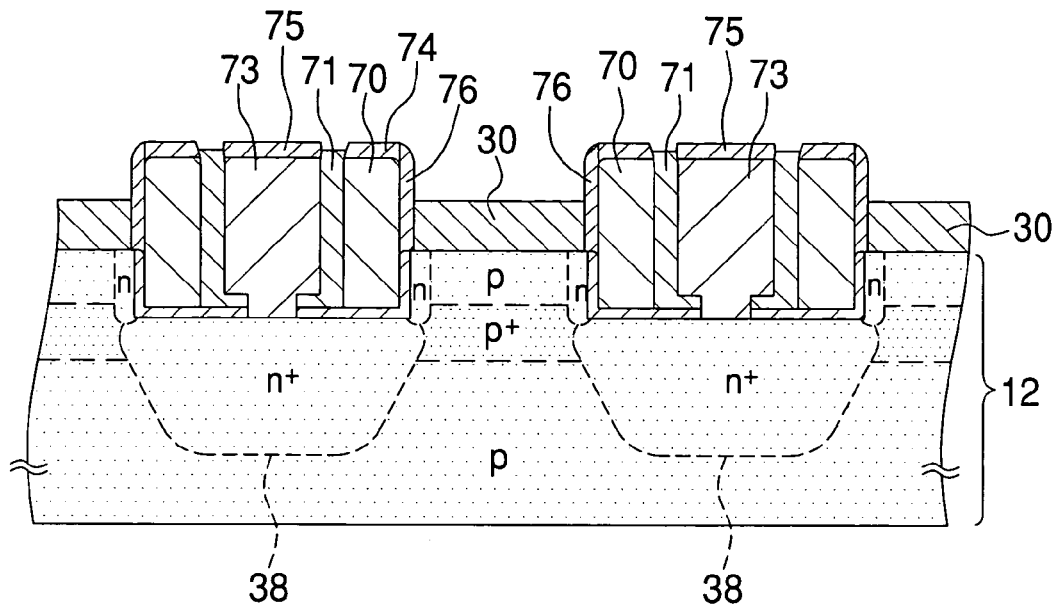

Referring to FIG. 40A, a silicon oxide layer 76 with the thickness of about 12 nm is formed on the side of the exposed conductive silicon 70 by the plasma oxidization (radical oxidization) process. The part of the conductive silicon 70 covered with the silicon oxide layer 30 is also oxidized. Because of the plasma oxidization process, the upper end portion of the side of the conductive silicon 70 becomes slightly round. For the purpose of decreasing current leakage, it is possible to carry out the plasma nitridation (radical nitridation) process to shallowly nitrify the surfaces of the silicon oxide layers.

Figure 40B:
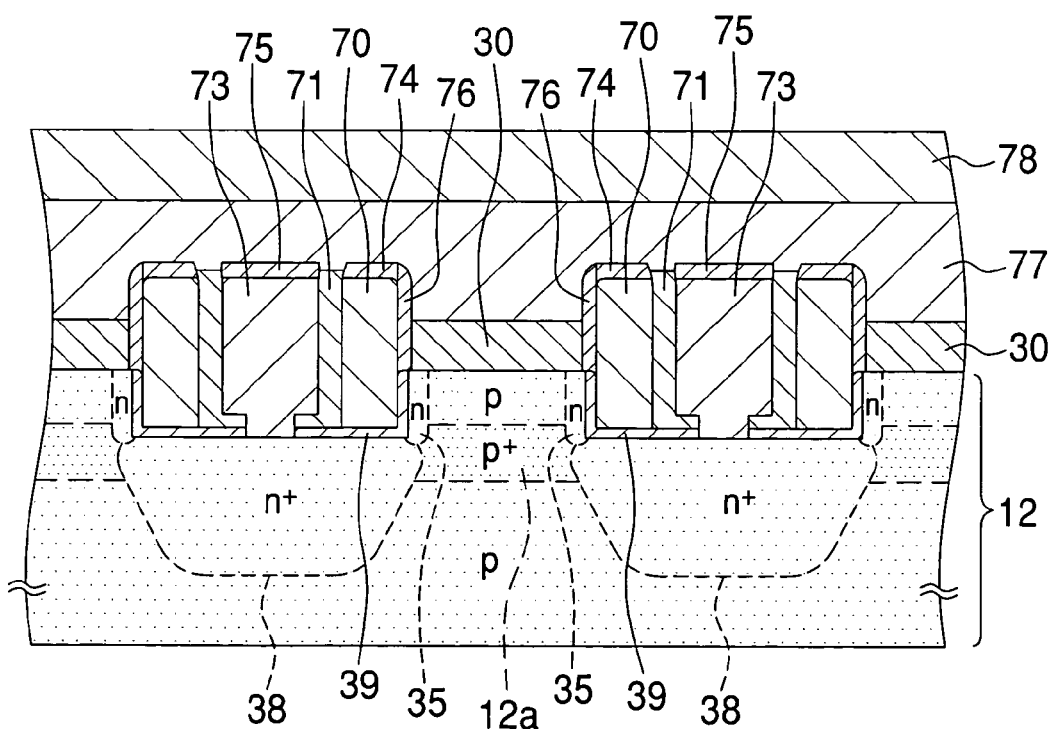

Thereafter, as shown in FIG. 40B, a conductive silicon 77 is layered on the whole surface by the CVD process, and then the upper face of the conductive silicon is flattened by the CMP process. A silicon oxide layer 78 as the hard mask is deposited on the flat conductive silicon 77 by the CVD process. Instead of the silicon oxide layer 78, a silicon nitride layer may be deposited.

In the same way as described in the previous embodiments, the conductive silicon 70, 73 and 77 in the separation region are completely removed, so the conductive silicon 70, 73 and 77 are divided by the separation region in the column direction. The divided conductive silicon 70 constitutes the floating gates FG1, FG2. The divided conductive silicon 77 constitutes the word lines WL (control gate CG). The divided conductive silicon 73 constitutes the conductors 62a, 62b.

In this way, the memory cell array 60 having the cell transistors 61 is manufactured. The silicon oxide layer 74 corresponds to the second insulation layers 17a, 17b of FIG. 34, and the ONO layer 71 corresponds to the fifth insulation layers 63a, 63b of FIG. 34. The silicon oxide layer 75 corresponds to the sixth insulation layers 64a, 64b of FIG. 34.

Figure 41:
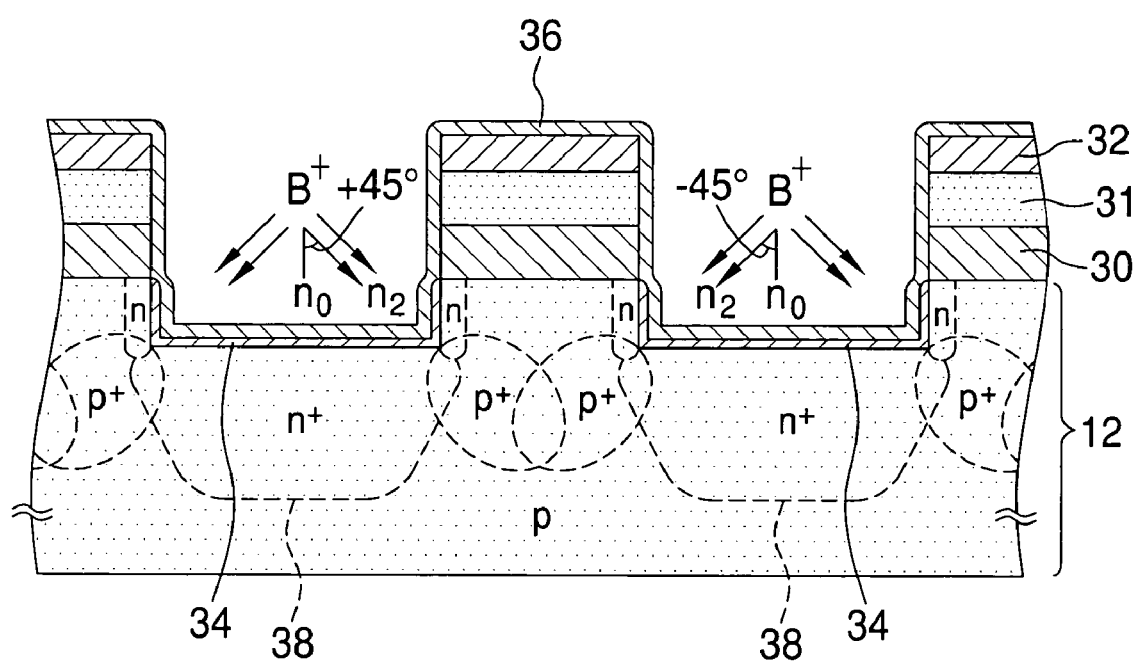
FIG. 41 is a section demonstrating an alternative to form a punch through prevention area.
Figure 42:
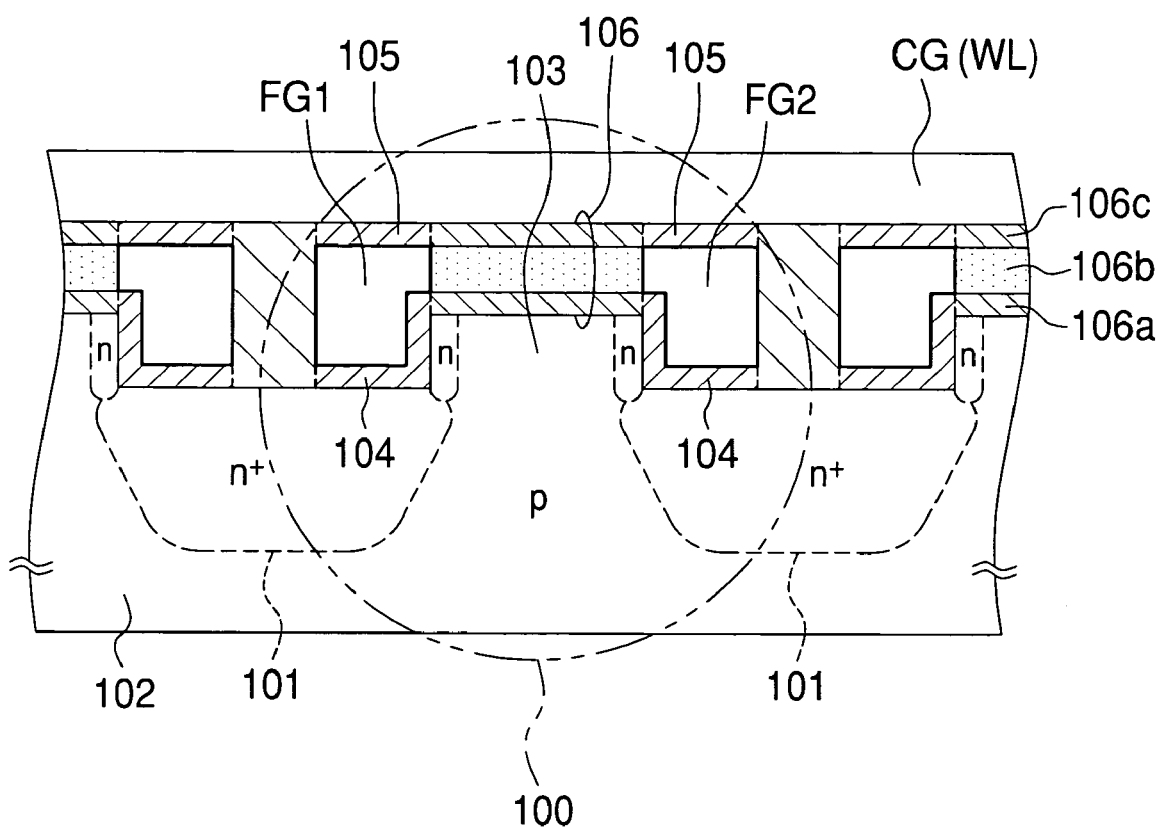
FIG. 42 is a section showing a structure of a conventional cell transistor.

In the above embodiments, the punch through prevention region is formed between the source and the drain by use of the silicon substrate 12 having the high impurity region 12a. But the process to form the punch through prevention region is not limited to that described in the above embodiments. For example, the processes shown in FIGS. 6A through 9A are carried out with the silicon substrate 12 having uniform impurity density, and then P type impurity ions (e.g. Boron B$^+$) are obliquely implanted prior to the thermal process, as shown in FIG. 41. The ion implantation direction $n_2$ takes ±45° to the perpendicular line $n_0$ of the silicon substrate 12. Thereby, it is possible to form the punch through prevention region. After such ion implantation process, the same processes described in each of the embodiments are carried out to manufacture the memory cell array.

The steps to manufacture the memory cell arrays 10, 60 are not limited to the above embodiments, but it is possible to change the processes accordingly. The surrounding circuits configured by the CMOS transistors can be manufactured in the processes to manufacture the memory cell arrays 10, 60.

In the above embodiments, the conductive type of the silicon substrate 12 (one conductive type) is P type and that of the diffusion regions 14a, 14b (opposite conductive type) is N type. Moreover, in the above embodiments, the cell transistors are N type MOS transistor, and the electrons as the charged particles flows in the channel. The present invention is not limited to them, but the conductive type of the silicon substrate (one conductive type) and the conductive type of the diffusion region 14a, 14b may be N type and P type, respectively. In that case, the cell transistors are P type MOS transistor, and the holes as the charged particles are flowed in the channel.

The above embodiments do not limit the scope of the present invention. Various changes and modifications are possible in the present invention and may be understood to be within the scope of the present invention.

What is claimed is:

1. A semiconductor memory in which plural cell transistors are formed on a one conductive type semiconductor substrate and arranged in a column direction and a row direction perpendicular to the column direction to form a two-dimensional matrix, the cell transistor comprising:
    a first projection having a pair of side surfaces formed in the semiconductor substrate;
    a pair of opposite conductive type regions formed in both sides of the first projection in the semiconductor substrate, the opposite conductive type regions serving as the source and the drain of the cell transistor;
    a first insulation layer provided in the surfaces of the opposite conductive type regions and the side surfaces of the first projection;
    a pair of floating gates each of which is electrically isolated, the floating gate facing the opposite conductive type region via the first insulation layer and having a side surface facing the first projection via the first insulation layer;
    a second insulation layer formed on the floating gates;
    a control gate that faces the floating gate via the second insulation layer;
    a third insulation layer formed in the area in which the side surface of the floating gate is not covered with the first insulation layer, the side surface of the floating gate facing the control gate via the third insulation layer; and
    a fourth insulation layer provided between the first projection and the control gate.

2. The semiconductor memory according to claim 1, wherein the control gate comprises a second projection that projects in the direction opposite to the first projection, the first projection facing the second projection via the fourth insulation layer.

3. The semiconductor memory according to claim 1, wherein the capacitance between the floating gate and the semiconductor substrate is larger than the capacitance between the floating gate and the control gate.

4. The semiconductor memory according to claim 1, wherein the floating gate has a top surface facing the control gate via the second insulation layer, the top surface of the floating gate being flattened by CMP (Chemical Mechanical Polishing), and the floating gate having a substantially rectangular section in the row direction.

5. The semiconductor memory according to claim 1, wherein the floating gate is not flattened by the CMP process, so the floating gate having a substantially fan-shaped section in the row direction.

6. The semiconductor memory according to claim 1, wherein two adjacent cell transistors in the row direction share the opposite conductive type region.

7. The semiconductor memory according to claim 1, wherein the cell transistors arranged in the column direction share the pair of the opposite conductive type regions.

8. The semiconductor memory according to claim 1, wherein the control gates of the cell transistors arranged in the column direction are electrically integrated with one another.

9. The semiconductor memory according to claim 1, wherein the first to fourth insulation layers are formed of silicon oxide.

10. The semiconductor memory according to claim 1, wherein the control gate is formed of amorphous silicon or poly silicon.

11. The semiconductor memory according to claim 1, wherein the floating gate is formed of amorphous silicon or poly silicon.

12. The semiconductor memory according to claim 1, wherein the cell transistor further comprises a pair of conductive regions that are formed by injecting opposite type impurity ions in the semiconductor substrate.

13. The semiconductor memory according to claim 1, wherein the cell transistor further comprises a one conductive type high impurity region formed between the pair of opposite conductive regions, the high impurity region having larger impurity density than the semiconductor substrate.

14. The semiconductor memory according to claim 1, wherein a channel for passing charged particles is generated in the side surfaces and the top surface of the projection when the control gate and the pair of opposite conductive type regions are respectively supplied with voltages for data writing or data reading.

15. The semiconductor memory according to claim 14, wherein a part of charged particles to be flowed in the channel enter the floating gate of drain side when the control gate and the pair of opposite conductive type regions are respectively supplied with voltages for data writing.

16. The semiconductor memory according to claim 14, wherein the current flowing in the channel is modulated in accordance with the amount of charged particles in the floating gate of source side when the control gate and the pair of opposite conductive type regions are respectively supplied with voltages for data reading.

17. The semiconductor memory according to claim 1, wherein the charged particles in the floating gate are discharged to the control gate when the control gate and the pair of opposite conductive type regions are respectively supplied with voltages for data erasing.

18. The semiconductor memory according to claim 1, wherein the source and the drain of the cell transistor are formed in recesses between the first projections.

19. A semiconductor memory in which plural cell transistors are formed on a one conductive type semiconductor substrate and arranged in a column direction and a row direction perpendicular to the column direction to form a two-dimensional matrix, the cell transistor comprising:

a first projection having a pair of side surfaces formed in the semiconductor substrate;

a pair of opposite conductive type regions formed in both sides of the first projection in the semiconductor substrate, the opposite conductive type regions serving as the source and the drain of the cell transistor;

a pair of floating gates each of which is electrically isolated, the floating gate being provided above the opposite conductive type region and having a side surface facing the projection;

an insulator that covers the whole of the floating gate and the top side of the projection, the floating gate being electrically isolated by the insulator; and a control gate formed above the floating gate and the projection via the insulator, the side surface of the floating gate facing the projection and the control gate via the insulator.

20. The semiconductor memory according to claim 19, wherein the source and the drain of the cell transistor are formed in recesses between the first projections.

* * * * *